US010381373B2

(12) United States Patent
Okizumi et al.

(10) Patent No.: US 10,381,373 B2
(45) Date of Patent: Aug. 13, 2019

(54) THREE-DIMENSIONAL MEMORY DEVICE HAVING A BURIED SOURCE LINE EXTENDING TO SCRIBE LINE AND METHOD OF MAKING THEREOF

(71) Applicant: SANDISK TECHNOLOGIES LLC, Plano, TX (US)

(72) Inventors: Yasuchika Okizumi, Yokkaichi (JP); Michiru Hirayama, Yokkaichi (JP); Naoto Norizuki, Yokkaichi (JP); Satoshi Shimizu, Yokkaichi (JP); Yasuo Kasagi, Yokkaichi (JP); Kimiaki Naruse, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/720,306

(22) Filed: Sep. 29, 2017

(65) Prior Publication Data

US 2018/0366487 A1  Dec. 20, 2018

Related U.S. Application Data

(60) Provisional application No. 62/521,036, filed on Jun. 16, 2017.

(51) Int. Cl.
*H01L 27/11582* (2017.01)
*H01L 27/1157* (2017.01)
(Continued)

(52) U.S. Cl.
CPC .... *H01L 27/11582* (2013.01); *G11C 16/0483* (2013.01); *H01L 21/823493* (2013.01);
(Continued)

(58) Field of Classification Search
CPC ......... H01L 27/11582; H01L 27/11556; H01L 27/11573; H01L 27/11575; H01L 27/1157;
(Continued)

(56) References Cited

U.S. PATENT DOCUMENTS 5,915,167 A   6/1999   Leedy
9,368,510 B1  6/2016   Rabkin et al.
(Continued)

OTHER PUBLICATIONS

International Search Report and the Written Opinion of the International Searching Authority for International Patent Application No. PCT/US2018/019729, dated May 17, 2018, 13 pages.
(Continued)

*Primary Examiner* — David Chen
(74) *Attorney, Agent, or Firm* — The Marbury Law Group PLLC

(57) ABSTRACT

A method of forming a three-dimensional memory device includes forming at the least one lower level dielectric layer over a semiconductor substrate, forming a buried source line over the least one lower level dielectric layer and over the semiconductor substrate, such that the buried source line is electrically connected to the semiconductor substrate, forming an alternating stack of insulating layers and sacrificial material layers over the buried source line, such that the sacrificial material layers are subsequently replaced with, electrically conductive layers, forming memory openings through the alternating stack by etching through the alternating stack after the buried source line is electrically connected to the semiconductor substrate, and forming memory stack structures in the memory openings. Each memory stack structure includes a vertical semiconductor channel electrically connected to the buried source line and a memory film laterally surrounding the vertical semiconductor channel.

15 Claims, 53 Drawing Sheets

(51) Int. Cl.
  *G11C 16/04* (2006.01)
  *H01L 21/8234* (2006.01)
  *H01L 27/11578* (2017.01)
  *H01L 27/11565* (2017.01)
  *H01L 27/11573* (2017.01)
  *H01L 27/11575* (2017.01)
  *H01L 27/06* (2006.01)
  *H01L 27/11524* (2017.01)
  *H01L 27/11556* (2017.01)

(52) U.S. Cl.
  CPC ...... *H01L 27/0688* (2013.01); *H01L 27/1157* (2013.01); *H01L 27/11565* (2013.01); *H01L 27/11573* (2013.01); *H01L 27/11575* (2013.01); *H01L 27/11578* (2013.01); *H01L 27/11524* (2013.01); *H01L 27/11556* (2013.01)

(58) Field of Classification Search
  CPC ......... H01L 27/11565; H01L 27/11524; H01L 27/11578; H01L 23/5226
  USPC ........ 438/258, 261, 264, 266, 593; 257/324, 257/E21.679, E27.103
  See application file for complete search history.

(56) References Cited

U.S. PATENT DOCUMENTS

| | | | |
|---|---|---|---|
| 9,589,981 B2 | 3/2017 | Nishikawa et al. | |
| 9,646,981 B2 | 5/2017 | Nishikawa et al. | |
| 9,666,281 B2 | 5/2017 | Sakakibara | |
| 2013/0234299 A1 | 9/2013 | Murakami | |
| 2015/0372000 A1* | 12/2015 | Jee .................... | H01L 27/11573 257/314 |
| 2016/0148946 A1* | 5/2016 | Hironaga .......... | H01L 27/11556 257/324 |
| 2017/0025421 A1 | 1/2017 | Sakakibara et al. | |
| 2017/0025428 A1 | 1/2017 | Lai et al. | |
| 2017/0133398 A1 | 5/2017 | Son et al. | |

OTHER PUBLICATIONS

U.S. Appl. No. 15/418,989, filed Jan. 30, 2017, SanDisk Technologies LLC.
U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/605,204, filed May 25, 2017, SanDisk Technologies LLC.
U.S. Appl. No. 15/626,444, filed Jun. 19, 2017, SanDisk Technologies LLC.
U.S. Appl. No. 15/633,131, filed Jun. 26, 2017, SanDisk Technologies LLC.
U.S. Appl. No. 15/638,672, filed Jun. 30, 2017, SanDisk Technologies LLC.
U.S. Appl. No. 15/669,243, filed Aug. 4, 2017, SanDisk Technologies LLC.

* cited by examiner

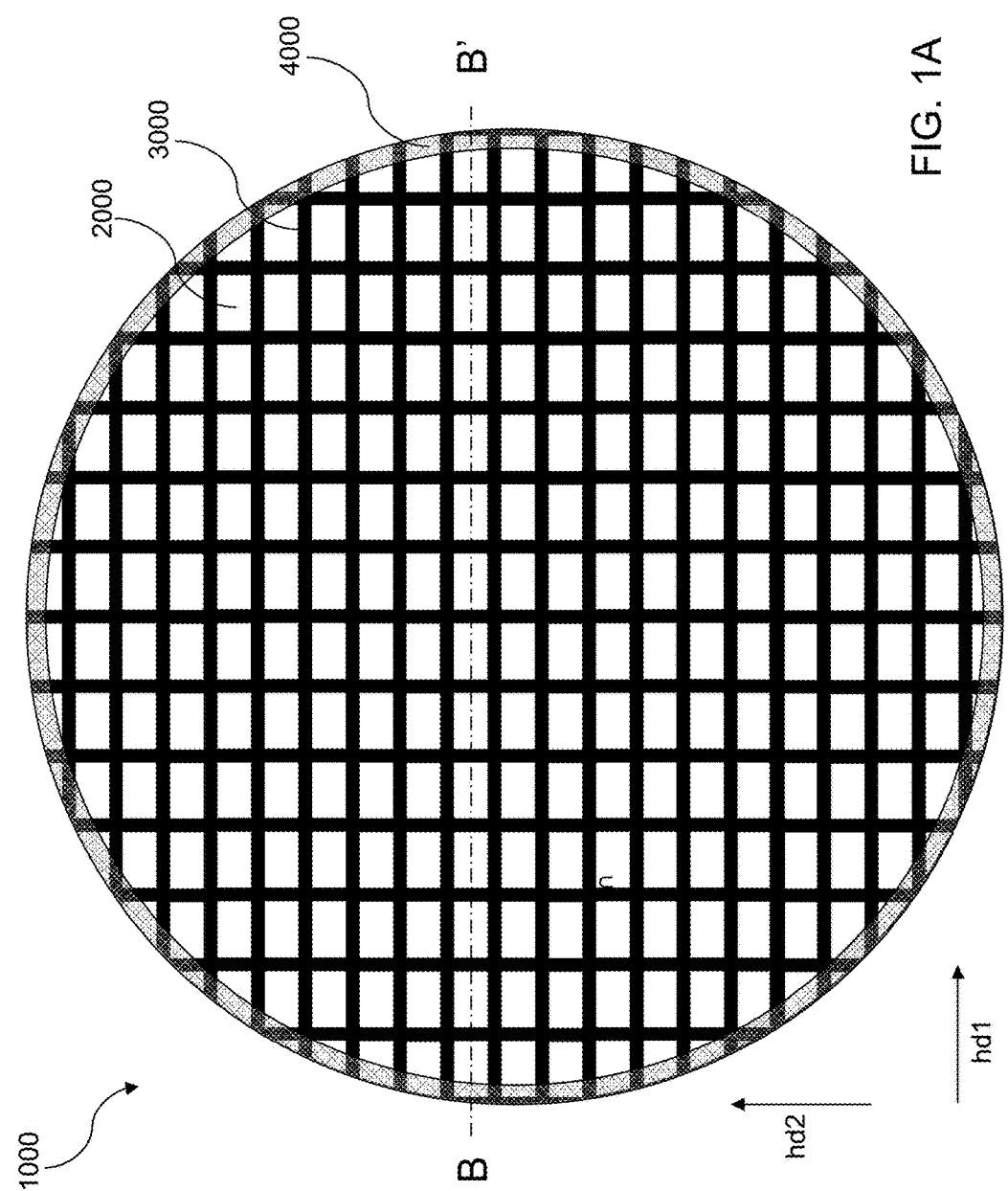

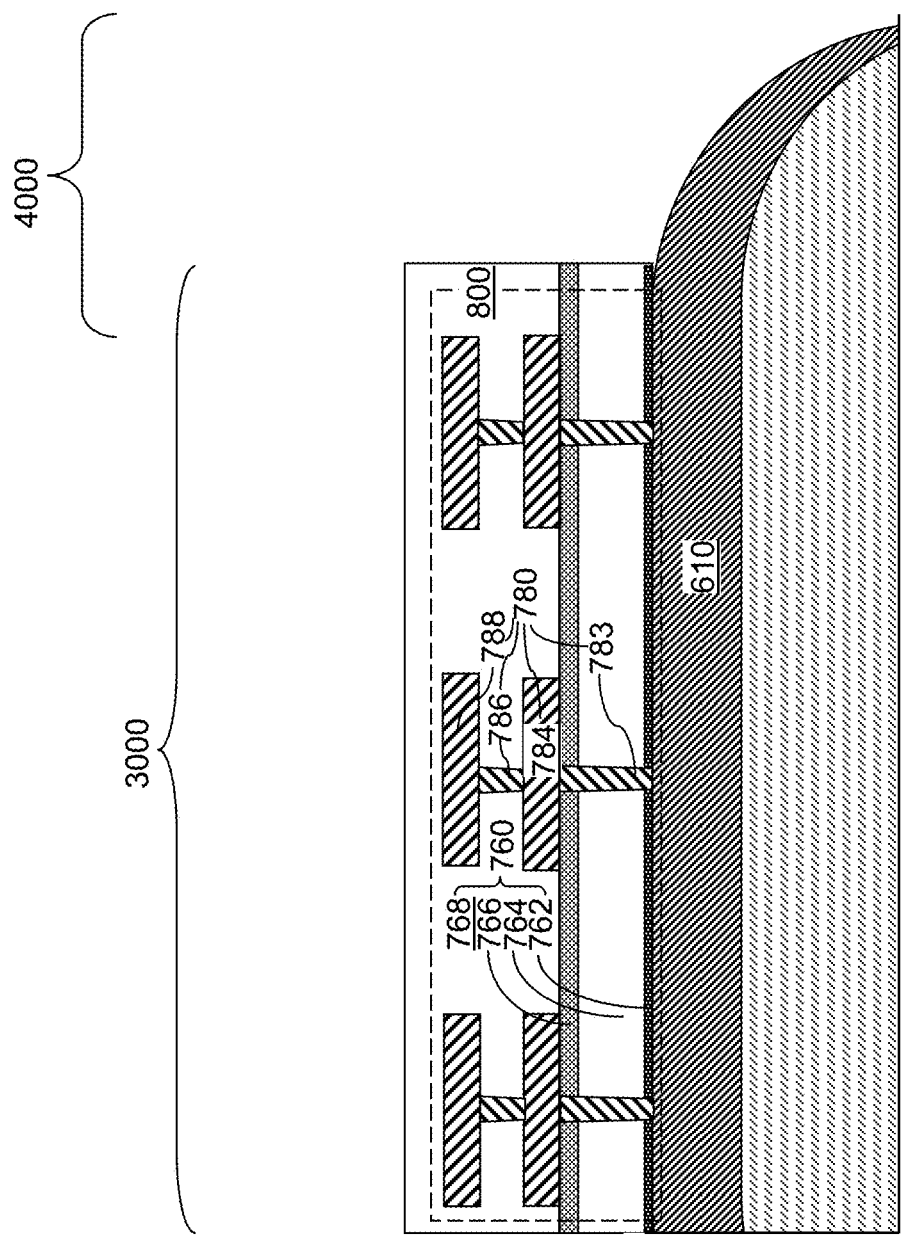

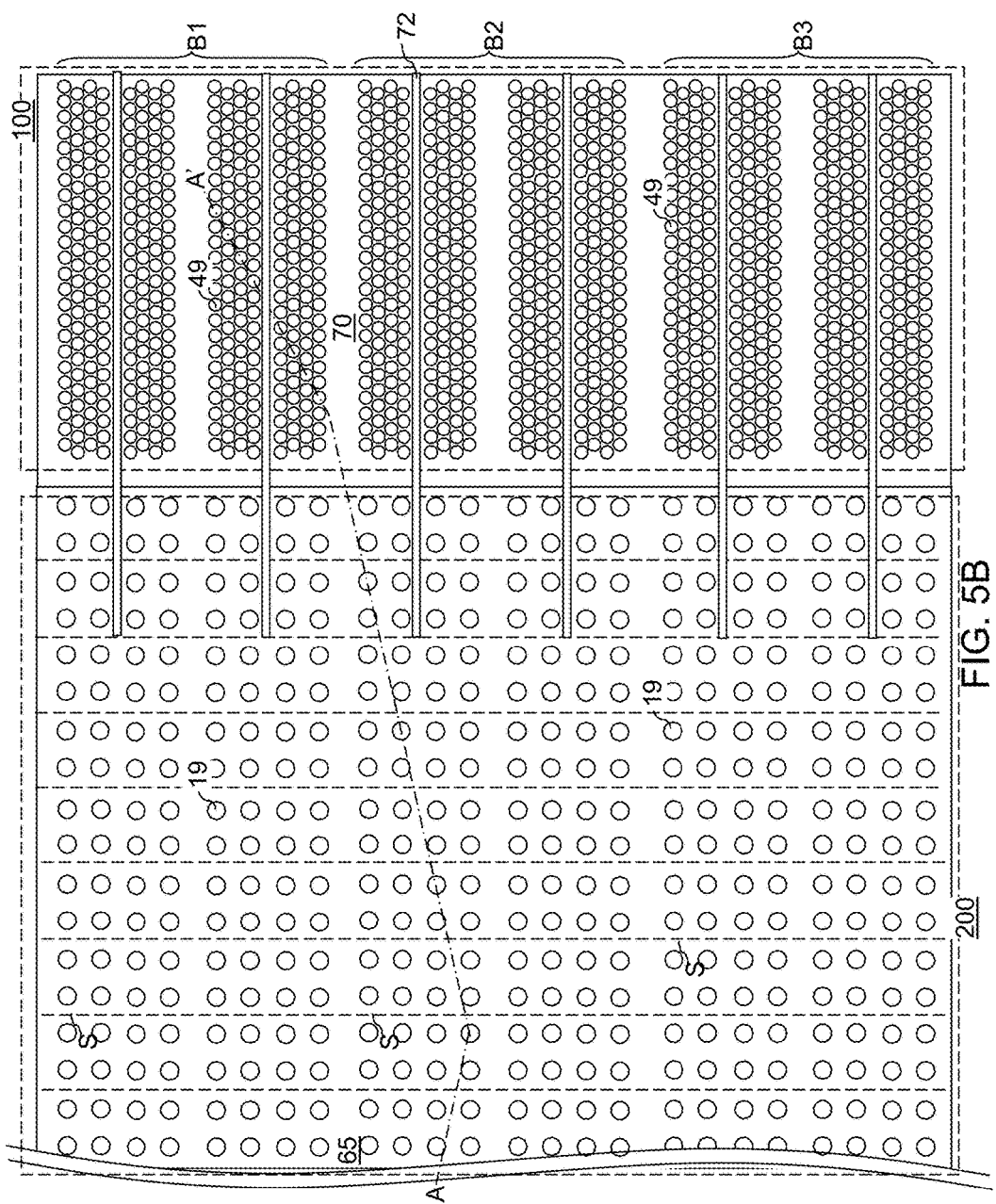

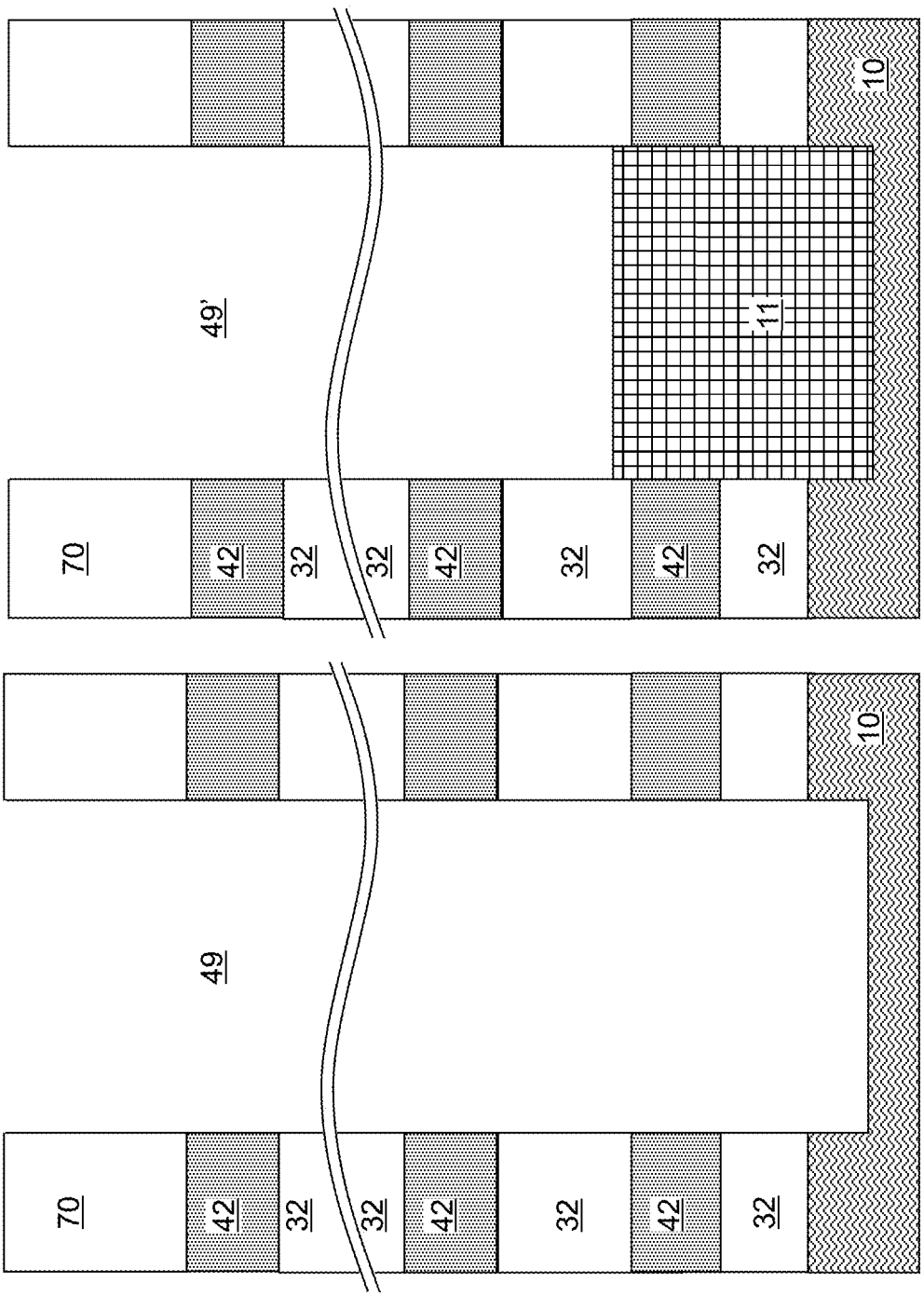

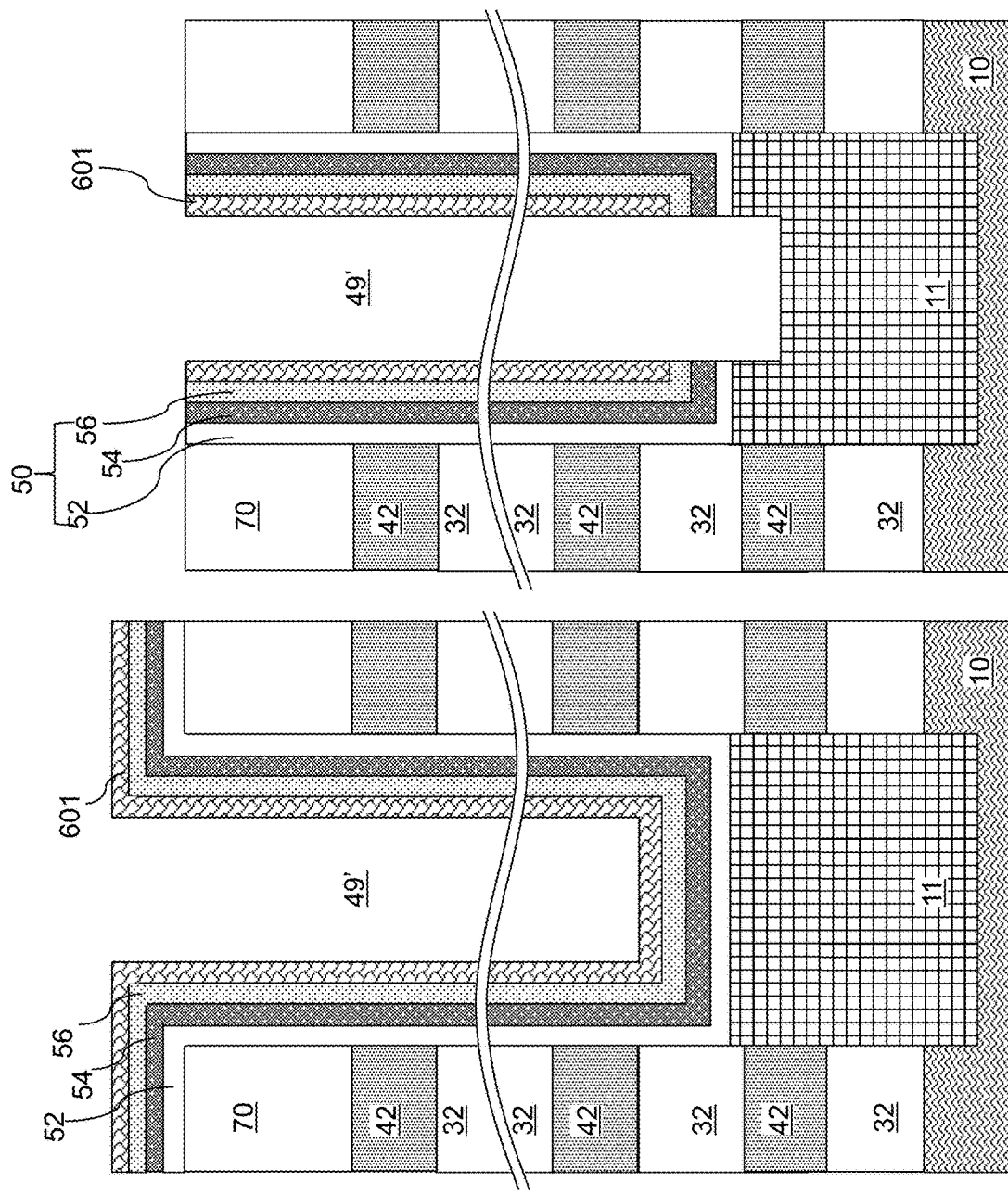

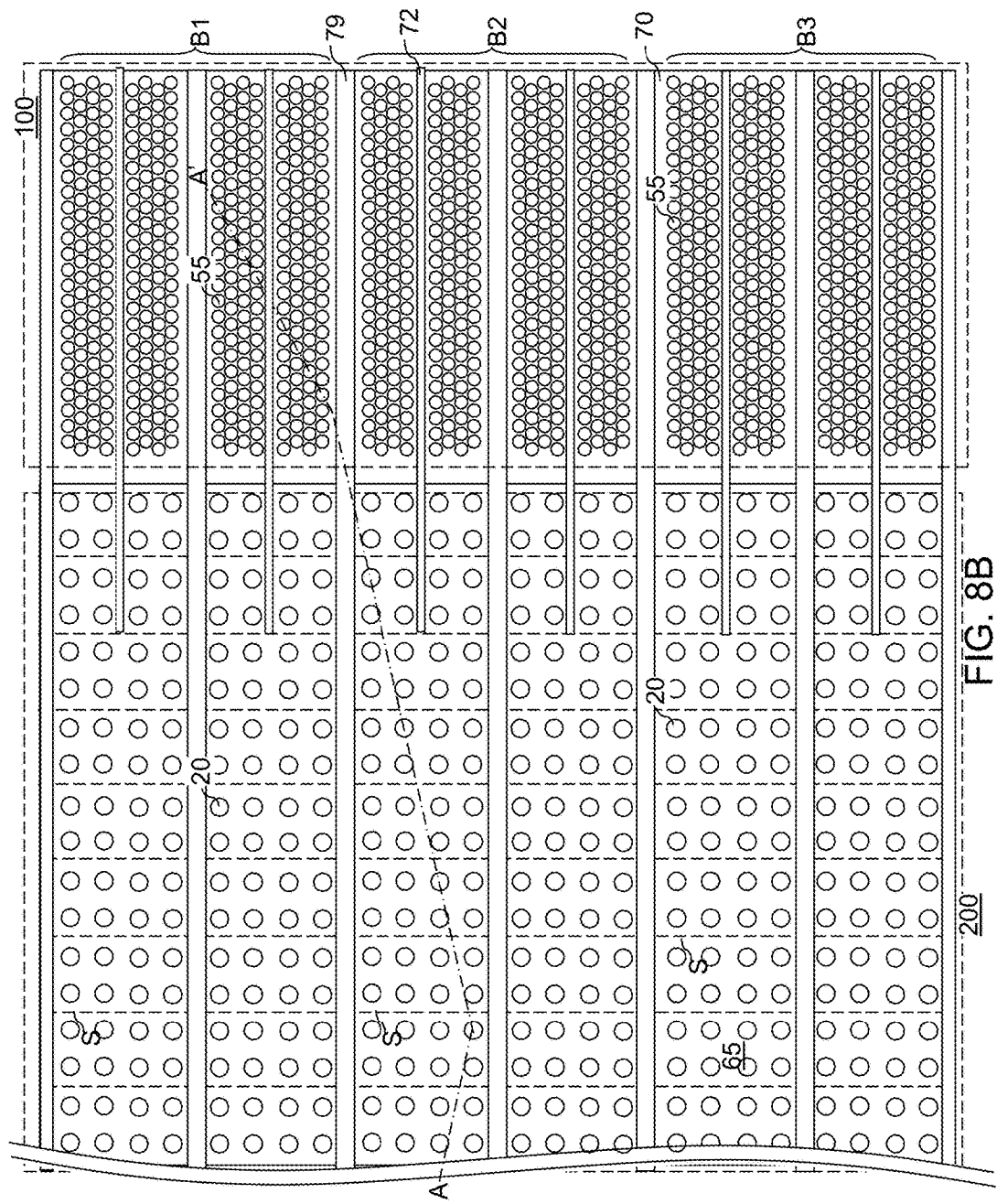

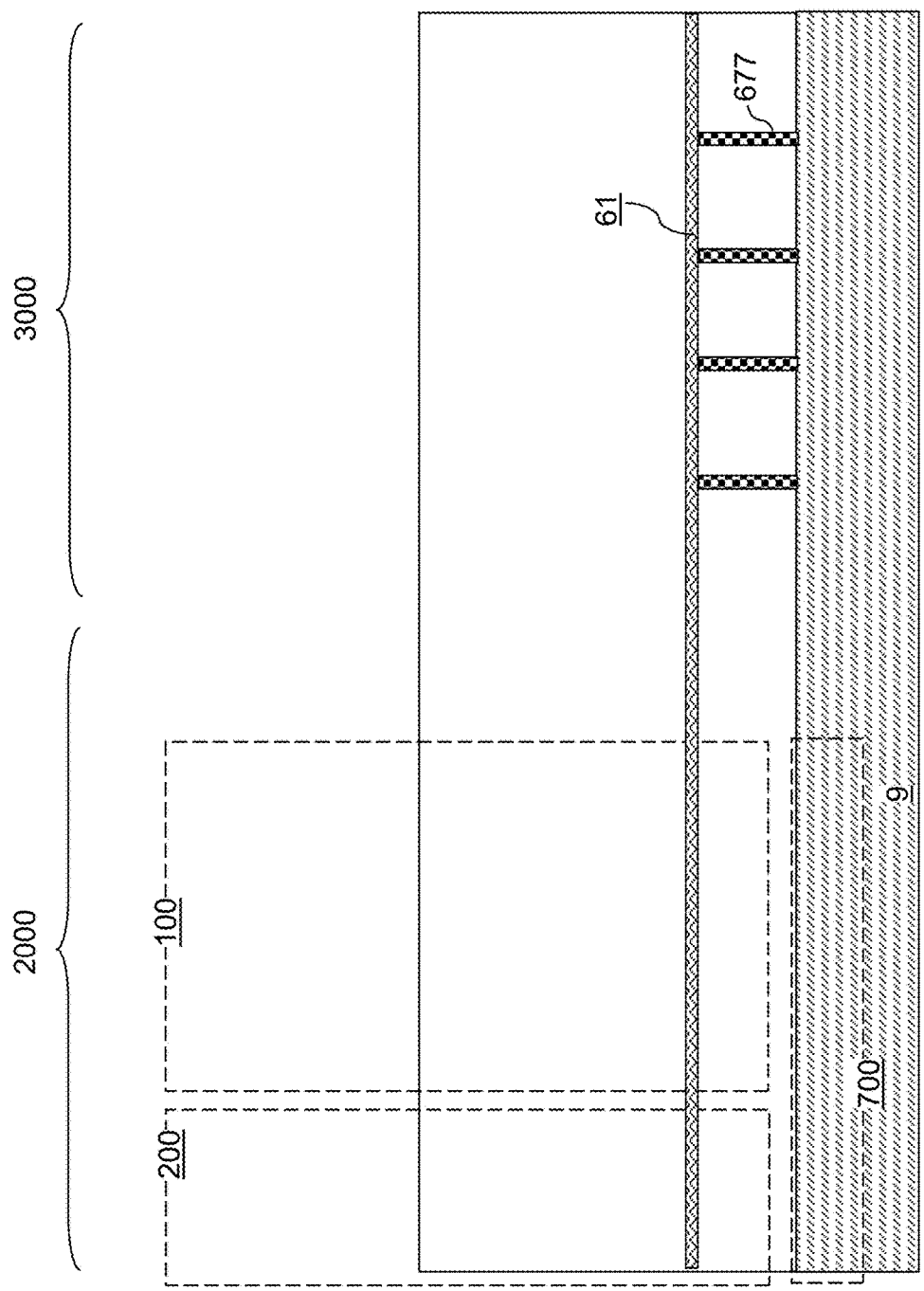

THREE-DIMENSIONAL MEMORY DEVICE HAVING A BURIED SOURCE LINE EXTENDING TO SCRIBE LINE AND METHOD OF MAKING THEREOF

FIELD

The present disclosure relates generally to the field of semiconductor devices, and specifically to structures and methods for preventing buried source line arcing during anisotropic etch processes that are employed for manufacture of a three-dimensional memory device.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a method of forming a three-dimensional memory device includes forming at the least one lower level dielectric layer over a semiconductor substrate, forming a buried source line over the least one lower level dielectric layer and over the semiconductor substrate, such that the buried source line is electrically connected to the semiconductor substrate, forming an alternating stack of insulating layers and sacrificial material layers over the buried source line, such that the sacrificial material layers are subsequently replaced with, electrically conductive layers, forming memory openings through the alternating stack by etching through the alternating stack after the buried source line is electrically connected to the semiconductor substrate, and forming memory stack structures in the memory openings. Each memory stack structure includes a vertical semiconductor channel electrically connected to the buried source line and a memory film laterally surrounding the vertical semiconductor channel.

According to another aspect of the present disclosure, a method of forming semiconductor structures is provided. Field effect transistors are formed on a semiconductor substrate. At least one lower level dielectric layer and lower metal interconnect structures are formed over the field effect transistors. A conductive material layer is formed over the at least one dielectric material layer. The conductive material layer comprises a downward-protruding portions that are electrically shorted to an upper portion of the semiconductor substrate. An alternating stack of insulating layers and spacer material layers is formed. The spacer material layers are formed as, or are subsequently replaced with, electrically conductive layers. An anisotropic etch process that etches portions of the alternating stack is performed to form memory openings that vertically extend through the alternating stack. The downward-protruding portions conduct negative electrical charge from the semiconductor substrate during the anisotropic etch process. Memory stack structures are formed in the memory openings. A portion of the conductive material layer that underlies the memory stack structures is electrically isolated from the downward-protruding portions by laterally dividing the conductive material layer between the memory stack structures and the downward-protruding portions.

According to another aspect of the present disclosure, a three-dimensional memory device comprises a vertically alternating stack of word lines and insulating layers located over a buried source line, and an array of memory stack structures that extend through the vertically alternating stack, each memory stack structure including a semiconductor channel and a memory film laterally surrounding the semiconductor channel, wherein a lower portion of each semiconductor channel electrically contacts the buried source line. At least a portion of the buried source line extends into a scribe line region.

BRIEF DESCRIPTION OF THE DRAWINGS

FIG. 1A is a top-down view of an exemplary structure including a semiconductor substrate and an array of chip regions that are laterally spaced among one another by scribe regions after formation of semiconductor devices, at least one lower level dielectric layer, and lower level metal interconnect structures on a semiconductor substrate according to an embodiment of the present disclosure.

FIG. 1E is a magnified vertical cross-sectional view of a bevel region E of FIG. 1B.

FIG. 5B is a top-down view of the chip region C of FIG. 5A.

FIGS. 6A-6H are sequential vertical cross-sectional views of a memory opening during formation of a memory stack structure and a drain region therein according to an embodiment of the present disclosure.

FIG. 8B is a top-down view of the chip region C of the exemplary structure of FIG. 8A.

FIG. 14A is a schematic vertical cross-sectional view of the exemplary structure after formation of memory devices within each chip region according to an embodiment of the present disclosure.

DETAILED DESCRIPTION

Figure 1B:
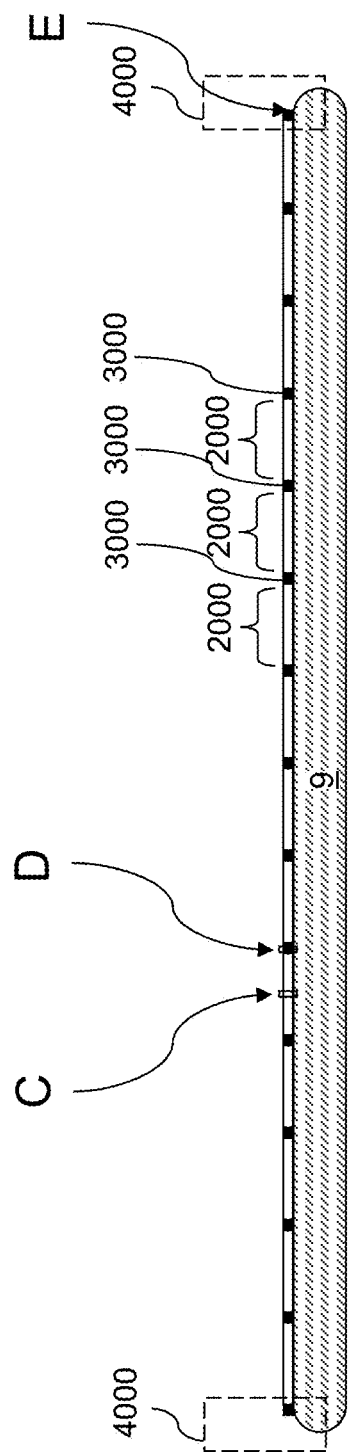
FIG. 1B is vertical cross-sectional view along the vertical plane B-B' of FIG. 1A.

As three-dimensional memory devices scale to smaller device dimensions, the device area for peripheral devices can take up a significant portion of the total chip area. CMOS under array (CUA) architecture is one approach to effectively use the chip area by forming CMOS peripheral devices on a substrate, followed by formation of an insulating layer, a buried source line, and an array of memory stack structures extending through at least one alternating stack of insulating layers and electrically conductive layers over the peripheral devices. The present inventors realized that one of the problems of the CUA architecture is arcing that occurs between the buried source line and the substrate during anisotropic etch of the alternating stack due to accumulation of positive electrical charge in the buried source layer. Embodiments of the present disclosures provide a method and structure for reducing or eliminating the arcing.

As discussed above, the present disclosure is directed to structures and methods for reducing or eliminating buried source line arcing during anisotropic etch processes that are employed for manufacture of a three-dimensional memory device, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, any two or more measurable quantities are "substantially the same" if each of the two or more measureable quantities do not deviate from the average of the two or more measurable quantities by more than 2.5% of the average of the two or more measurable quantities. For example, a first lateral distance is substantially the same as a second lateral distance if the first lateral distance and the second lateral distance do not deviate from the average of the first lateral distance and the second lateral distance by more than 2.5% of the average of the first lateral distance and the second lateral distance.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from $1.0$ S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIGS. 1A-1F, an exemplary structure 1000 according to an embodiment of the present disclosure is illustrated, which includes a semiconductor substrate 9 and an array of chip regions 2000 that are laterally spaced among one another by scribe regions 3000. The semiconductor substrate 9 may be a commercially available semiconductor substrate such as a silicon substrate having a diameter of 150 mm, 200 mm, 300 mm, or 450 mm. Alternatively, the semiconductor substrate 9 can be a compound semiconductor substrate including a III-V compound semiconductor material or a II-VI compound semiconductor material. The semiconductor substrate 9 can include a front side surface and a backside surface, which can be flat surfaces (i.e., two-dimensional Euclidean surfaces) that are parallel to each other. The directions included in the front side surface and the backside surface of the semiconductor substrate 9 are referred to as horizontal directions, which collectively define a horizontal plane, i.e., any plane including all the directions within the front side surface or within the backside surface.

The semiconductor substrate 9 can include a circumferential bevel region 4000 in which a non-horizontal and non-vertical surface continuously extends at a periphery of the semiconductor substrate 9 between a top surface and a sidewall of the semiconductor substrate 9. The circumferential bevel region 4000 continuously extends around the entire periphery of the semiconductor substrate 9. The surfaces of the circumferential bevel region 4000 can have a convex profile. In one embodiment, the scribe regions 3000 extend to the circumferential bevel region 4000.

In one embodiment, the chip regions 2000 can be arranged as a periodic two-dimensional array, and the scribe regions 3000 can be located between each neighboring pair of chip regions 2000. In one embodiment, the chip regions 2000 can have a rectangular shape of a same size. In this case, the chip regions 2000 can be arranged as a two-dimensional periodic rectangular array on the semiconductor substrate 9. Each chip region 2000 can have a length in a range from 1 mm to 30 mm, and a width in a range from 1 mm to 30 mm, although lesser and greater lengths and widths can also be employed. The chip regions 2000 are laterally spaced among one another by the scribe regions 3000, which can be arranged in a rectangular grid configuration. The width of each scribe region 3000 may be in a range from 100 microns to 2 mm. The width of the scribe regions 3000 correspond to the inter-chip spacing between neighboring pairs of chip regions 2000. According to an embodiment of the present disclosure, the grid patterns of the scribe regions 3000 continuously extend along a first horizontal direction hd1 from a portion of the bevel region 4000 to another portion of the bevel region 4000. Further, the grid pattern of the scribe regions 3000 continuously extend along a second horizontal direction hd2 from a portion of the bevel region 4000 to another portion of the bevel region 4000.

Each chip region 2000 includes an in-process chip, i.e., an in-process structure for fabrication of a semiconductor chip. Each scribe region 3000 includes an in-process scribe region structure, i.e., an in-process structure that is fabricated within a scribe region 3000.

Semiconductor devices 710 that are incorporated into product semiconductor chips are formed in the chip regions 2000. Additional semiconductor devices (not shown) that are not incorporated into the product semiconductor chips (such as test built-in self-testing (BIST) devices, other test macros, and/or alignment marks) can be formed in portions of the scribe regions 3000. Shallow trench isolation structures 720 can be formed in an upper portion of the semiconductor substrate 9 to provide electrical isolation among the semiconductor devices 710. The semiconductor devices 710 can include, for example, field effect transistors including respective source regions 742, drain regions 744, channel regions 746 and gate structures 750.

The field effect transistors may be arranged in a CMOS configuration. Each gate structure 750 can include, for example, a gate dielectric 752, a gate electrode 754, a gate cap dielectric 758, and a dielectric gate spacer 756. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Figure 1C:
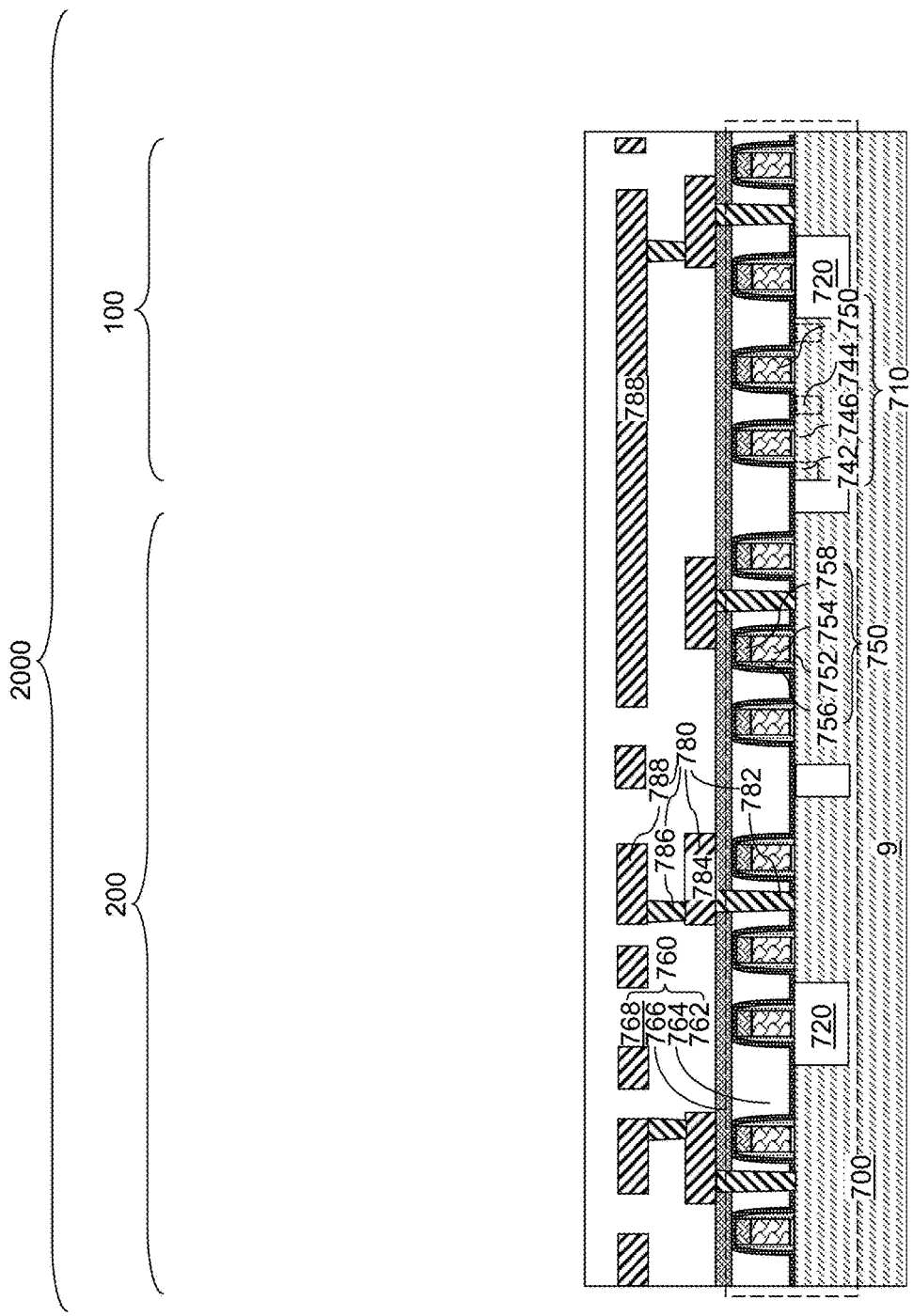
FIG. 1C is a magnified vertical cross-sectional view of a chip region C of FIG. 1B.
Figure 1D:
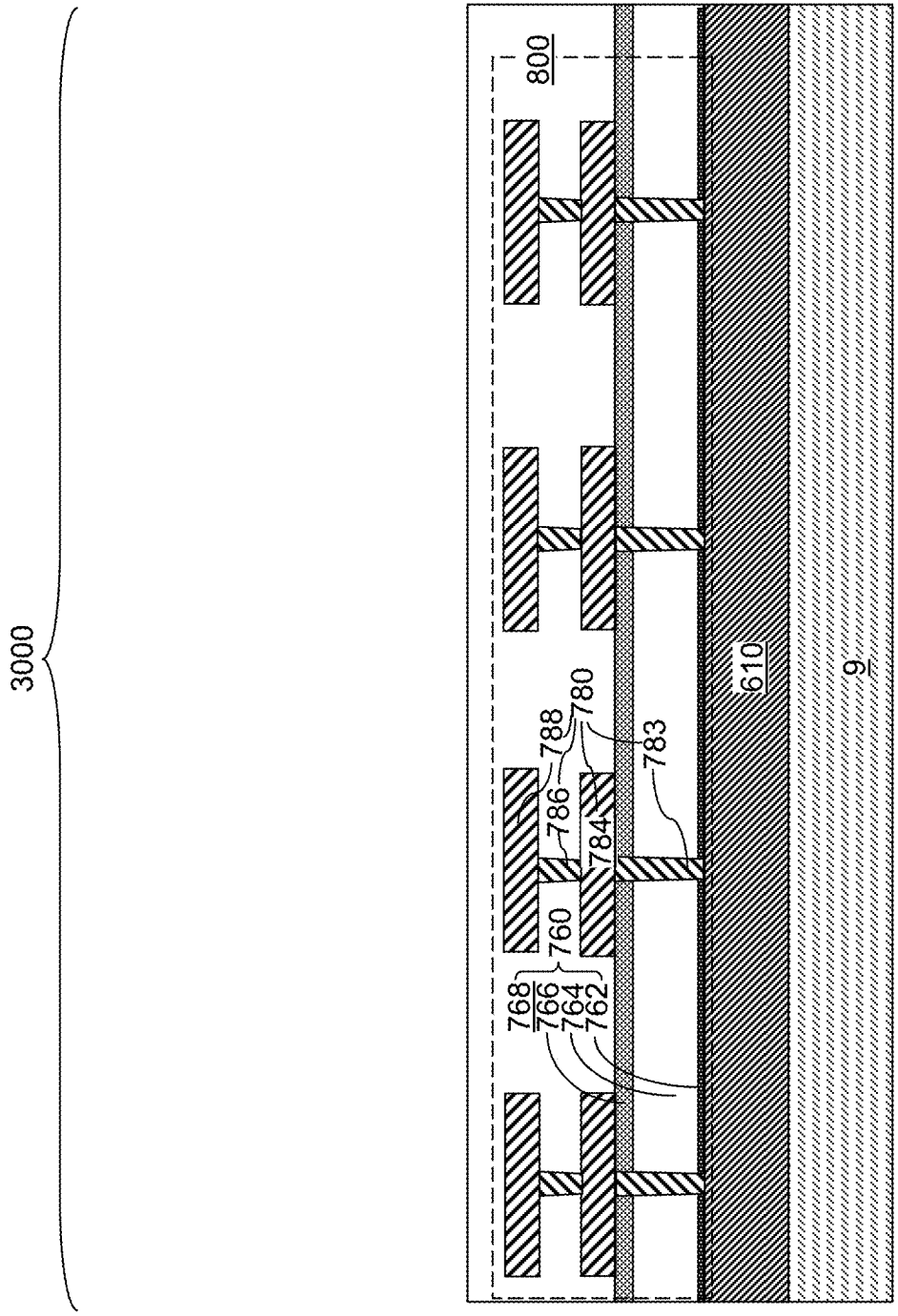
FIG. 1D is a magnified vertical cross-sectional view of a scribe region D of FIG. 1B.
Figure 1F:
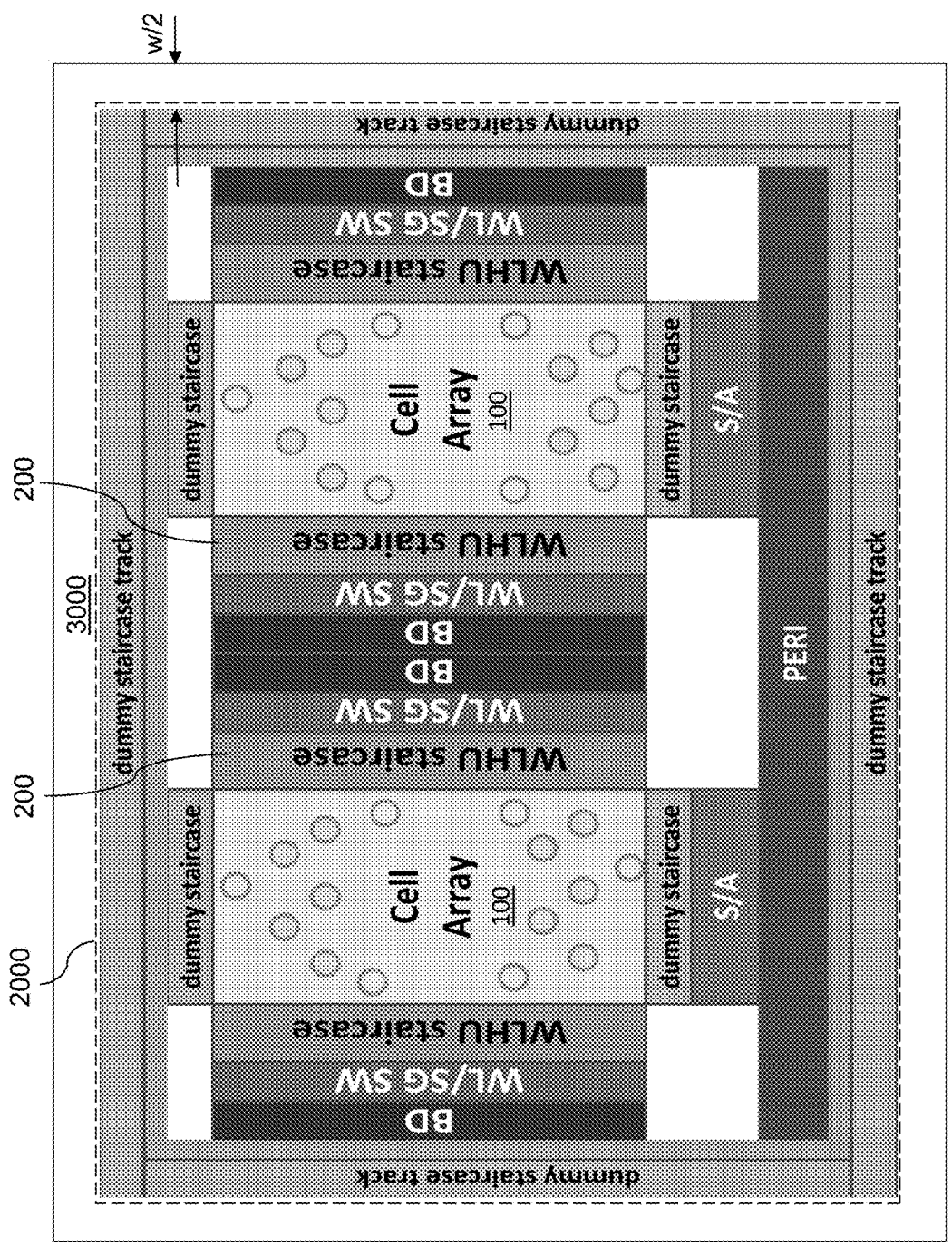
FIG. 1F is an exemplary layout of a chip region and neighboring portions of the scribe regions that are more proximal to the chip region than to any other chip region. The half width w/2 of the scribe regions is illustrated.
Figure 2A:
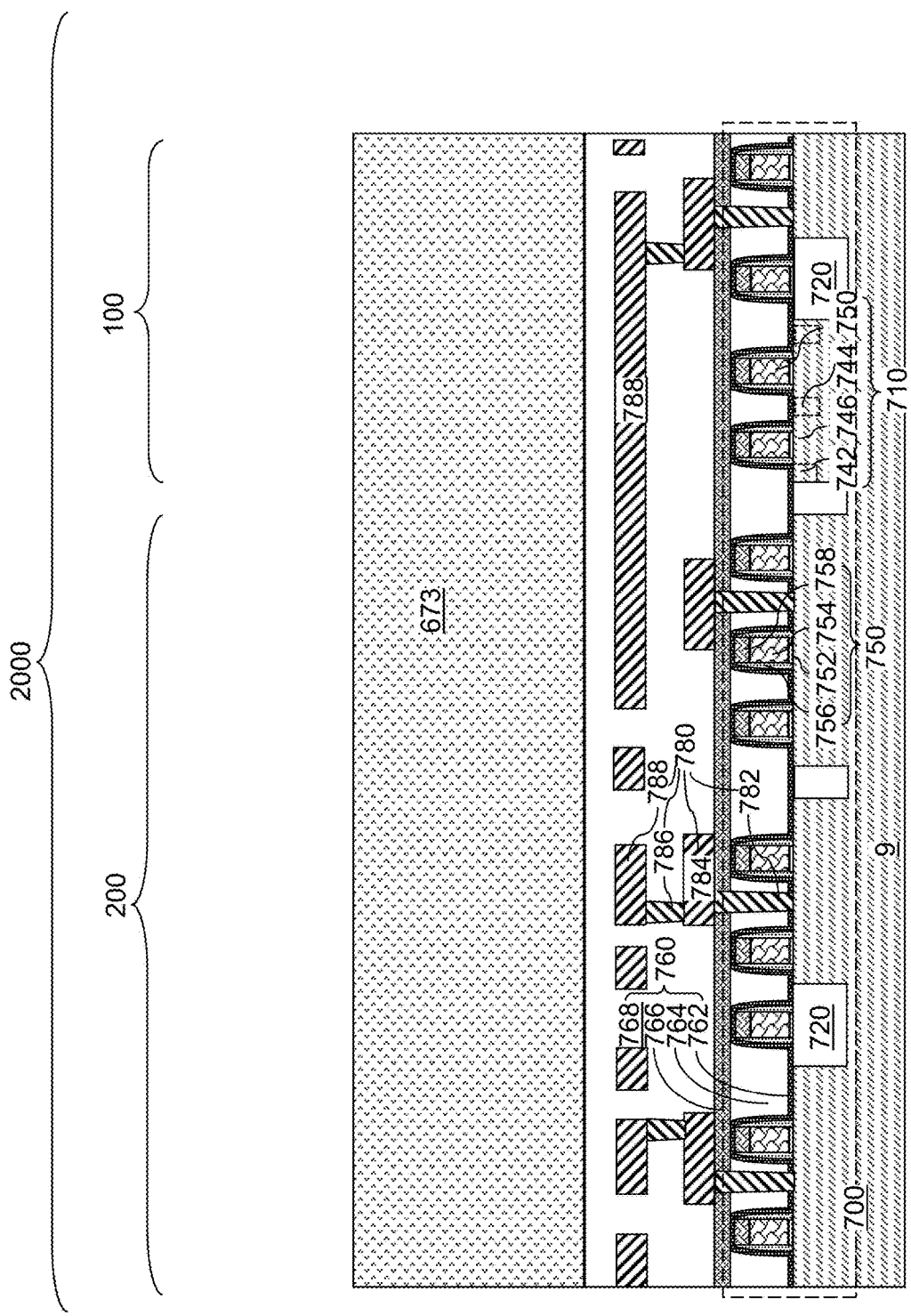
FIG. 2A is a magnified vertical cross-sectional view of the chip region C after application and patterning of a photoresist layer, and an anisotropic etch process that forms via cavities into an uppermost layer of the at least one lower level dielectric layer in the scribe regions according to an embodiment of the present disclosure.
Figure 2B:
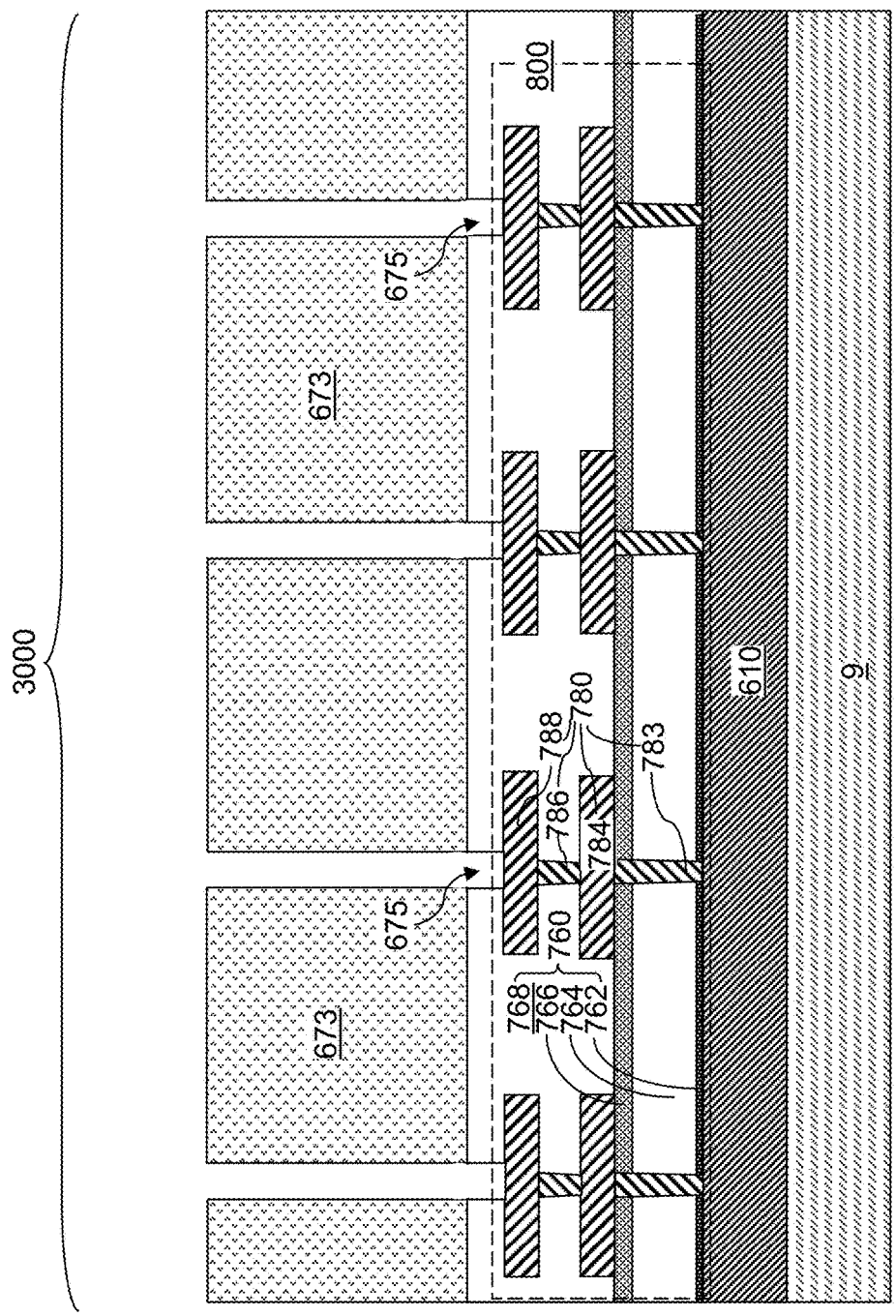
FIG. 2B is a magnified vertical cross-sectional view of the scribe region D at the processing step of FIG. 2A.
Figure 2C:
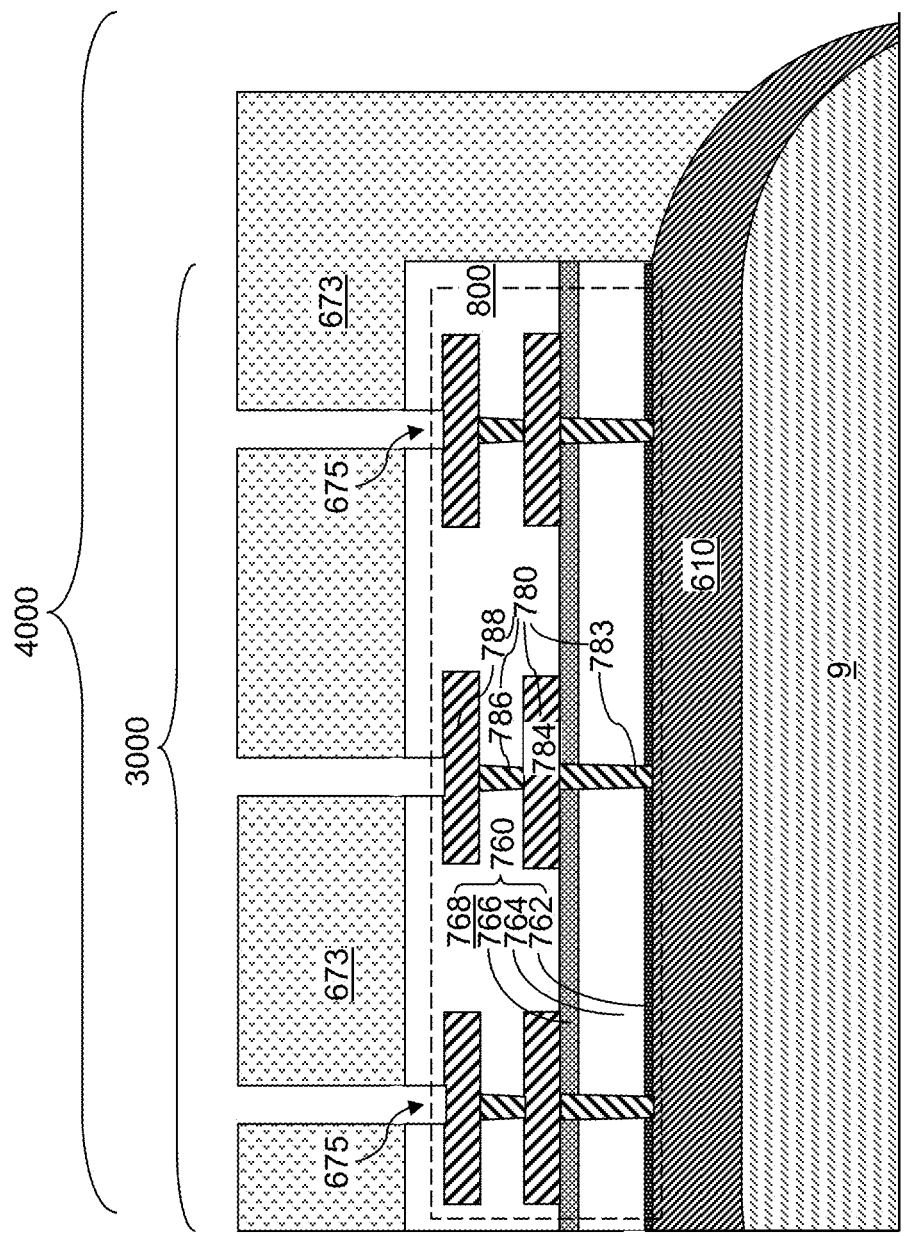
FIG. 2C is a magnified vertical cross-sectional view of the bevel region E at the processing step of FIG. 2A.
Figure 2D:
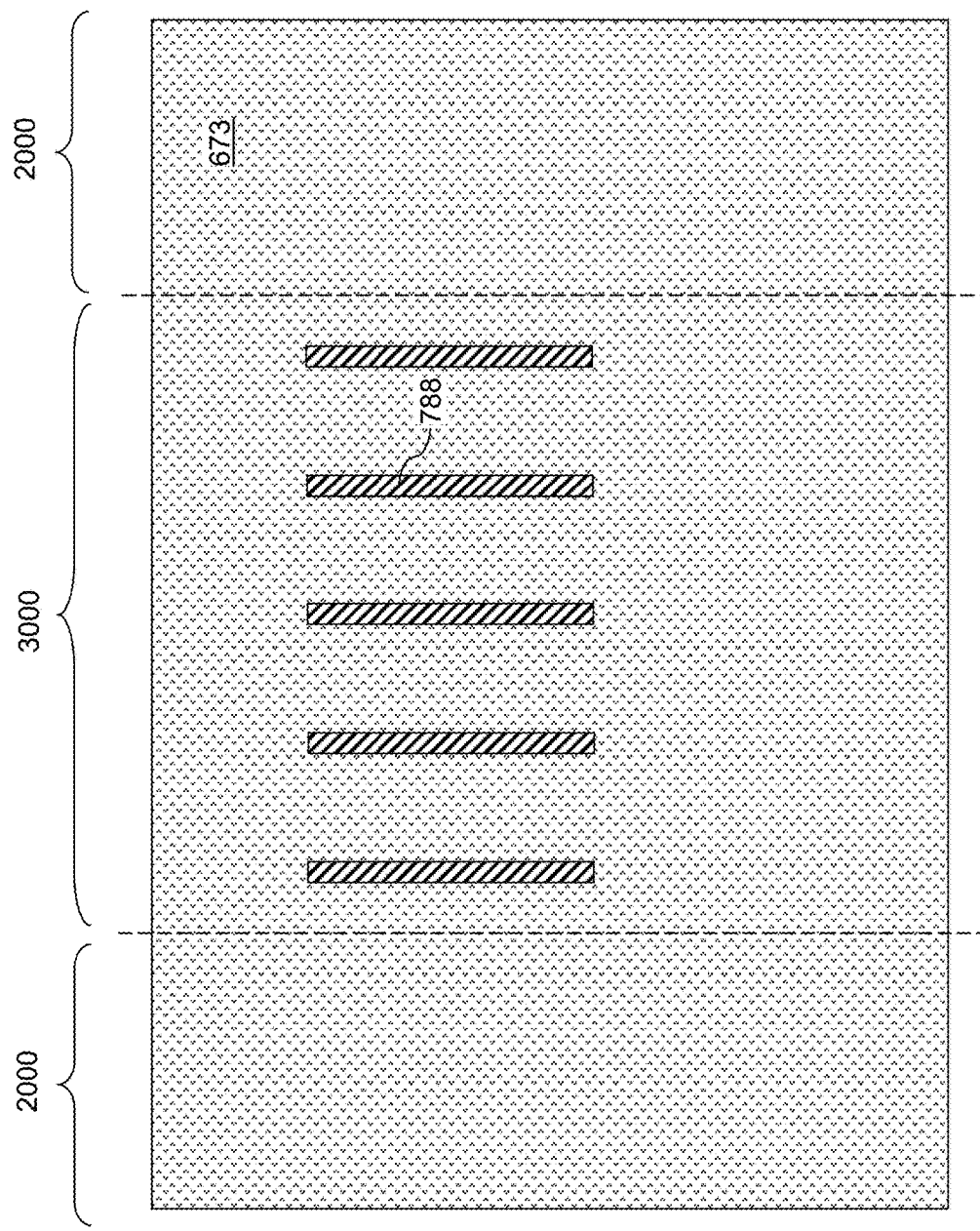
FIG. 2D is a top-down view of an area including the scribe region D illustrated in FIG. 2B.

An exemplary layout of the various semiconductor devices 710 is illustrated in FIG. 1F. The semiconductor devices 710 can include, for example, sense amplifiers (S/A), bit line drivers (BD), word line select gate switches (WL/SG SW) and other peripheral devices (PERI). Additional semiconductor devices may be formed within the areas of the cell arrays, which areas of the memory array regions 100 in which memory stack structures are to be subsequently formed over the levels of the semiconductor devices. Each cell array area may be surrounded by staircase areas in which word line contact via structures are to be subsequently formed (marked as "WLHU staircase" areas) in the word line contact via regions 200, and dummy staircase areas. FIG. 1F also shows a half width w/2 of each scribe region 3000 that surrounds the chip region 2000.

As shown in FIGS. 1C to 1E, at least one dielectric layer is formed over the semiconductor devices, which is herein referred to as at least one lower level dielectric layer 760. The at least one lower level dielectric layer 760 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed.

The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to nodes (e.g., source 742, drain 744 or gate electrodes 750) of the semiconductor devices 710 (e.g., CMOS devices), and are located at the level of the at least one lower level dielectric layer 760. In one embodiment, the pattern of the lower level metal interconnect structures 780 can be selected such that the lower level topmost metal structures 788, which are a subset of the lower level metal interconnect structures 780 located at the topmost portion of the lower level metal interconnect structures 780, can provide landing pad structures for through-memory-level via structures to be subsequently formed.

In one embodiment shown in FIGS. 1D and 1E, a subset of the lower metal interconnect structures 780 that are formed in the scribe regions 3000 and electrically shorted to portions of the semiconductor substrate 9 are herein referred to as scribe region metal interconnect structures 800. In one embodiment, a conductive doped semiconductor well 610 can be formed in the scribe regions 3000 such that the each of the scribe region metal interconnect structures 800 is electrically shorted to the conductive doped semiconductor well 610. The conductive doped semiconductor well 610 is a doped semiconductor portion having a high enough doping to become electrically conductive. The conductive doped semiconductor well 610 can continuously extend across the scribe regions 600 to the circumferential bevel region 4000 to provide a network of electrically conductive paths in a grid configuration. The scribe region metal interconnect structures 800 can include stacks of a well contact via structures 783 contacting the conductive doped semiconductor well 610, at least one optional lower level metal line 784, an optional lower level via structures 786, and a lower level topmost metal structures 788 that are configured to function as landing pads for downward-protruding portions of a conductive material layer to be subsequently formed.

In another embodiment, scribe region metal interconnect structures 800 may not be formed at the step shown in FIGS. 1D and 1E. In this case, a conductive doped semiconductor well 610 can still be formed in the scribe regions 3000 such that a portion of a buried source line is directly electrically shorted to the semiconductor substrate 9 (e.g., to the conductive doped semiconductor well 610, if present) in a subsequent process step.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

Referring to FIGS. 2A-2D, a photoresist layer 673 is applied on a topmost layer of the at least one lower level dielectric layer 760. The photoresist layer 673 is lithographically patterned to form openings within the scribe regions 3000. Specifically, the openings in the photoresist layer 673 are formed in areas of the scribe regions 3000 that overlie the lower level topmost metal structures 788. An anisotropic etch process is performed to transfer the pattern of the openings in the photoresist layer 673 through the topmost layer of the at least one lower level dielectric layer 760, which can be the topmost layer of the at least one lower level interconnect dielectric layer 768. Via cavities 675 are formed into an uppermost layer of the at least one lower level dielectric layer 760 in the scribe regions 3000. In one embodiment, the via cavities 675 can be formed into the uppermost layer of the at least one lower level dielectric layer 760 only within the scribe regions 3000 while not forming any via cavity within the chip regions 2000. The via cavities 675 can have vertical sidewalls or tapered sidewalls. Portions of the top surfaces of the lower level topmost metal structures 788 can be physically exposed at the bottom of each of the via cavities 675.

In an alternative embodiment, if the scribe region metal interconnect structures 800 are not present, the via cavities 675 can extend through all the layers of the at least one lower level dielectric layer 760 so that a portion of the top surface of the substrate 9 (e.g., the conductive doped semiconductor well 610, if present) is physically exposed at the bottom of each via cavity 675 in the scribe regions 3000. The photoresist layer 673 can be subsequently removed, for example, by ashing.

Referring to FIGS. 3A-3D, a conductive material layer such as a metallic material layer 6 can be deposited in the via cavities 675 and over the top surface of the at least one lower level dielectric layer 760. While an embodiment in which the conductive material layer is a metallic material layer 6 is illustrated herein, embodiments are expressly contemplated herein in which the conductive material layer is a doped semiconductor layer. In one embodiment, the metallic material layer 6 can include a metal silicide layer, such as a tungsten silicide or titanium silicide layer, or a layer stack of a conductive metallic nitride layer (such as a TiN layer, a TaN, layer, or a WN layer) and a conductive metal layer (such as a W layer, a Cu layer, an Al layer, or a layer of another elemental metal or an intermetallic alloy). For example, a layer stack of a TiN layer and a W layer can be employed for the metallic material layer 6. The metallic material layer 6 can be deposited by at least one conformal deposition process that simultaneously deposits the downward-protruding portion 677 and a horizontal portion that overlies the at least one lower level dielectric layer 760. The at least one conformal deposition process can include, for example, chemical vapor deposition or atomic layer deposition. The metallic material layer 6 can be formed as a blanket material layer (i.e., an unpatterned material layer) that covers the entire areas of the chip regions 2000 and the scribe regions 3000 without any opening therein.

The thickness of the metallic material layer 6 can be selected such that the entire volume of each of the via cavities 675 is filled with the at least one conductive material of the metallic material layer 6. In one embodiment, the thickness of the metallic material layer 6 (as measured at horizontal portions) can be in a range from 10 nm to 300 nm, although lesser and greater thicknesses can also be employed. Thus, the metallic material layer 6 includes downward-protruding portions 677 that are located in the via cavities 675 within the scribe regions 3000 and outside chip regions 2000. The downward-protruding portions 677 are electrically shorted to an upper portion of the semiconductor substrate 9, which can be the conductive doped semiconductor well 610. In one embodiment, the lower metal interconnect structures 780 can include the scribe region metal interconnect structures 800 that are electrically shorted to portions of the semiconductor substrate 9 (e.g., to the conductive doped semiconductor well 610, if present) and are formed in the scribe regions 3000. In this case, the downward-protruding portions 677 of the metallic material layer 6 can be formed directly on top surfaces of the scribe region metal interconnect structures 800.

Subsequently, an additional conductive material layer such as a doped semiconductor layer 10 can be formed over a planar surface (i.e., a flat top surface) of the metallic material layer 6. In an alternative embodiment in which the metallic material layer 6 is not employed, the doped semiconductor layer 10 can be deposited with downward-protruding portions 677 that fill the via cavities underneath. The doped semiconductor layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the doped semiconductor layer 10 can include a polycrystalline semiconductor material (such as polysilicon), or an amorphous semiconductor material (such as amorphous silicon) that is converted into a polycrystalline semiconductor material in a subsequent processing step (such as an anneal step). The doped semiconductor layer 10 can be formed as a blanket material layer without any opening therein. In one embodiment, the doped semiconductor layer 10 or portions thereof can be doped with electrical dopants, which may be p-type dopants or n-type dopants. The conductivity type of the dopants in the doped semiconductor layer 10 is herein referred to as a first conductivity type. The thickness of the doped semiconductor layer 10 can be in a range from 30 nm to 600 nm, although lesser and greater thicknesses can also be employed. The stack of the metallic material layer 6 and the doped semiconductor layer 10 constitutes a buried source line (6, 10), which reduces the on-state resistance of the vertical field effect transistors that include vertical semiconductor channels within memory stack structures to be subsequently formed.

Optionally, the doped semiconductor layer 10 and the metallic material layer 6 can be patterned in the chip regions 2000. The doped semiconductor layer 10 and the metallic material layer 6 may, or may not, be patterned in the scribe regions 3000. In one embodiment shown in FIG. 3A, the stack of the doped semiconductor layer 10 and the metallic material layer 6 can be patterned in the chip regions 2000 such that the stack remains in the memory array regions 100 of each chip region 2000, and is removed from contact via regions 200 of each chip region 2000 in which contact via structures to electrically conductive layers and through-memory-level via structures are subsequently formed.

Figure 3A:
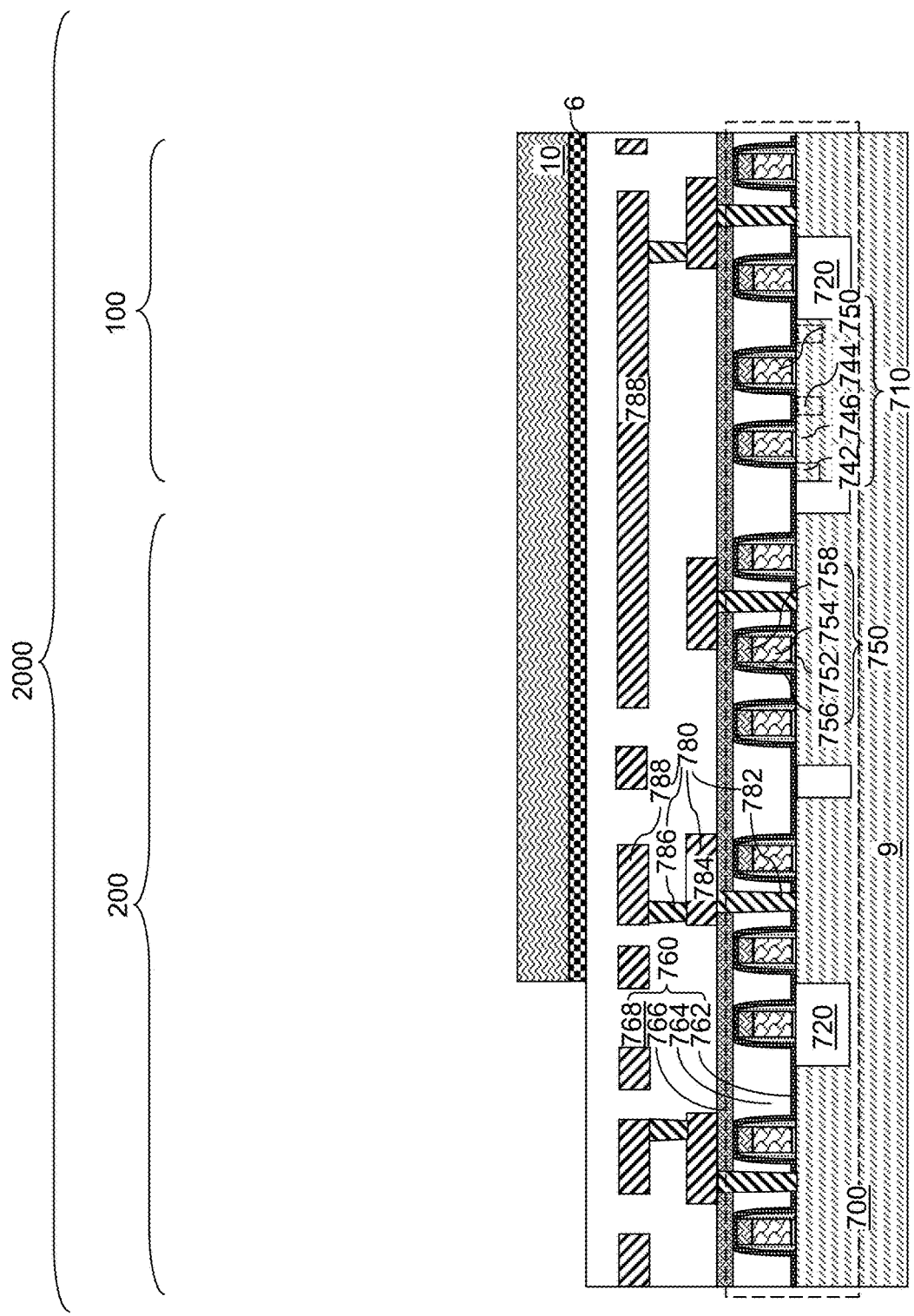
FIG. 3A is a magnified vertical cross-sectional view of the chip region C after formation and patterning of a conductive material layer and a planar semiconductor material layer according to an embodiment of the present disclosure.
Figure 3B:
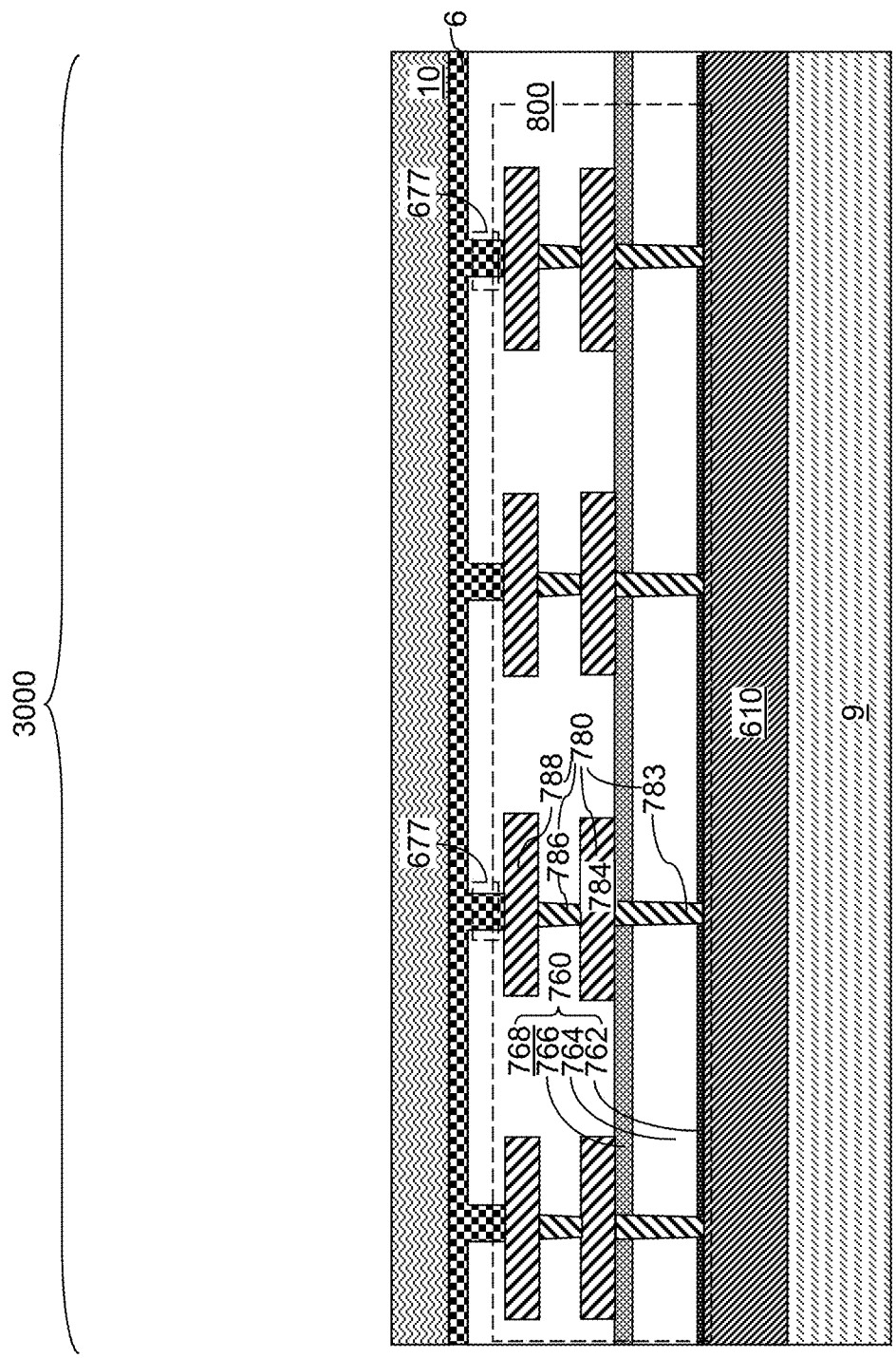
FIG. 3B is a magnified vertical cross-sectional view of the scribe region D at the processing step of FIG. 3A.
Figure 3C:
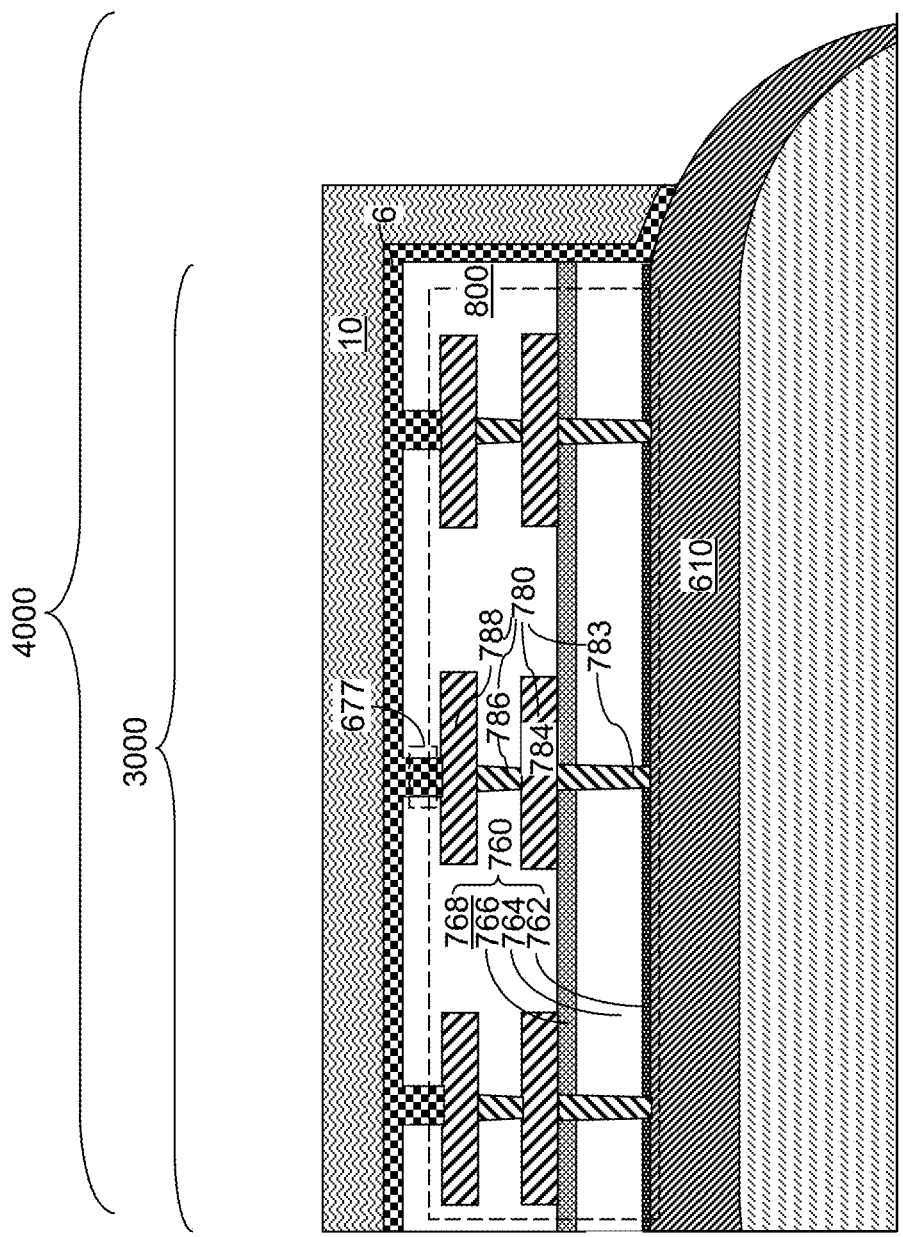
FIG. 3C is a magnified vertical cross-sectional view of the bevel region E at the processing step of FIG. 3A.
Figure 3D:
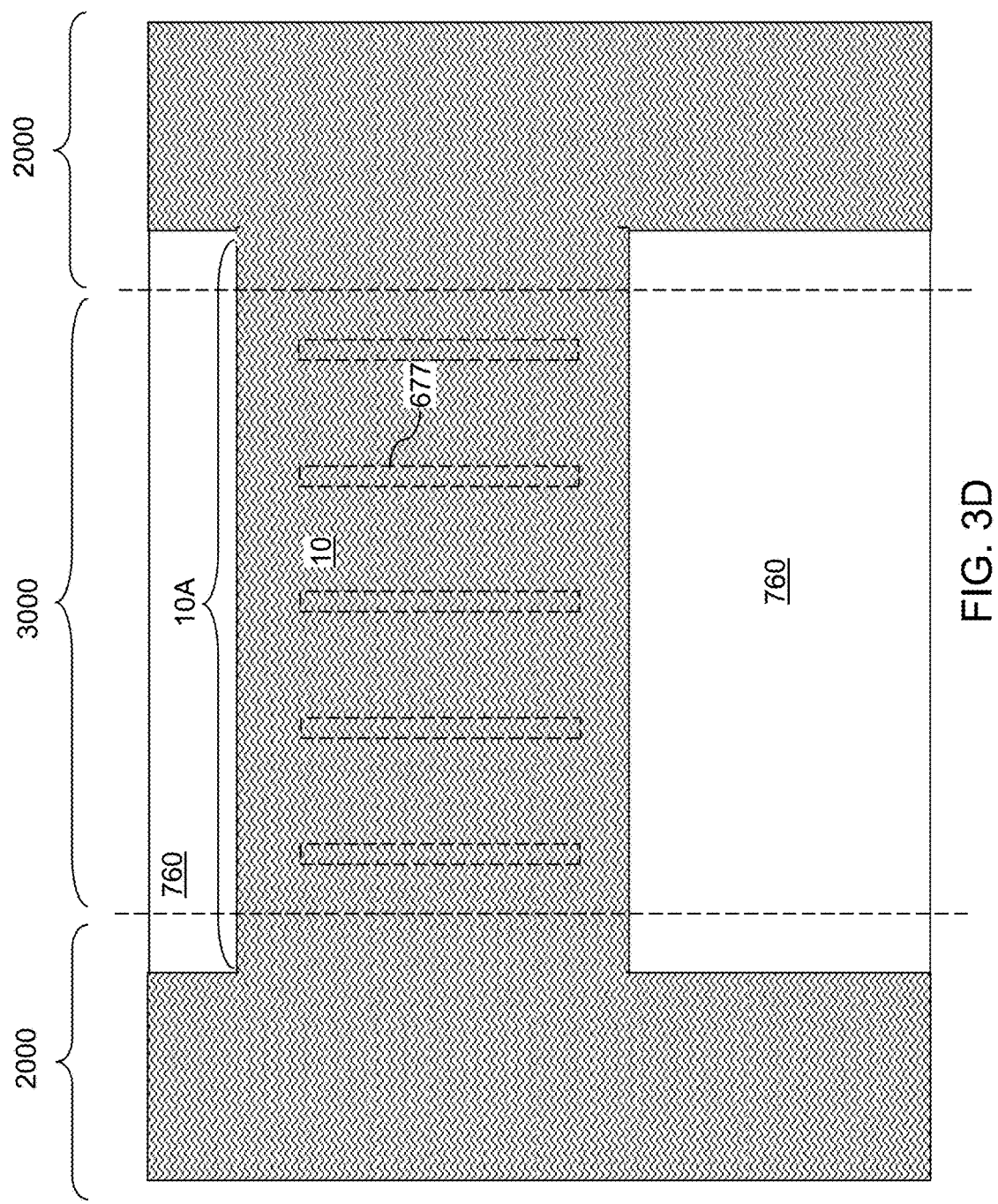
FIG. 3D is a top-down view of an area including the scribe region D illustrated in FIG. 3B in an exemplary configuration.

In one embodiment, a bridge 10A including a layer stack of the metallic material layer 6 and the doped semiconductor layer 10 can be provided in each scribe region 3000 between a neighboring pair of chip regions 2000 such that the bridge 10A connects two layers stacks of the metallic material layer 6 and the doped semiconductor layer 10 located within a respective memory array region of the chip regions 2000 as illustrated in FIG. 3D. In this case, the downward-protruding portions 677 of the metallic material layer 6 can be located within the areas of the bridges. Alternatively, the entire area of each scribe region 3000 may be covered with the layer stack of the metallic material layer 6 and the doped semiconductor layer 10. All of the downward-protruding portions 677 of the metallic material layer 6 are within a respective scribe region 3000.

Figure 3E:
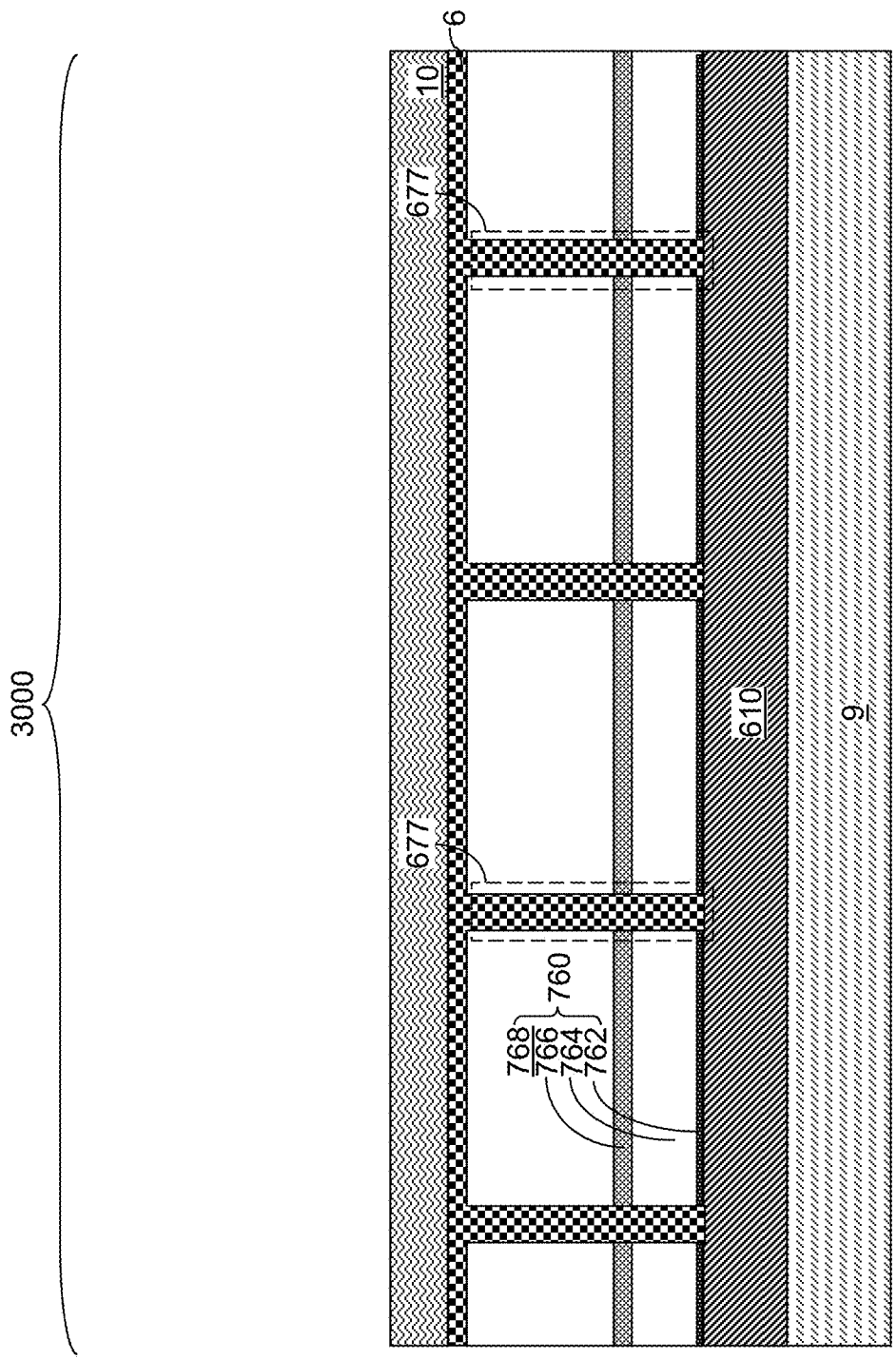
FIG. 3E is a magnified vertical cross-sectional view of an alternative structure for the scribe region D at the processing step of FIG. 3A.
Figure 3F:
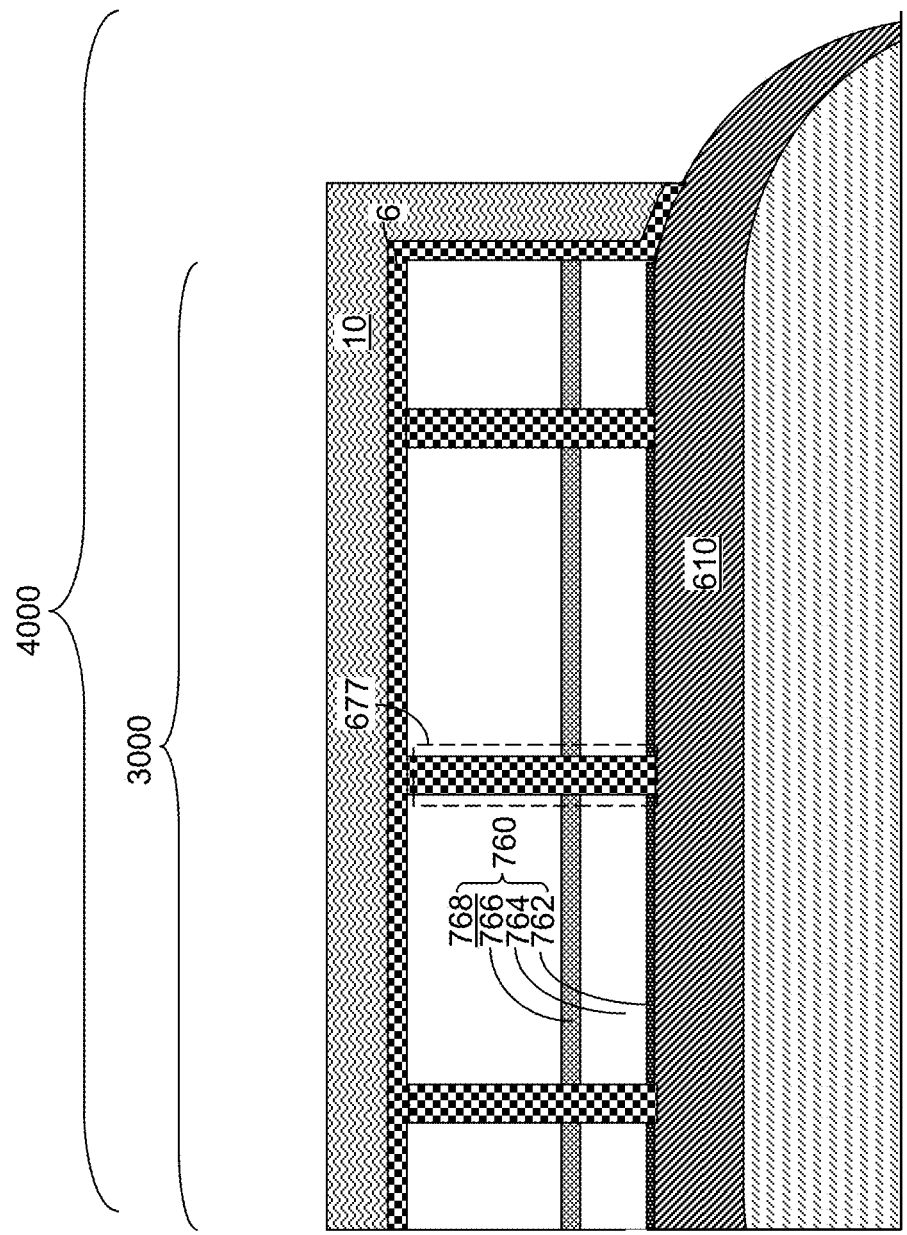
FIG. 3F is a magnified vertical cross-sectional view of an alternative structure for the bevel region E at the processing step of FIG. 3A.

Referring to FIGS. 3E and 3F, an alternative configuration for the exemplary structure is illustrated, which is derived from the exemplary structure of FIGS. 3A-3C by not forming the scribe region metal interconnect structures 800. In this case, the via cavities 675 can extend through all the layers of the at least one lower level dielectric layer 760 so that a portion of the top surface of the substrate 9 (e.g., the conductive doped semiconductor well 610, if present) is physically exposed at the bottom of each via cavity 675 in the scribe regions 3000. As a consequence, the downward-protruding portions 677 of the metallic material layer 6 are electrically shorted to an upper portion of the semiconductor substrate 9 (e.g., the conductive doped semiconductor well 610) by direct physical contact with the semiconductor substrate 9. The metallic material layer 6 and the doped semiconductor layer 10 can be subsequently patterned in the same manner as in the exemplary structure of FIGS. 3A-3C.

Figure 4A:
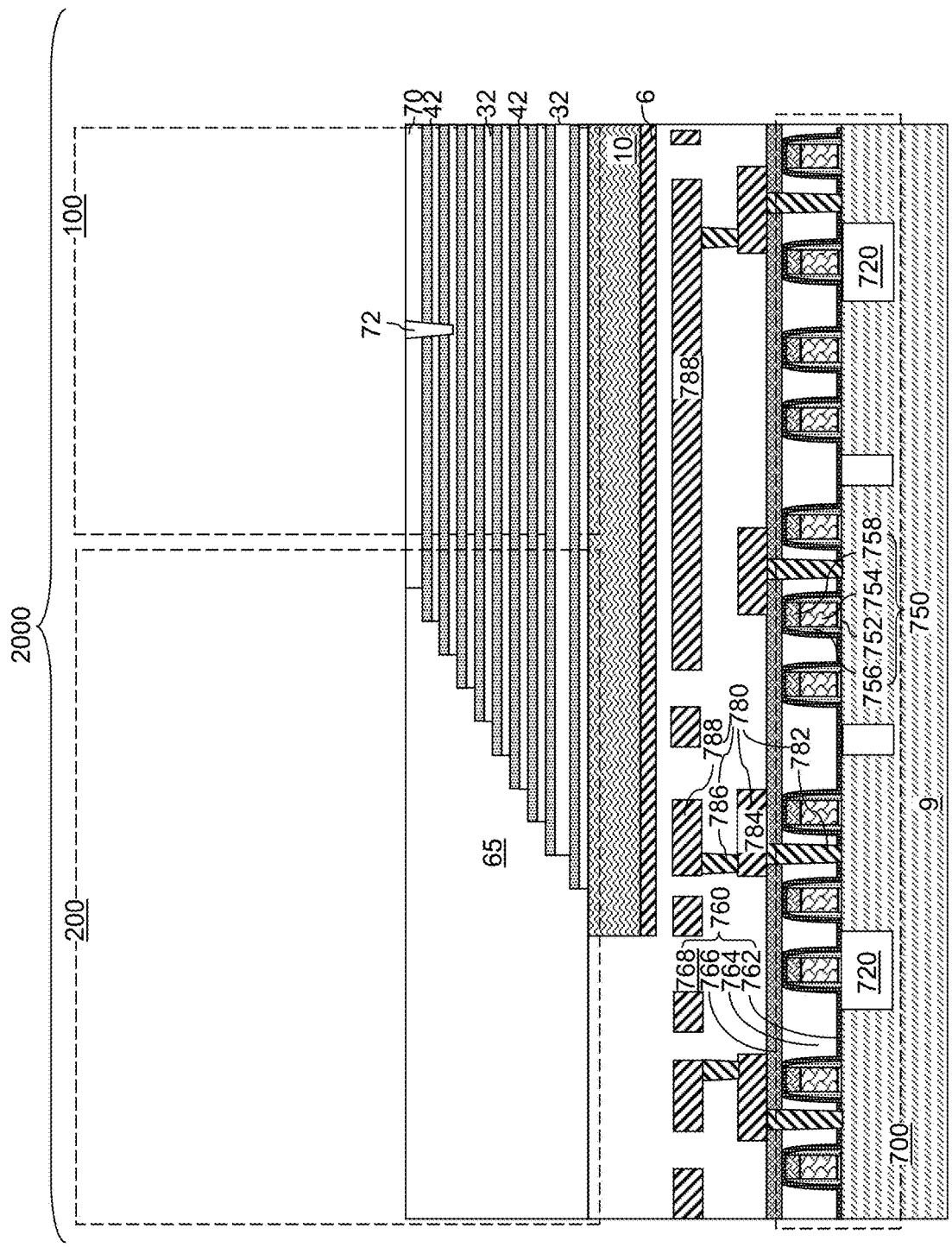
FIG. 4A is a magnified vertical cross-sectional view of the chip region C after formation of an alternating stack of insulating layers and spacer material layers and an insulating cap layer according to an embodiment of the present disclosure.
Figure 4B:
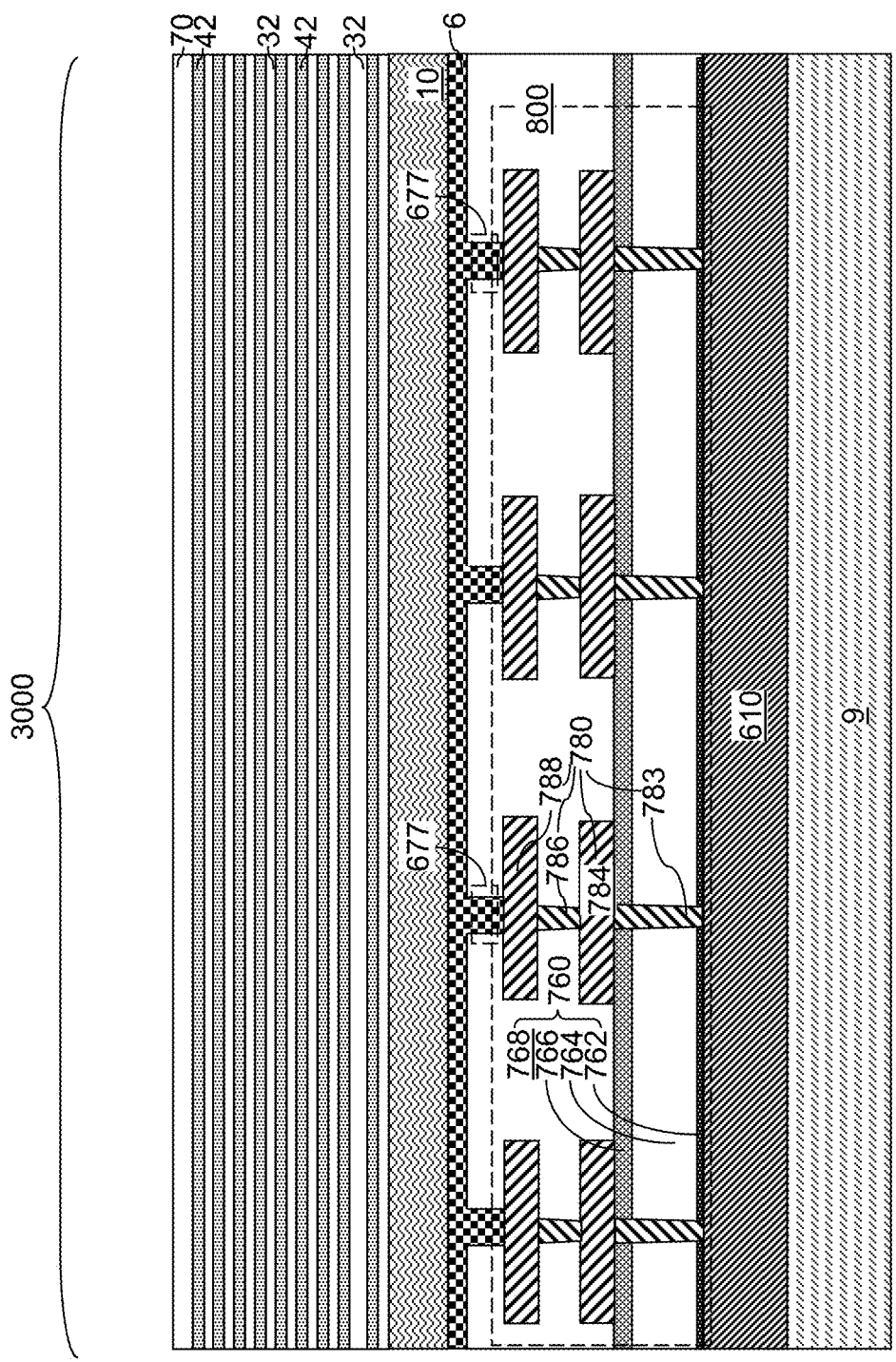
FIG. 4B is a magnified vertical cross-sectional view of the scribe region D at the processing step of FIG. 4A.
Figure 4C:
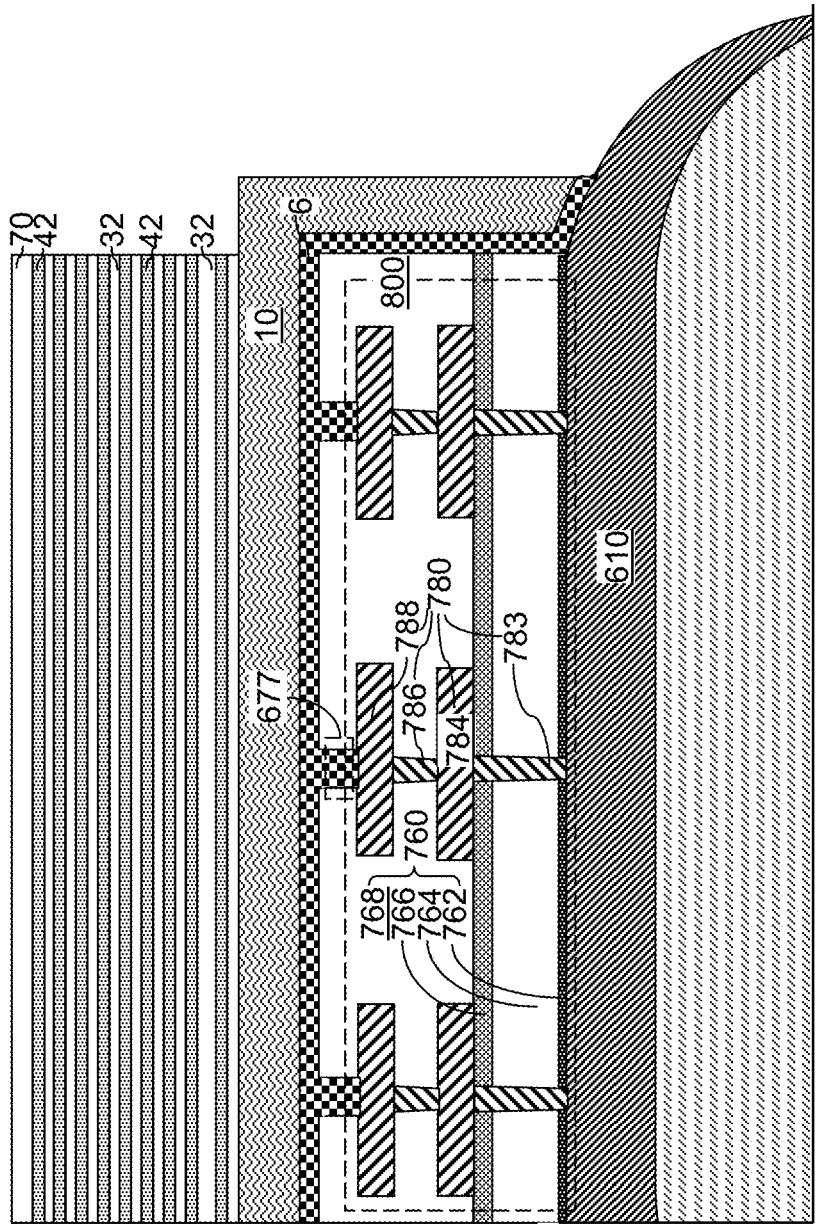
FIG. 4C is a magnified vertical cross-sectional view of the bevel region E at the processing step of FIG. 4A.

Referring to FIGS. 4A-4C, an alternating stack of first material layers and second material layers is formed over the doped semiconductor layer 10. Each first material layer can include a first material, and each second material layer can include a second material that is different from the first material.

The alternating stack can include insulating layers 32 as the first material layers, and spacer material layers as the second material layers. In one embodiment, the spacer material layers can be sacrificial material layers that are subsequently replaced with electrically conductive layers. In another embodiment, the spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be insulating layers 32 and sacrificial material layers 42, respectively. Each insulating layer 32 can include an insulating material, and each sacrificial material layer 42 can include a sacrificial material. An alternating plurality of insulating layers 32 and sacrificial material layers 42 is formed over the doped semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating stack (32, 42) can include insulating layers 32 composed of the first material, and sacrificial material layers 42 composed of the second material, which is different from the first material. The first material of the insulating layers 32 can be at least one insulating material. Insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. In one embodiment, the sacrificial material layers 42 can be material layers that comprise silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethylorthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

An insulating cap layer 70 is subsequently formed over the stack (32, 42). The insulating cap layer 70 includes a dielectric material, which can be any dielectric material that can be employed for the insulating layers 32. In one embodiment, the insulating cap layer 70 includes the same dielectric material as the insulating layers 32. The thickness of the insulating cap layer 70 can be in a range from 20 nm to 300 nm, although lesser and greater thicknesses can also be employed.

The insulating cap layer 70 and the alternating stack (32, 42) can be patterned to form stepped surfaces in each word line contact via region 200. Each of the word line contact via regions 200 can include a respective stepped area in which the stepped surfaces are formed. An overlying spacer material layer (such as a sacrificial material layer 42) can have a lesser lateral extent than an underlying spacer material layer within a region of the stepped surfaces, i.e., within the stepped area. The stepped surfaces can be formed, for example, by forming a mask layer with an opening therein, etching a cavity within the levels of the insulating cap layer 70, and iteratively expanding the etched area and vertically recessing the cavity by etching each pair of an insulating layer 32 and a sacrificial material layer 42 located directly underneath the bottom surface of the etched cavity within the etched area.

The etching of each pair of an insulating layer 32 and a sacrificial material layer 42 during formation of the stepped surfaces can be performed by iteratively trimming the mask layer by respective trimming processes (which may employ peripheral ashing) and by respective anisotropic etch processes (such as reactive ion etch processes). According to an aspect of the present disclosure, accumulated electrical charge in the alternating stack (32, 42) during the anisotropic etch processes can be discharged to the semiconductor substrate 9 through the planar semiconductor material layer 10, the metallic material layer 6 that includes the downward-protruding portions 677, any intervening lower level metal interconnect structures 780, and the conductive doped semiconductor well 610 (if present). The electrical charge that accumulates at the stepped surfaces of the alternating stack (32, 42) in the chip regions 2000 is discharged through conductive paths from the chip regions 2000 to the scribe regions 3000, and then into the upper portion of the semiconductor substrate 9 (such as the conductive doped semiconductor well 610, if present). In one embodiment, the electrical charge can flow into the circumferential bevel region 4000, and discharged through a conductive chuck in contact with the semiconductor substrate 9.

A dielectric material can be deposited to fill the stepped cavity to form a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. The retro-stepped dielectric material portion 65 overlies the at least one lower level dielectric layer 760. The alternating stack (32, 42) and the retro-stepped dielectric material portion 65 collectively constitute a memory-level structure, which is an in-process structure that is subsequently modified.

In one embodiment shown in FIG. 4C, portions of the at least one lower level dielectric layer 760 and the alternating stack (32, 42) can be removed at a peripheral region of the semiconductor substrate 9 by one or more processing steps. The region from which the portions of the at least one lower level dielectric layer 760 and the alternating stack (32, 42) may include a portion, or the entirety, of the circumferential bevel region 4000. In one embodiment, the circumferential bevel region 4000 of the semiconductor substrate can be physically exposed prior to, during, or after patterning of the stepped surfaces on the alternating stack (32, 42). Optionally, drain select level isolation structures 72 can be formed through drain select levels, which are topmost levels of the alternating stack (32, 42). For example, a photoresist layer can be applied and patterned to form elongated openings in the memory array region 100. An anisotropic etch is performed to transfer the pattern in the photoresist layer into the topmost levels of the alternating stack (32, 42) and to form line trenches. After removal of the photoresist layer, a dielectric material can be deposited in the line trenches. Excess portions of the dielectric material can be removed, for example, by a planarization process to form the drain select level isolation structures 72.

Referring to FIGS. 5A-5D, a photoresist layer 47 can be formed over the alternating stack (32, 42), and can be lithographically patterned to form openings within the photoresist layer 47. The pattern in the photoresist layer 47 includes an array of openings at locations at which memory stack structures are to be subsequently formed. The pattern in the photoresist layer 47 includes additional openings at locations at which support pillar structures are to be subsequently formed in case the spacer material layers are formed as sacrificial material layers 42. In order to prevent arcing in the bevel region, the photoresist layer is removed from the bevel region 4000.

The pattern in the photoresist layer 47 can be transferred through the insulating cap layer 70 and through the entirety of the alternating stack (32, 42) by at least one anisotropic etch that employs the patterned photoresist layer 47 as an etch mask. Portions of the insulating cap layer 70 and the alternating stack (32, 42) underlying the openings in the patterned photoresist layer 47 are etched to form the memory openings 49 and the support openings 19. The transfer of the pattern in the photoresist layer 47 through the insulating cap layer 70 and the alternating stack (32, 42) forms the memory openings 49 in the memory array region 100 and the support openings 19 in the word line contact via region 200.

The memory openings 49 and support openings 19 can extend to or through a top surface of the doped semiconductor layer 10. Alternatively, one or more of the support openings 19 can extend into the at least one lower level dielectric layer 760. The memory openings can be formed in the memory array region 100 at locations at which memory stack structures including vertical stacks of memory elements are to be subsequently formed, and the support openings can be formed in the word line contact via regions 200. Openings may, or may not, be formed in the scribe regions 3000.

In one embodiment, the chemistry of the anisotropic etch process employed to etch through the materials of the alternating stack (32, 42) can alternate to optimize etching of the first and second materials in the alternating stack (32, 42). The anisotropic etch can be, for example, a series of reactive ion etch processes. The sidewalls of the memory openings can be substantially vertical, or can be tapered.

According to an aspect of the present disclosure, the anisotropic etch process that etches the portions of the alternating stack (32, 42) that underlies the openings in the photoresist layer 47 employs positively charged reactive ions that are generated from the plasma in a process chamber. The positive charged reactive ions impinge on the portions of the alternating stack (32, 42) that are not masked by the photoresist layer 47. Thus, there is a net transfer of positive charge from the plasma of the process chamber into the alternating stack (32, 42) of the exemplary structure. The positive charge flow paths PCFP of the positively charged reactive ions of the plasma are schematically illustrated in FIG. 5A.

According to an aspect of the present disclosure, the downward-protruding portions 677 of the buried source line (e.g., of the metallic material layer 6) conduct negative electrical charge from the semiconductor substrate 9 during the anisotropic etch process so that the positive charge that accumulate in the alternating stack (32, 42) are neutralized by the negative charge from flow from the semiconductor substrate 9. Exemplary negative charge flow paths NCFP are illustrated in FIGS. 5A, 5C, and 5D. The negative charge flow paths NCFP can include, for example, the conductive doped semiconductor well 610, the scribe region metal interconnect structures 800 (if present), the metallic material layer 6 (including the downward-protruding portions 677), the doped semiconductor layer 10, and portions of any unetched layers within the alternating stack (32, 42) that underlie the bottom surfaces of the memory openings 49 and the support openings 19 during formation thereof. The memory openings 49 and the support openings 19 can extend into an upper portion of the doped semiconductor layer 10 at the end of the anisotropic etch process. The patterned photoresist layer 47 is subsequently removed, for example, by ashing.

Subsequently, a memory stack structure can be formed in each memory openings 49 while a support pillar structure is formed in each support opening 19. FIGS. 6A-6H illustrate structural changes in a memory opening 49, which is one of the memory openings 49 in the exemplary structure of FIGS. 5A and 5B. The same structural change occurs simultaneously in each of the other memory openings 49 and in each support opening 19.

Figure 5A:
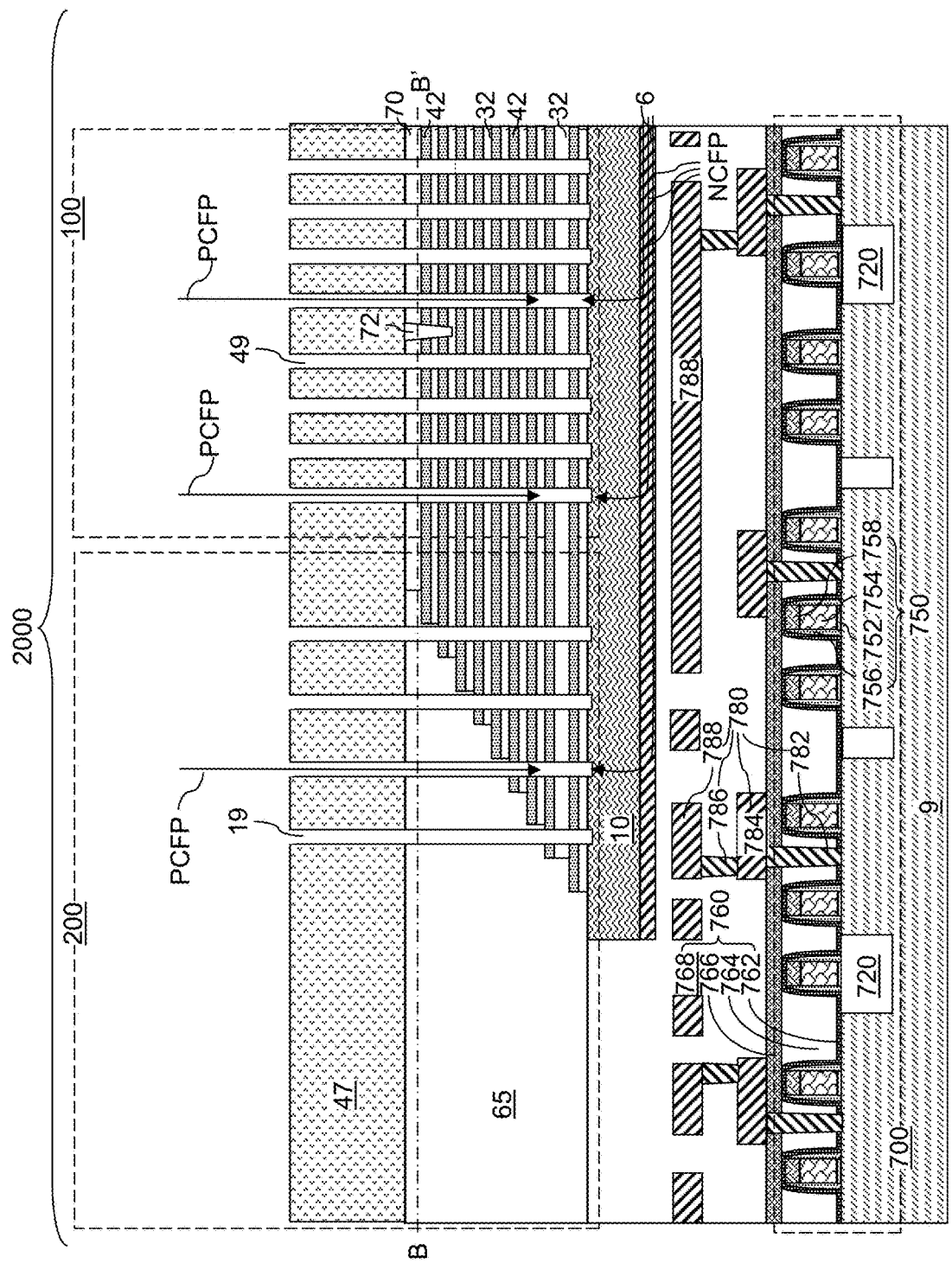
FIG. 5A is a magnified vertical cross-sectional view of the chip region C at a terminal portion of an anisotropic etch process that forms memory openings and support openings according to an embodiment of the present disclosure.
Figure 5C:
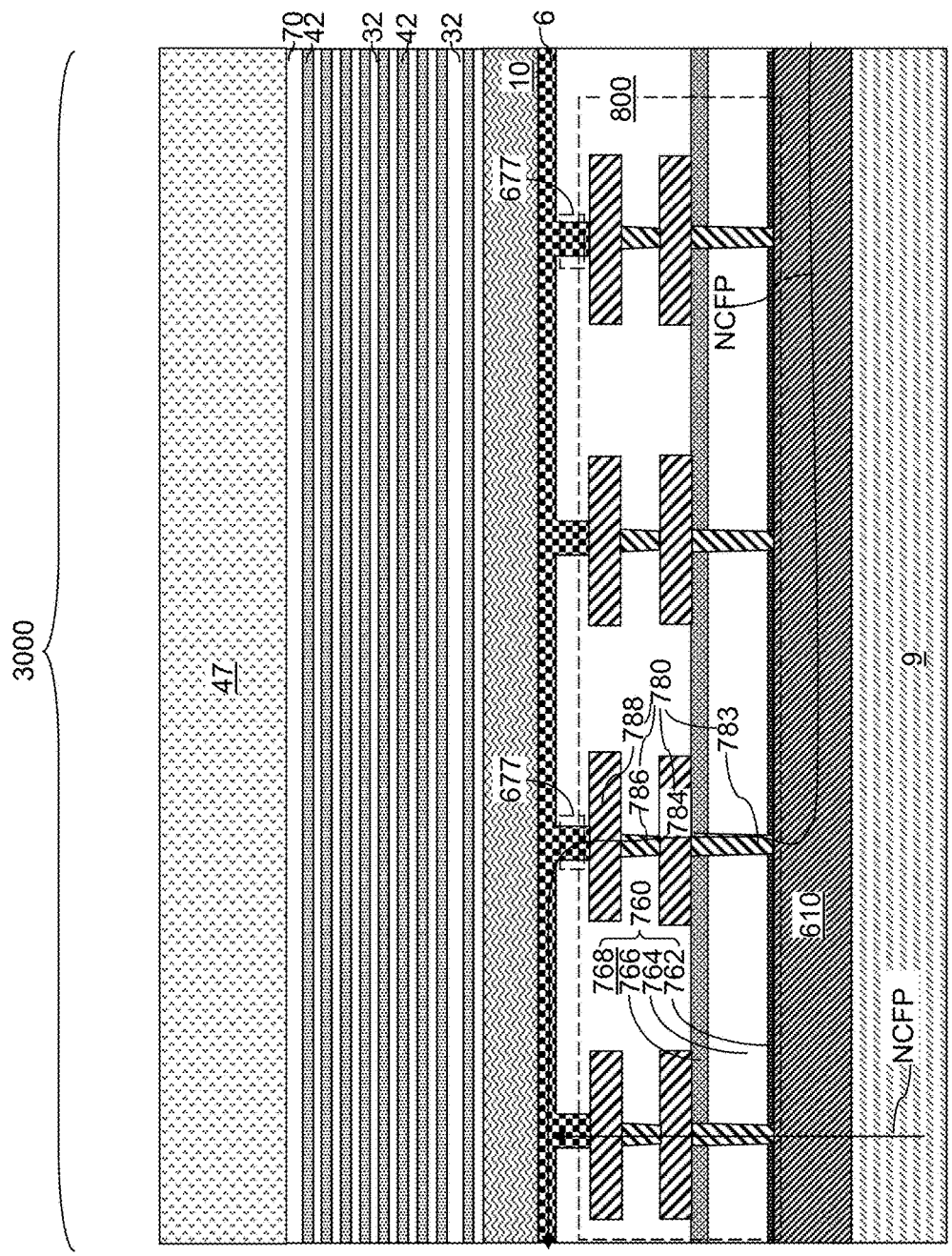
FIG. 5C is a magnified vertical cross-sectional view of the scribe region D at the processing step of FIG. 5A.
Figure 5D:
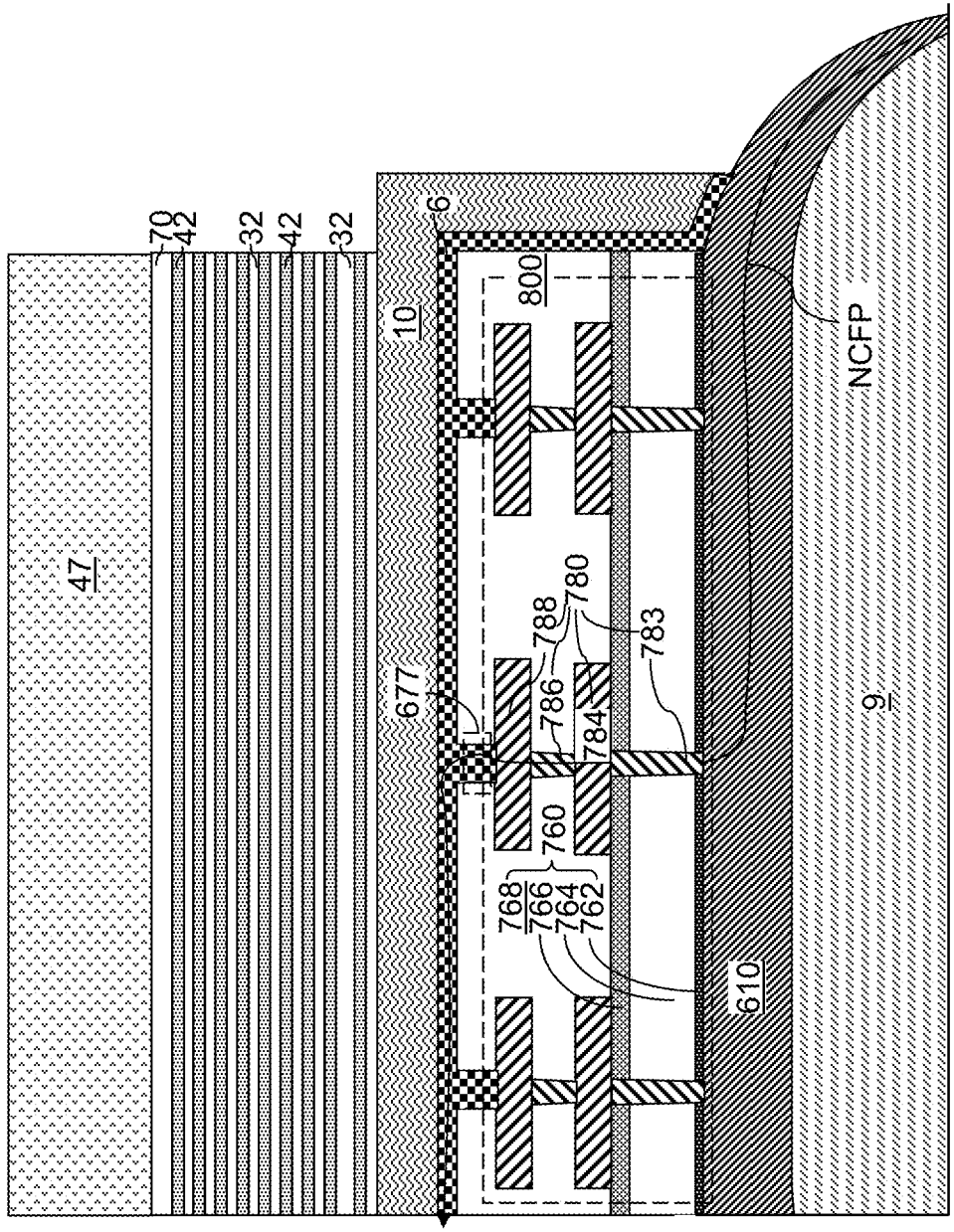
FIG. 5D is a magnified vertical cross-sectional view of the bevel region E at the processing step of FIG. 5A.

Referring to FIG. 6A, a memory opening 49 in the exemplary structure of FIGS. 5A and 5B is illustrated. The memory opening 49 extends through the insulating cap layer 70, the alternating stack (32, 42), and into an upper portion of the doped semiconductor layer 10. At this processing step, each support opening 19 can extend through the retro-stepped dielectric material portion 65 and a subset of layers in the alternating stack (32, 42), and optionally through the upper portion of the doped semiconductor layer 10. The recess depth of the bottom surface of each memory opening with respect to the top surface of the doped semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 6B, an optional pedestal channel portion 11 can be formed at the bottom portion of each memory opening 49 and each support openings 19, for example, by a selective semiconductor deposition process. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the doped semiconductor layer 10 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise doped polysilicon. In one embodiment, the pedestal channel portion 11 can have a doping of the second conductivity type, which is the opposite of the conductivity type of the doped semiconductor layer 10 that the pedestal channel portion contacts. For example, if the first conductivity type is p-type, the second conductivity type is n-type, and vice versa.

Referring to FIG. 6C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen.

The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charge to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charge therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charge upon programming. In one embodiment, the charge storage layer 54 can be a charge storage layer in which each portion adjacent to the sacrificial material layers 42 constitutes a charge storage region.

A surface of the pedestal channel portion 11 (or a surface of the doped semiconductor layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 6E:
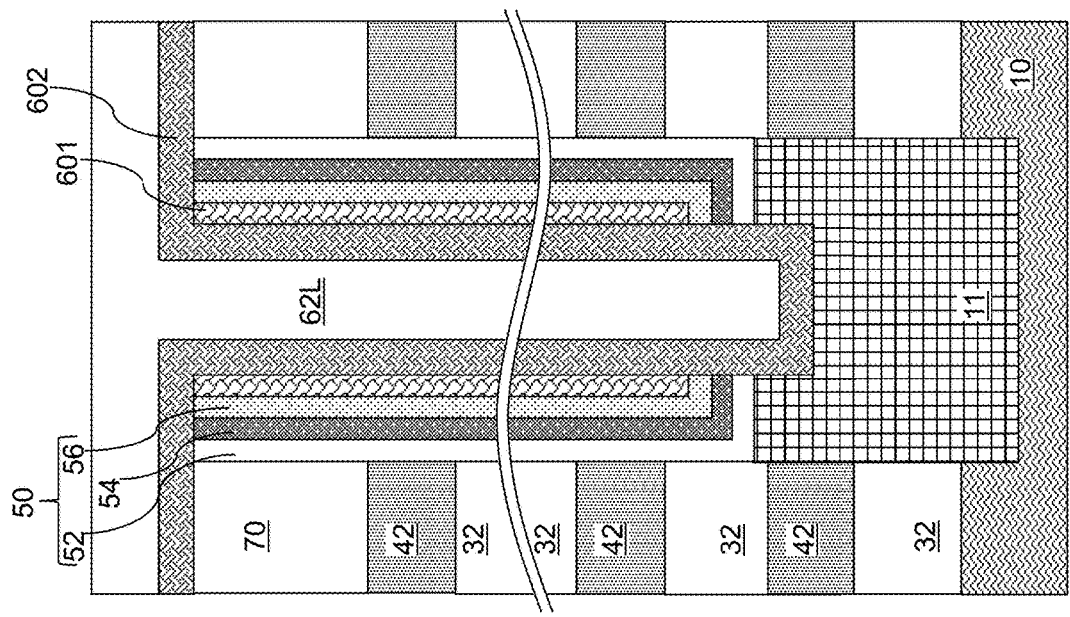

Referring to FIG. 6E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 6F:
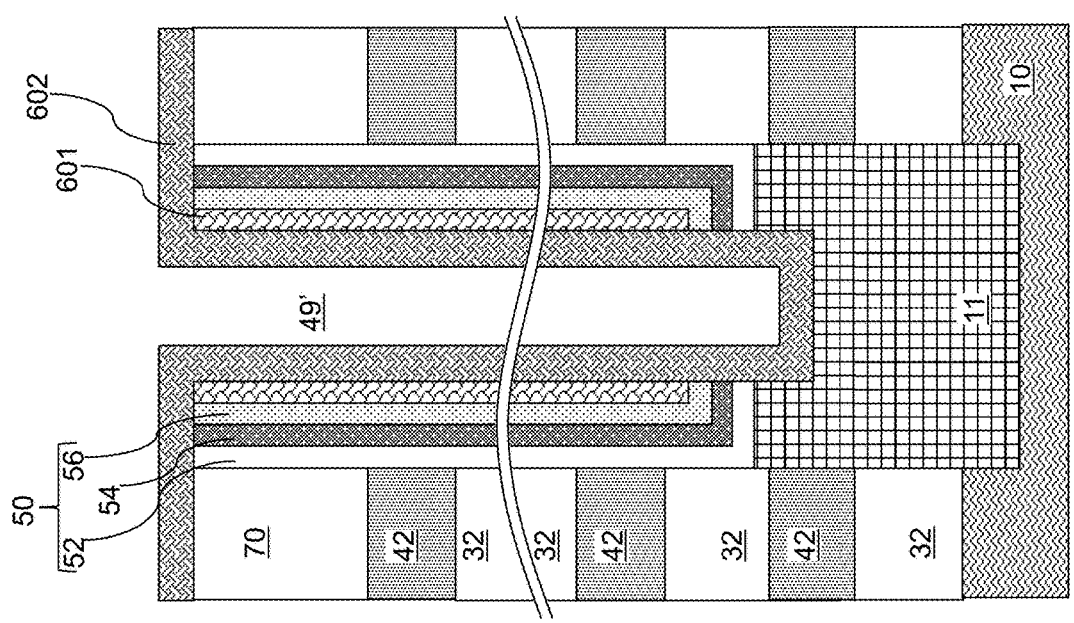

Referring to FIG. 6F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 6G:
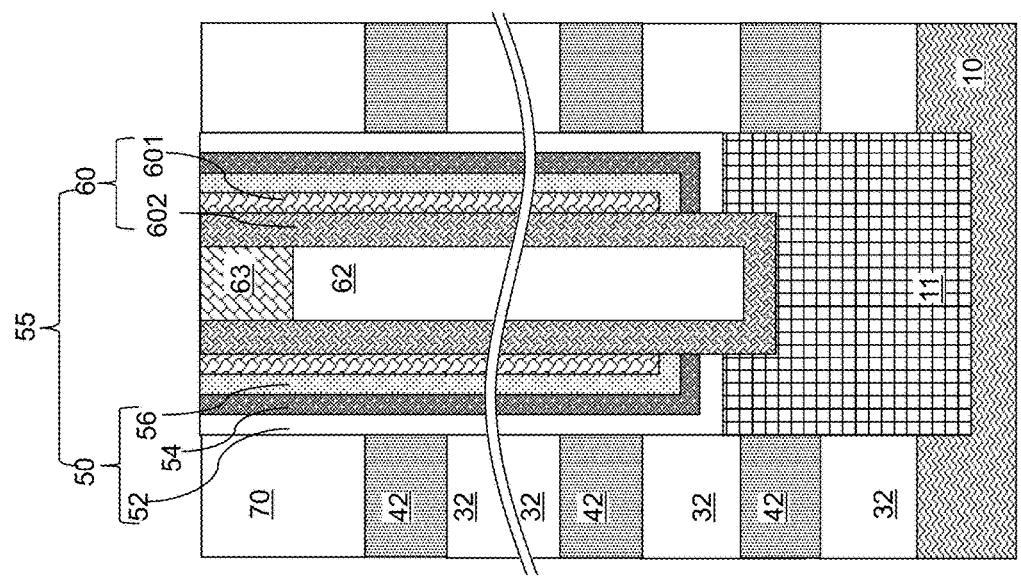

Referring to FIG. 6G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charge with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 6H:
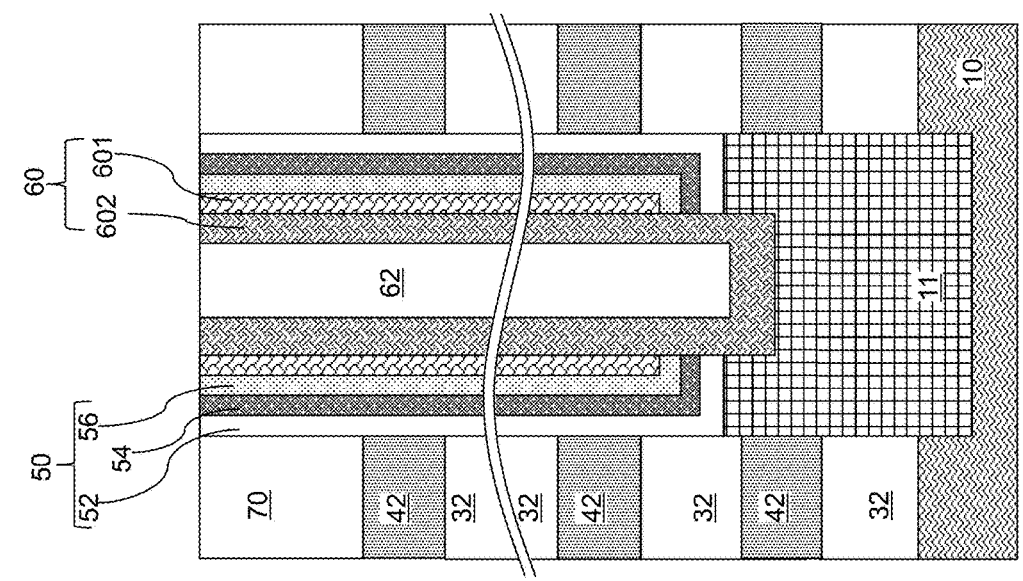

Referring to FIG. 6H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a first conductivity type. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The vertical semiconductor channel 60 is laterally surrounded by the memory film 50. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. In one embodiment, the memory film can include, from outside to inside, a blocking dielectric layer 52, a charge trapping layer 54 comprising a material that traps electrical charge, and a tunneling dielectric layer 56 that contacts an outer sidewall of the vertical semiconductor channel 56.

Figure 7:
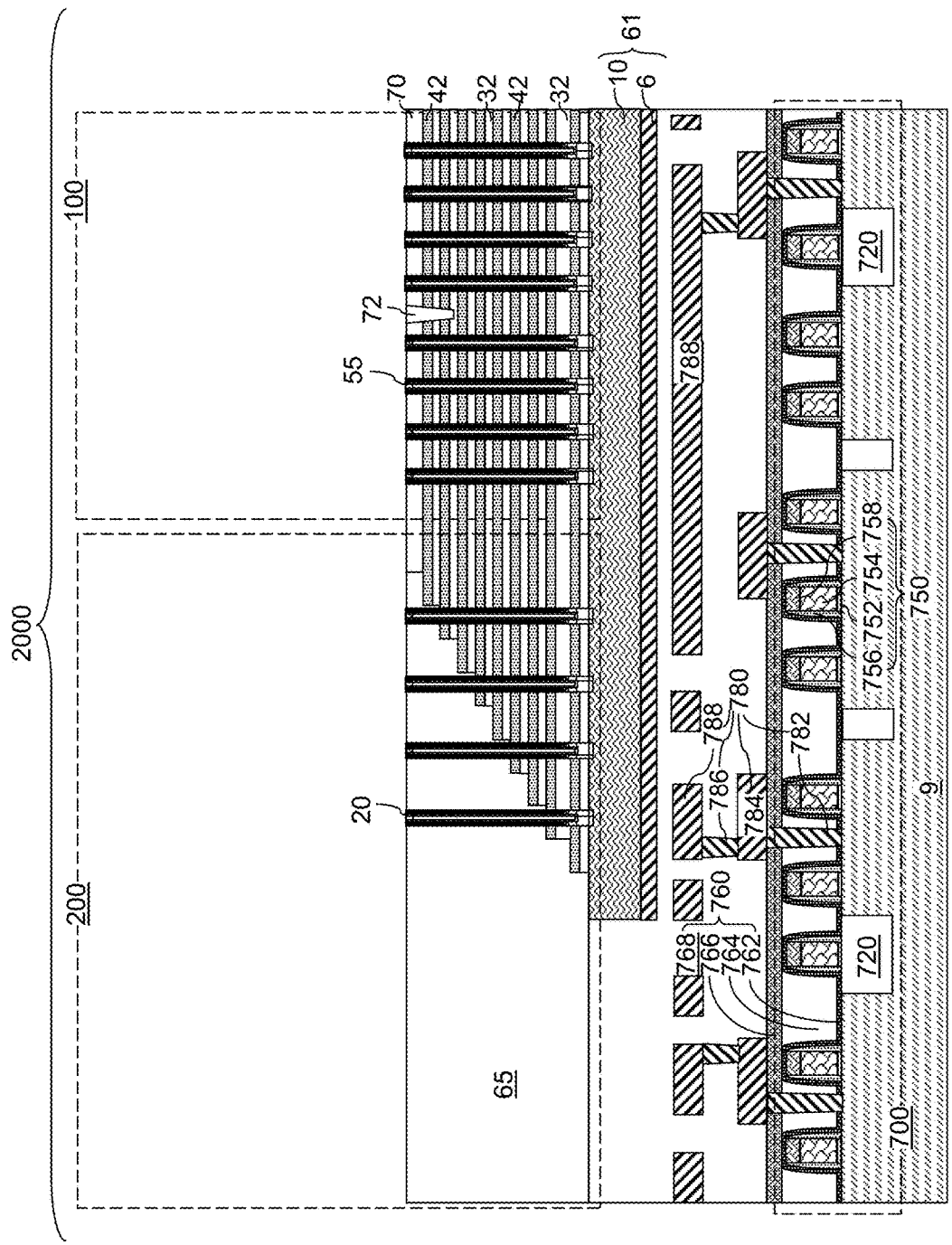
FIG. 7 is a vertical cross-sectional view of the chip region C after the processing steps of FIG. 6H according to an embodiment of the present disclosure.

Referring to FIG. 7, a portion of a chip region 2000 of the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 5A and 5B. An instance of the support pillar structure 20 can be formed within each support opening 19 of the structure of FIGS. 5A and 5B. The combination of the metallic material layer 6 and the doped semiconductor layer 10 constitutes a buried source line 61.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 8A:
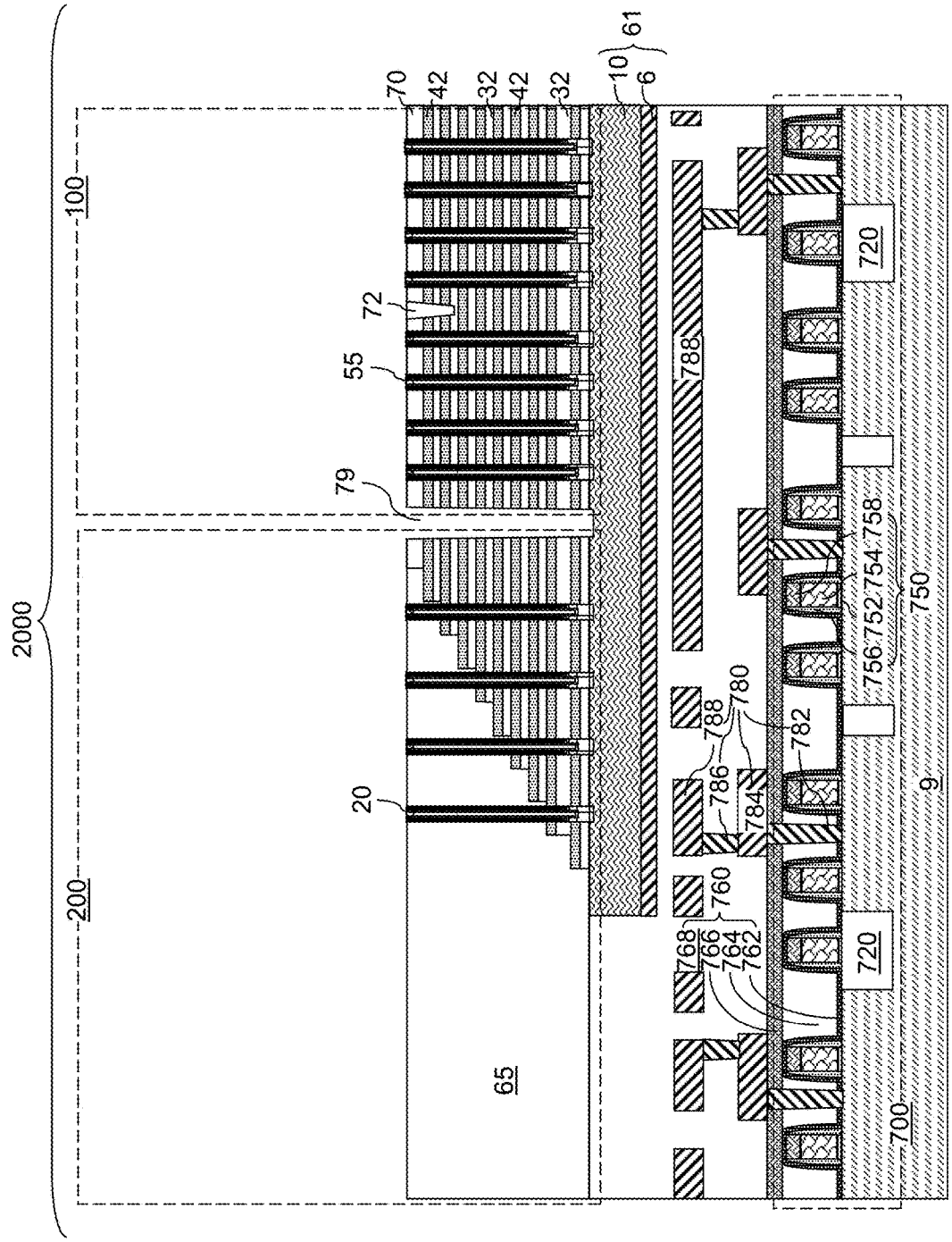
FIG. 8A is a vertical cross-sectional view of the chip region C of the exemplary structure after formation of backside separation trenches according to an embodiment of the present disclosure.

Referring to FIGS. 8A and 8B, a photoresist layer (not shown) can be applied over the insulating cap layer 70 and the retro-stepped dielectric material portion 65, and is lithographically patterned to form openings in areas between clusters of memory stack structures 55. The pattern in the photoresist layer can be transferred through the insulating cap layer 70, the alternating stack (32, 42) and/or the retro-stepped dielectric material portion 65 employing an anisotropic etch to form backside trenches 79, which vertically extend from the top surface of the insulating cap layer 70 at least to the top surface of the doped semiconductor layer 10, and laterally extend through the memory array region 100 and the word line contact via region 200. The backside trenches 79 divide each memory array region 100 in the chip regions 2000 into multiple blocks (B1, B2, B3, etc.). The photoresist layer can be removed, for example, by ashing.

According to an aspect of the present disclosure, the buried source line 61 (e.g., the doped semiconductor layer 10 and the metallic material layer 6) that straddles each neighboring pair of a chip region 2000 and a scribe region 3000, the optional scribe region metal interconnect structures 800, and the optional conductive doped semiconductor well 610 provide electrically conductive paths for negative electrical charge to neutralize the positive charge accumulation in the alternating stack (32, 42) during the anisotropic etch that forms the backside trenches 79. Thus, arcing through the upper portions of the at least one lower level dielectric material layer 760 can be prevented or reduced.

Figure 9:
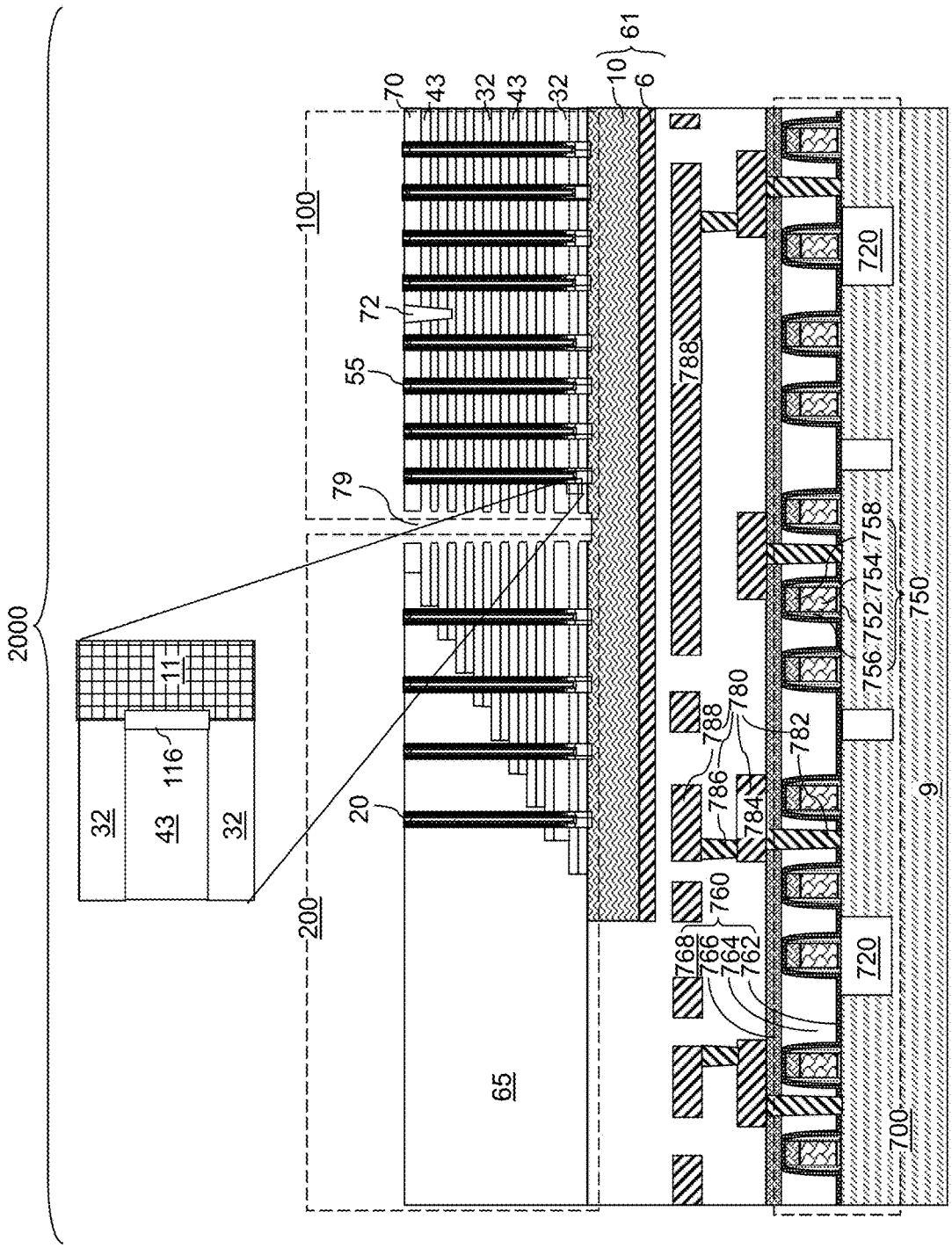
FIG. 9 is a vertical cross-sectional view of the chip region C of the exemplary structure after formation of backside recesses by removal of the spacer dielectric layers and formation of tubular dielectric spacers according to an embodiment of the present disclosure.

Referring to FIG. 9, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the doped semiconductor layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the semiconductor substrate 9. In this case, each backside recess 43 can define a space for receiving a respective word line of the array of monolithic three-dimensional NAND strings.

Each of the plurality of backside recesses 43 can extend substantially parallel to the top surface of the semiconductor substrate 9. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the doped semiconductor layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the doped semiconductor layer 10 into a planar dielectric portion (not expressly shown). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion includes a dielectric material that includes the same semiconductor element as the semiconductor material layer and additionally includes at least one non-metallic element such as oxygen and/or nitrogen such that the material of the planar dielectric portions is a dielectric material. In one embodiment, the planar dielectric portions can include a dielectric oxide, a dielectric nitride, or a dielectric oxynitride of the semiconductor material of the doped semiconductor layer 10.

Figure 10:
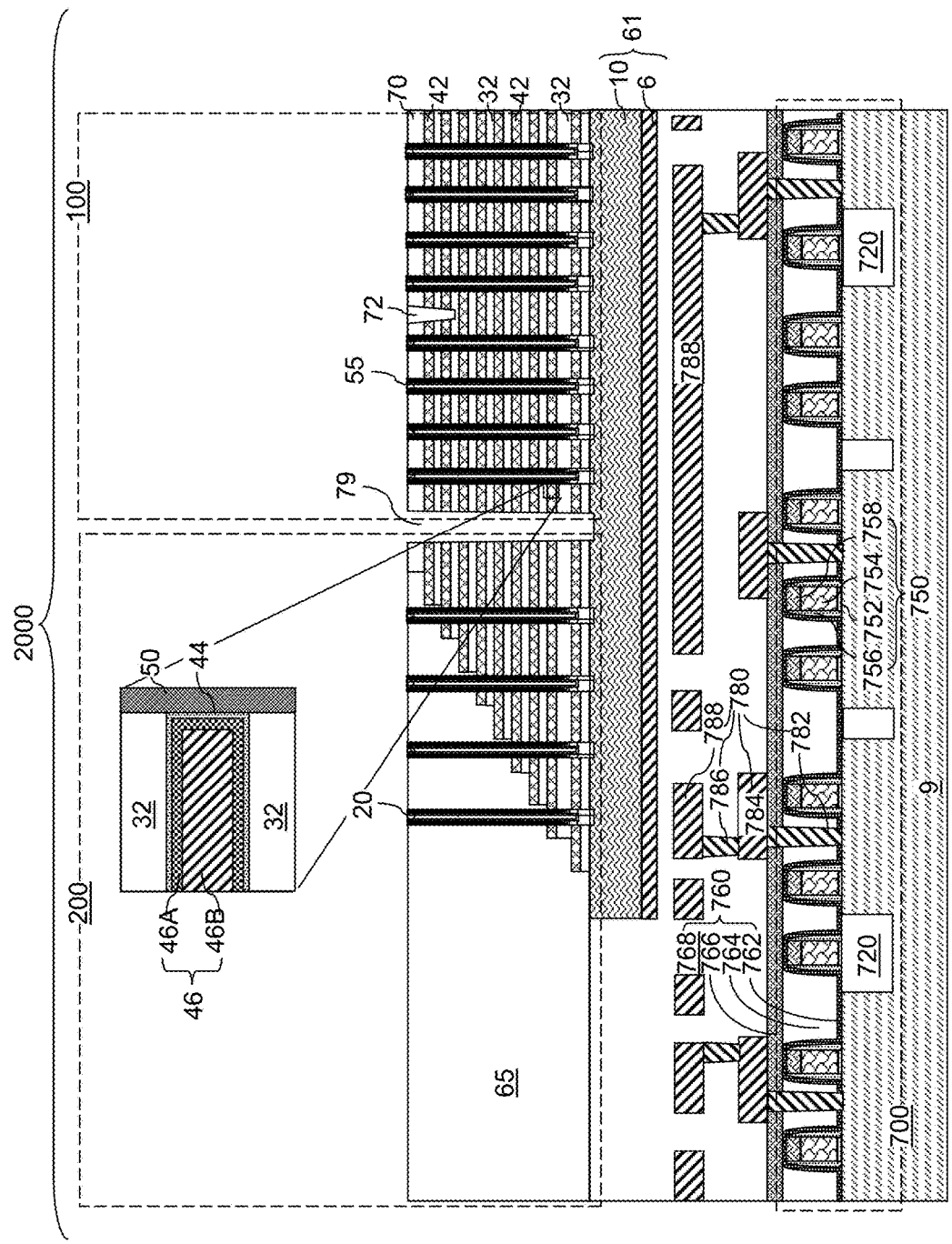
FIG. 10 is a vertical cross-sectional view of the chip region C of the exemplary structure after formation of electrically conductive layers according to an embodiment of the present disclosure.

Referring to FIG. 10, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present. The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition.

A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as WF6. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, or a topmost insulating layer and the insulating cap layer 70. The continuous metallic material layer includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity is present in the portion of each backside trench 79 that is not filled with the backside blocking dielectric layer 44 and the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79.

In another embodiment, the removal of the continuous electrically conductive material layer may not be selective to the material of the backside blocking dielectric layer 44 or, the backside blocking dielectric layer 44 may not be employed. A backside cavity is present within each backside trench 79.

Figure 11:
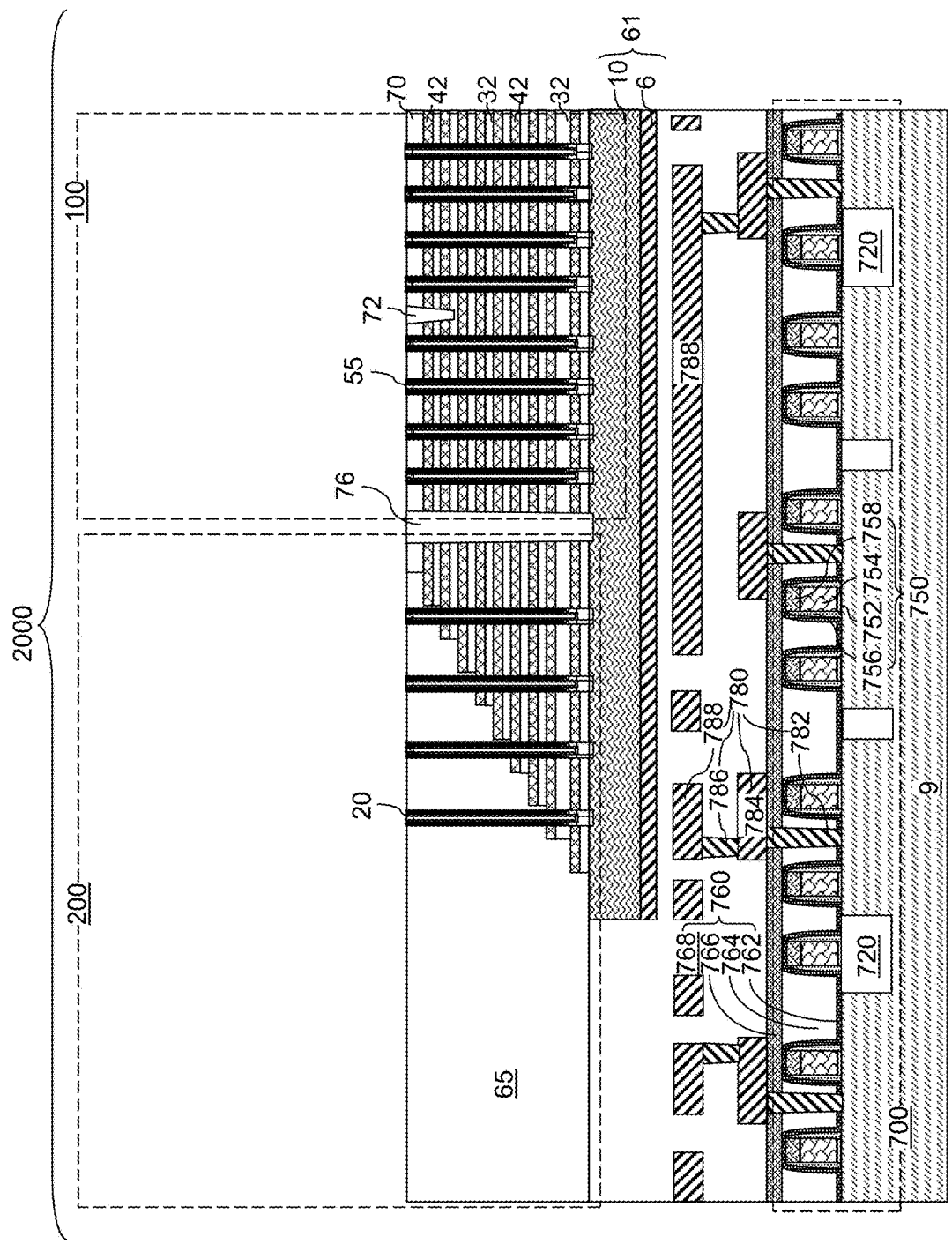
FIG. 11 is a vertical cross-sectional view of the chip region C of the exemplary structure after formation of insulating wall structures according to an embodiment of the present disclosure.

Referring to FIG. 11, an insulating material can be deposited in the at least one backside trench 79 to form an insulating wall structure 76. The insulating material can include, for example, silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). Excess portions of the insulating material can be removed from above the top surface of the insulating cap layer 70 by a planarization process such as chemical mechanical planarization or a recess etch.

Figure 12A:
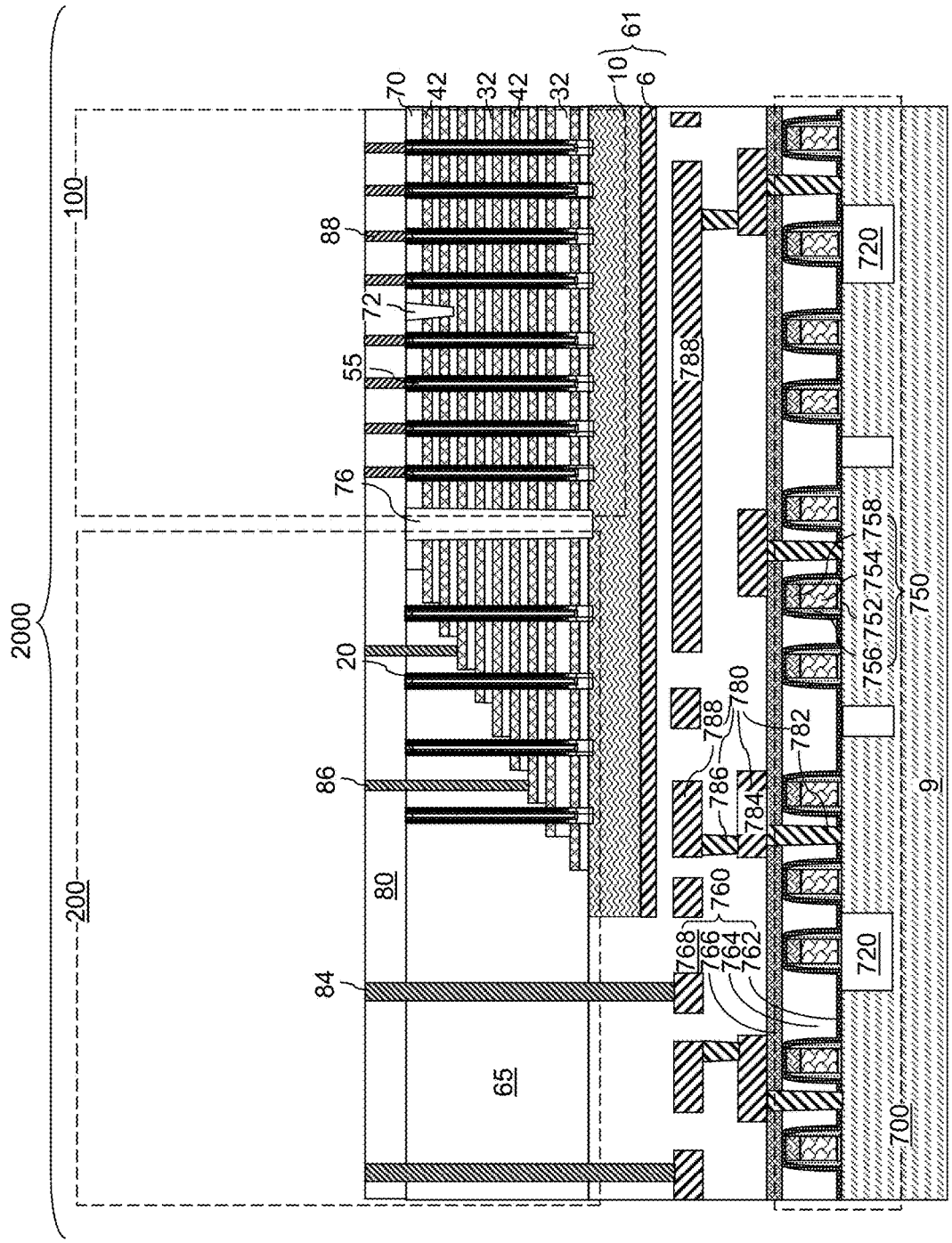
FIG. 12A is a vertical cross-sectional view of the chip region C of the exemplary structure after formation of various contact via structures according to an embodiment of the present disclosure.
Figure 12B:
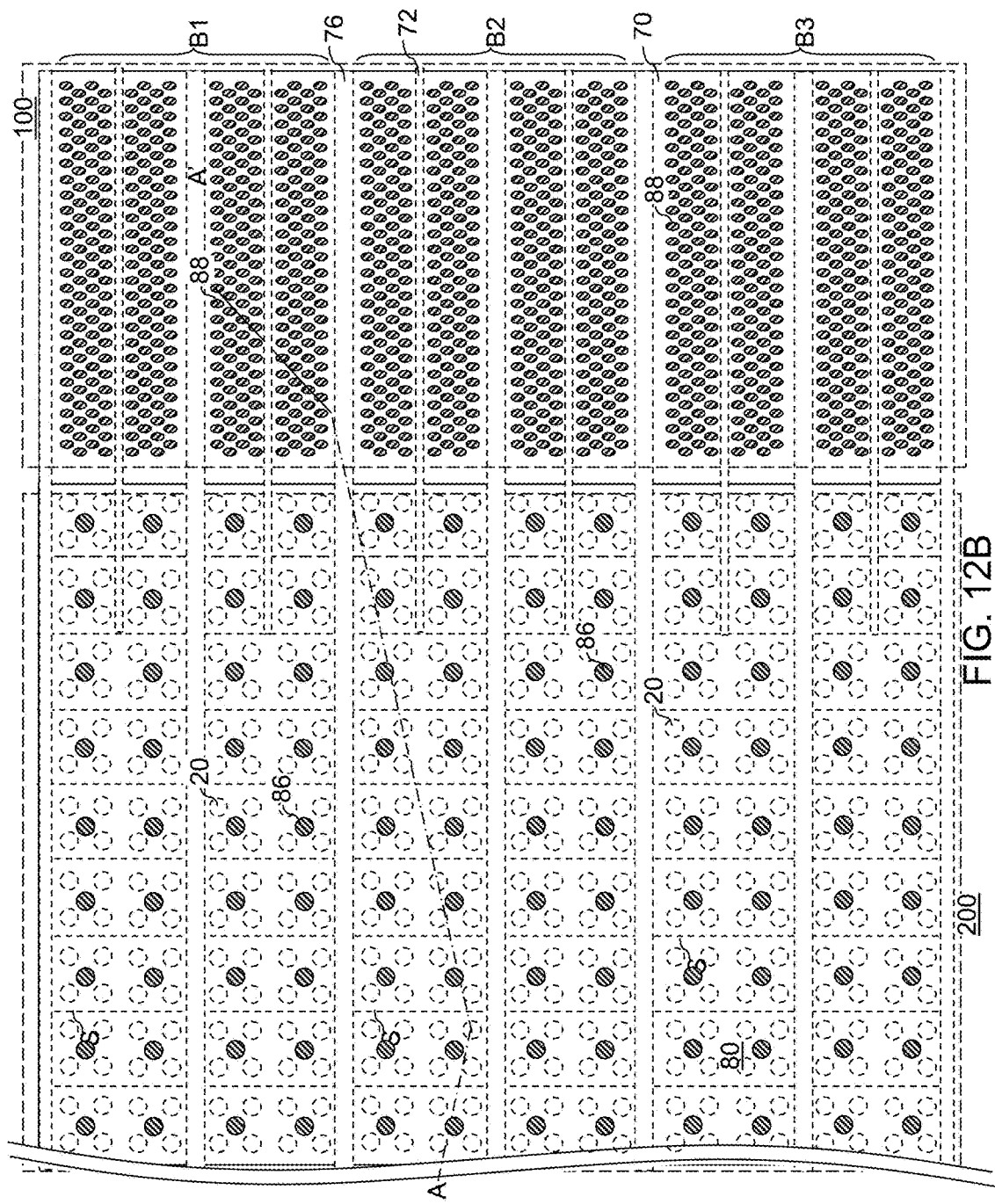
FIG. 12B is a top-down view of the chip region C of the exemplary structure of FIG. 12A.

Referring to FIGS. 12A and 12B, a contact level dielectric layer 80 can be formed over the alternating stack (32, 46) and the retro-stepped dielectric material portion 65. The contact level dielectric layer 80 includes a dielectric material such as silicon oxide, silicon nitride, or organosilicate glass. The thickness of the contact level dielectric layer 80 can be in a range from 200 nm to 600 nm, although lesser and greater thicknesses can also be employed.

Additional contact via structures (88, 86, 84) can be formed through the contact level dielectric layer 80, and optionally through the retro-stepped dielectric material portion 65. For example, drain contact via structures 88 can be formed through the contact level dielectric layer 80 on each drain region 63. Word line contact via structures 86 can be formed on the electrically conductive layers 46 through the contact level dielectric layer 80, and through the retro-stepped dielectric material portion 65 within regions of the stepped surfaces, i.e., in the word line contact via regions 200. Through-memory-level contact via structures 84 can be formed through the retro-stepped dielectric material portion 65 directly on a subset of the lower metal interconnect structures 780.

Figure 13:
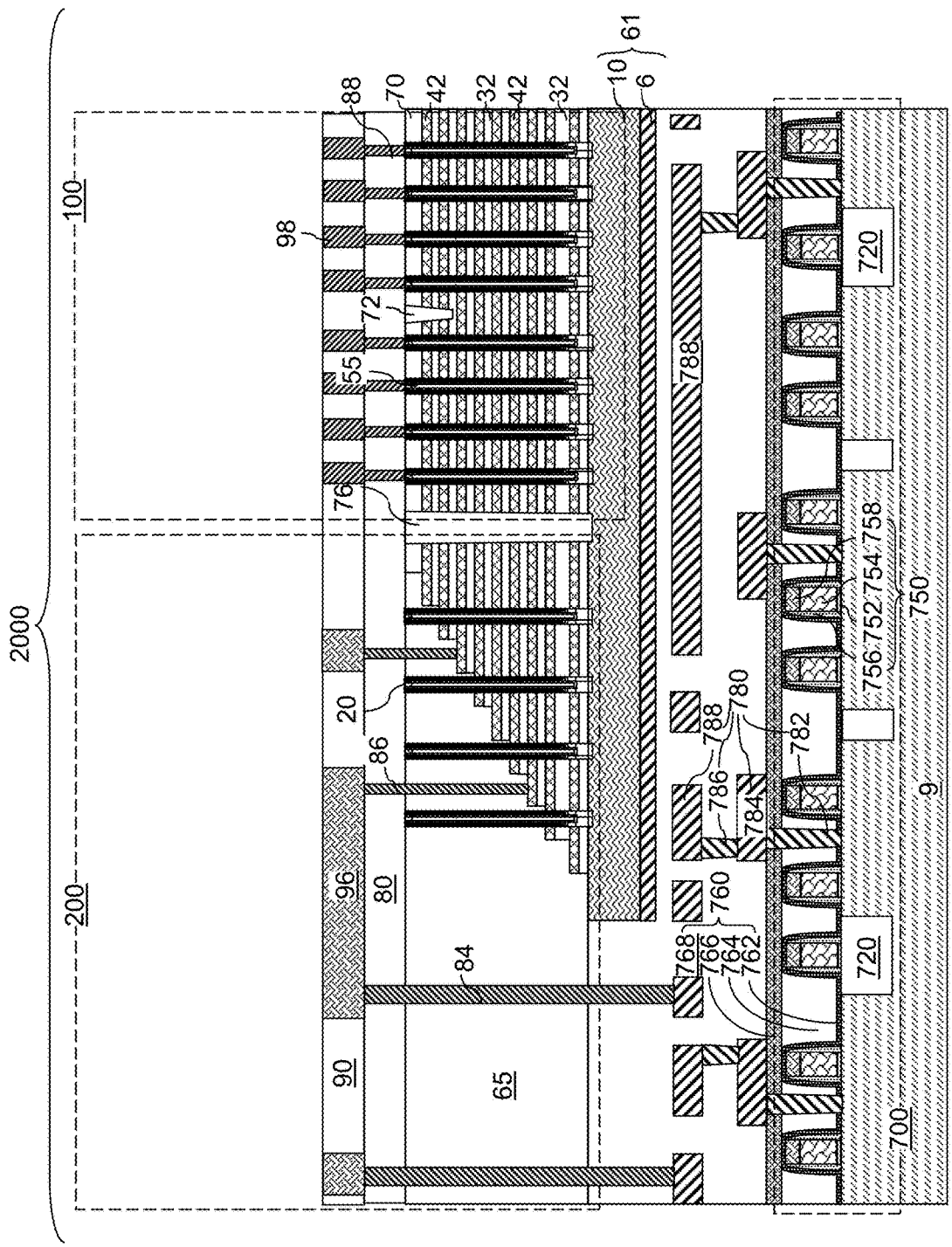
FIG. 13 is a vertical cross-sectional view of the chip region C of the exemplary structure after formation of upper level metal interconnect structures according to an embodiment of the present disclosure.

Referring to FIG. 13, at least one upper level dielectric layer 90 can be formed over the alternating stack (32, 46) and the contact level dielectric layer 80. Upper level metal interconnect structures (96, 98) can be formed in the at least one upper level dielectric layer 90. The upper level metal interconnect structures (96, 98) can include bit lines 98 for the memory stack structures 55, and upper level peripheral metal interconnect structures 96. The through-memory-level contact via structures 84 can be electrically shorted to a respective one of the upper level metal interconnect structures (96, 98) and a respective one of the lower metal interconnect structures 780, and thus, to a respective one of the semiconductor devices on the semiconductor substrate 9.

Upon formation, the downward-protruding portions 677 of the metallic material layer 6 can function as a vertical conduit for electrical charge during each anisotropic etch process. Thus, arcing between the semiconductor devices or the lower level metal interconnect structures 780 and the buried source line 61 (e.g., the metallic material layer 6 portion of the buried source line) can be reduced or avoided during each anisotropic etch process after formation of the downward-protruding portions 677 of the buried source line 61 (e.g., of the metallic material layer 6). Upon completion of fabrication of the semiconductor chips (e.g., semiconductor dies), the downward-protruding portions 677 of the buried source line 61 (e.g., of the metallic material layer 6) in the scribe regions 3000 are no longer necessary, and thus, can be removed during dicing of the semiconductor substrate 9 into semiconductor chips.

FIG. 14A schematically illustrates a vertical cross-sectional view of the exemplary structure at the processing steps of FIG. 13, i.e., after formation of memory devices (not shown for clarity) on the semiconductor substrate 9.

Figure 14B:
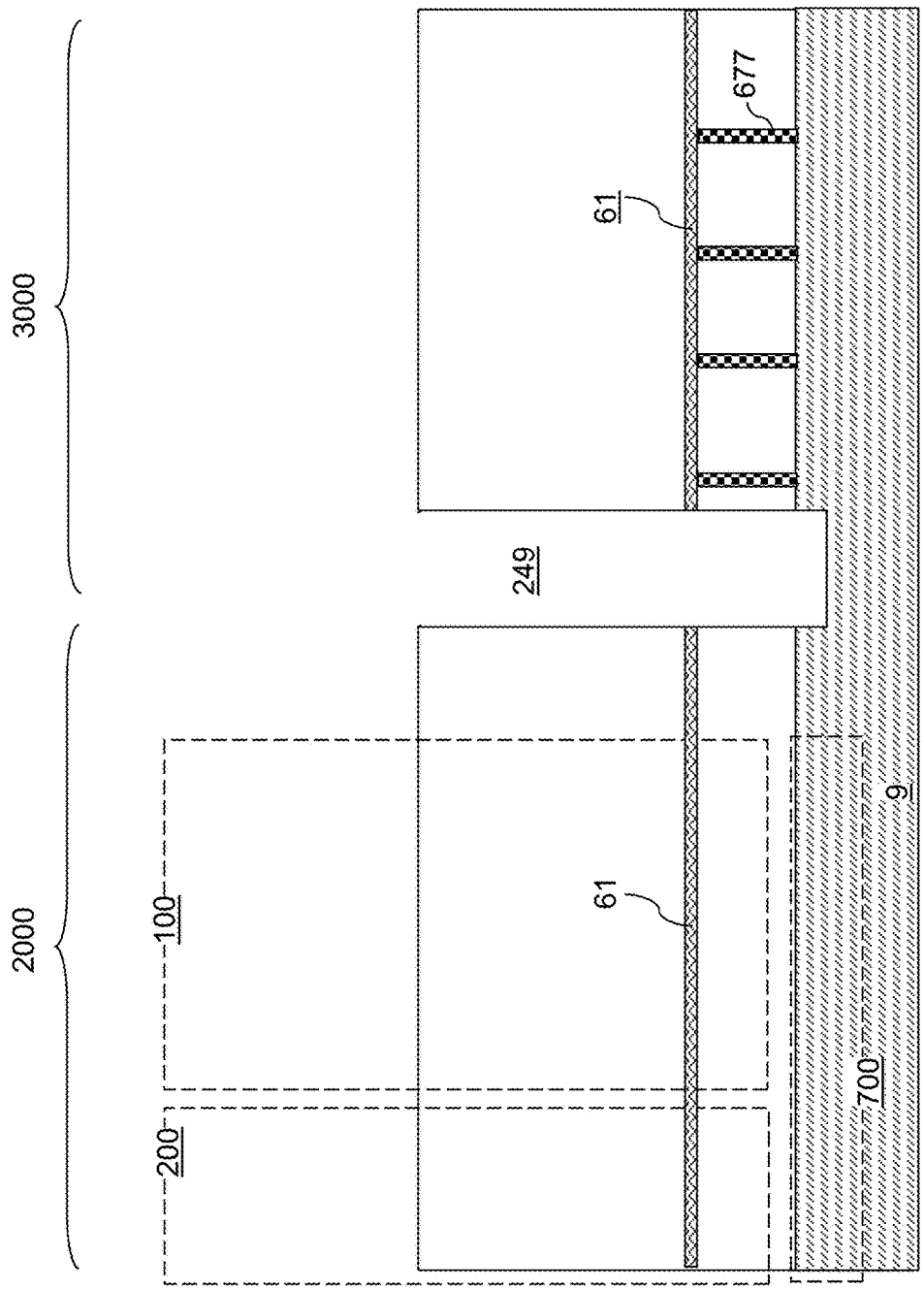
FIG. 14B is a schematic vertical cross-sectional view of the exemplary structure after formation of separation trench that separates the buried strap line into physically disjoined portions at each boundary between each neighboring pair of a chip region and a scribe region according to an embodiment of the present disclosure.

Referring to FIG. 14B, a separator trench 249 can be formed through the memory-level structure (i.e., the set of all components above a horizontal plane including an interface between the bottom surface of buried source line 61 that is electrically shorted to a bottom end of each memory stack structure 55 and the at least one lower level interconnect dielectric layer 768. The separator trench 249 extends through the buried source line 61 (e.g., through the metallic material layer 6 and the doped semiconductor layer 10) so that each portion of the buried source line 61 underlying the memory stack structure 55 is electrically isolated from the downward-protruding portions 677 of the buried source line 61 that function as the conduit for electrical charge during the anisotropic etch that forms the memory openings 49, the support openings 19 and the backside trench 79. A portion of the buried source line 61 in region 2000 is electrically isolated by the separator trench 249 from the downward-protruding portions 677 of the buried source line 61 in region 3000.

Figure 14C:
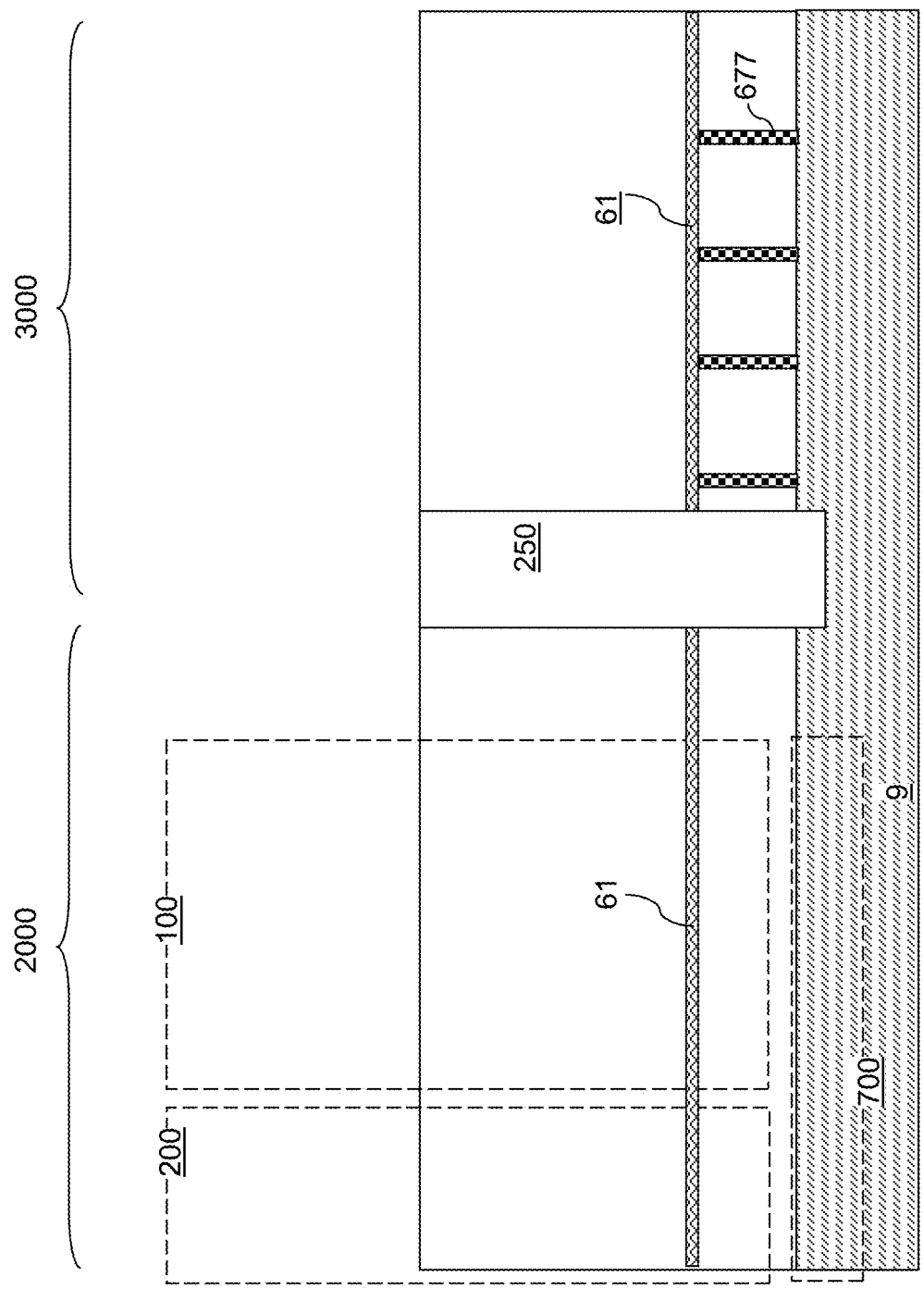
FIG. 14C is a schematic vertical cross-sectional view of the exemplary structure after formation of a dielectric wall structure that divides the conductive material layer between the chip region and the scribe region according to an embodiment of the present disclosure.

Referring to FIG. 14C, the separator trench 249 is filled with a dielectric material to form a dielectric wall structure 250, which electrically isolates and separates the portion of the buried source line 61 in region 2000 from a portion of the buried source line 61 that extends into region 3000 and that includes the downward-protruding portions 677. The semiconductor substrate 9 can be subsequently diced along the scribe regions 3000.

Figure 14D:
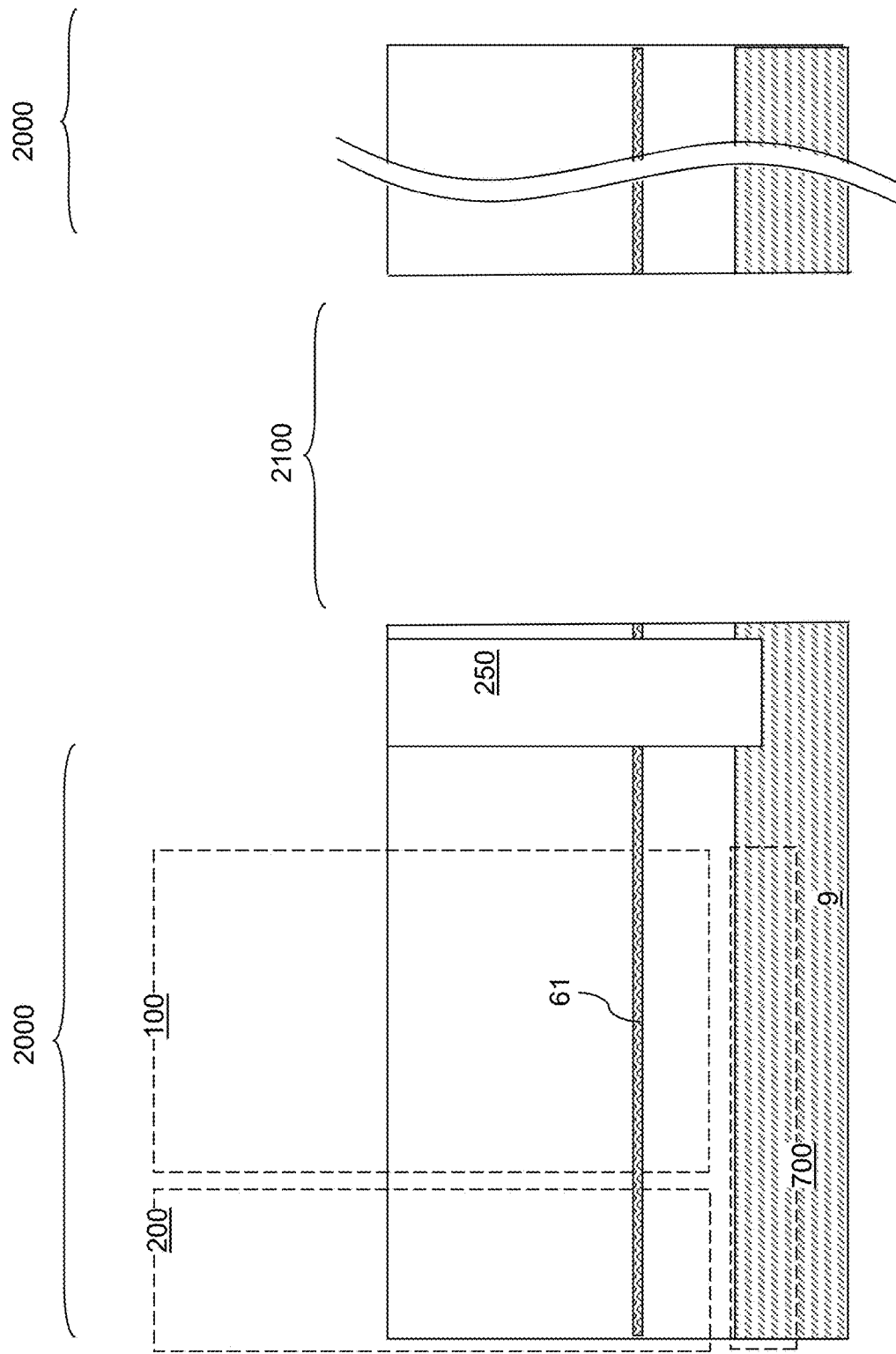
FIG. 14D is a schematic vertical cross-sectional view of the exemplary structure of FIG. 14C after dicing according to an embodiment of the present disclosure.

Referring to FIG. 14D, exemplary dicing channels 2100 are illustrated. The semiconductor substrate 9 and the structures thereupon can be diced to remove the scribe regions 3000 (including a portion of the buried source line 61 that extends into region 3000 and that includes the downward-protruding portions 677), and to provide semiconductor chips including a respective one of the chip regions 2000. In one embodiment, each of the semiconductor chips can include a three-dimensional memory device that includes a two-dimensional array of NAND strings (55, 63) that are embedded within a respective region of the alternating stack (32, 46).

In one embodiment, the field effect transistors on the semiconductor substrate 9 can comprise driver circuits for the two-dimensional array of NAND strings. The electrically conductive paths can be formed through the at least one lower level dielectric layer 760, a dielectric material portion located at a level of the alternating stack (32, 46) (such as the retro-stepped dielectric material portion 65), and over the alternating stack (32, 46) (as embodied as the upper level metal interconnect structures (96, 98)) between the driver circuits and nodes of the array of NAND strings.

In one embodiment, the semiconductor substrate 9 can comprise a silicon substrate, and the field effect transistors can contain an integrated circuit comprising the word line driver circuit and a bit line driver circuit for the two-dimensional array of NAND strings. Each NAND string includes a vertical one-dimensional array of memory elements. Thus, the two-dimensional array of NAND strings can include a three-dimensional array of memory elements. In one embodiment, the two-dimensional array of NAND strings can include: a plurality of semiconductor channels (11, 60), wherein at least one end portion of each of the plurality of semiconductor channels (11, 60) extends substantially perpendicular to a top surface of the semiconductor substrate 9; a plurality of charge storage elements (for example, as embodied as portions of the charge storage layers 54 that are located at the levels of the electrically conductive layers 46), each charge storage element located adjacent to a respective one of the plurality of semiconductor channels (11, 60); and a plurality of control gate electrodes having a strip shape extending substantially parallel to the top surface of the semiconductor substrate 9 and embodied as portions of the electrically conductive layers 46, the plurality of control gate electrodes comprise at least a first control gate electrode located in the first device level and a second control gate electrode located in the second device level.

The downward-protruding portions 677 of the buried source line 61 can be formed in various configurations. Each downward-protruding portion 677 can include a portion of a metallic material layer 6 and/or a portion of the doped semiconductor layer 10 depending on the composition of the buried source line 61. The metallic material layer 6 is optional within the buried source line 61, and therefore, the buried source line 61 may, or may not, include the metallic material layer 6.

Figure 15A:
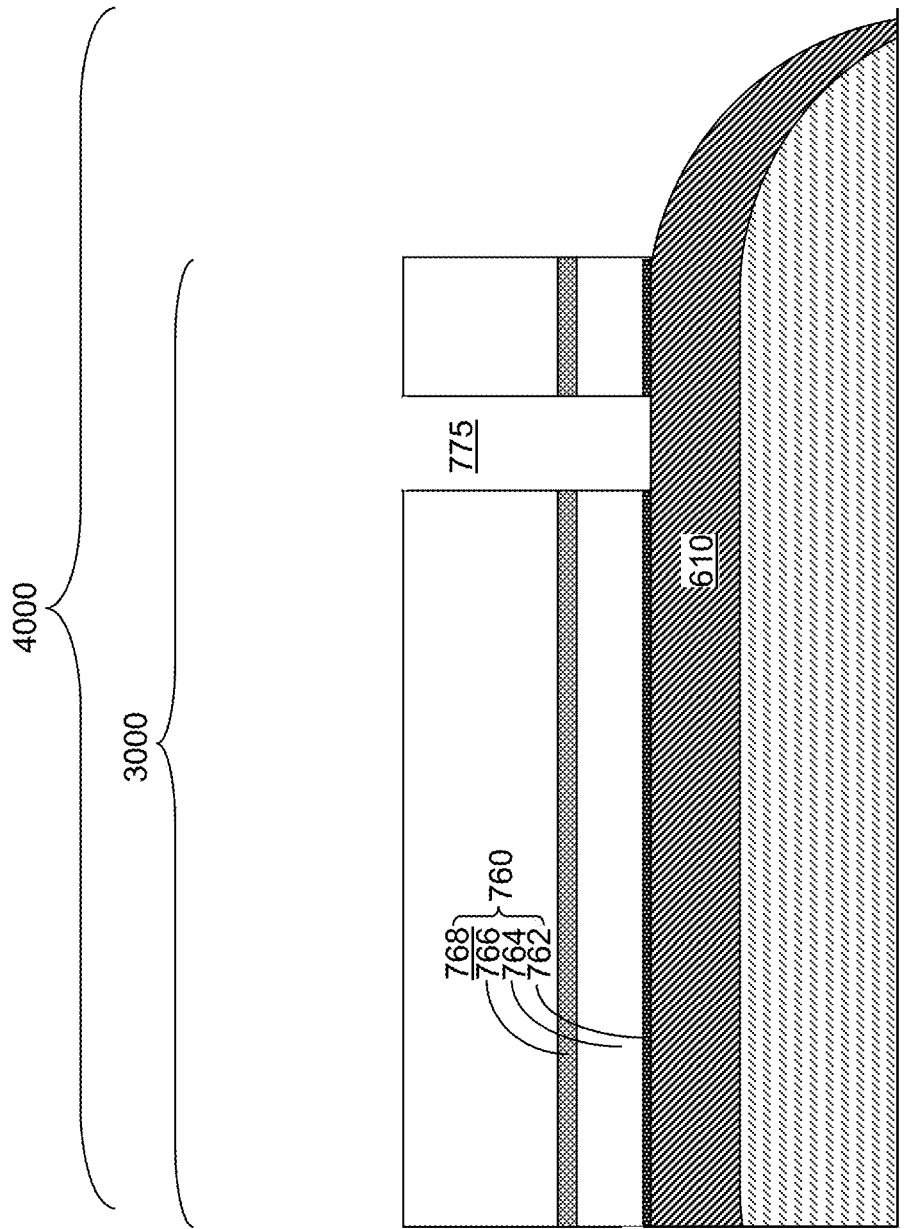
FIG. 15A is a vertical cross-sectional view of a first additional exemplary structure after formation of an annular peripheral trench according to an embodiment of the present disclosure.
Figure 15B:
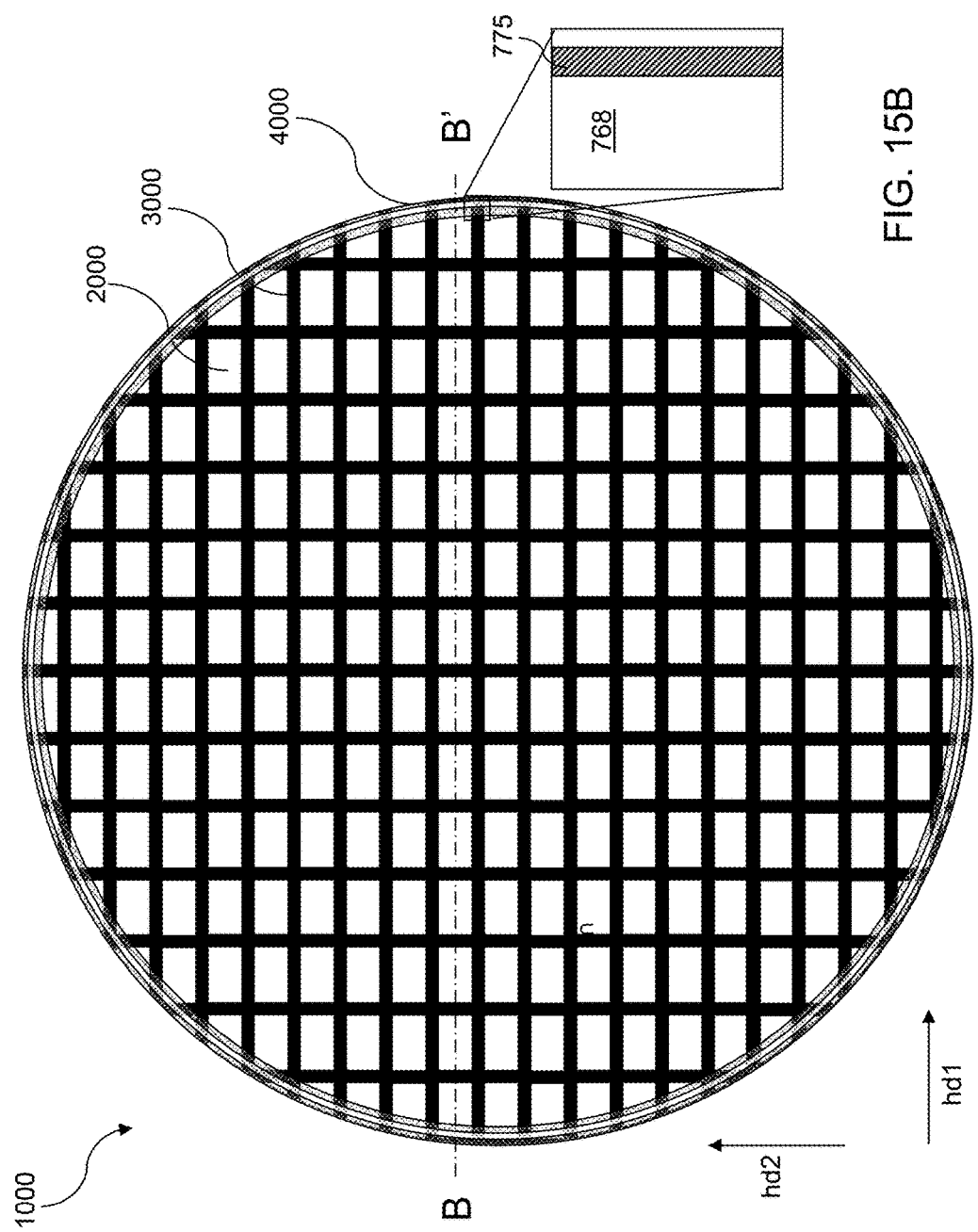
FIG. 15B is a top-down of the exemplary structure of FIG. 15A.

Referring to FIGS. 15A and 15B, a first additional exemplary structure is illustrated, which may be employed in lieu of, or in addition to, the exemplary structure described above. In this case, an annular peripheral trench 775 can be formed through the at least one lower level dielectric layer 760 such that the annular peripheral trench 775 is proximal enough to the bevel region 4000 to laterally enclose all chip regions 2000 on the semiconductor substrate 9 that have a respective full chip area (i.e., 100% of the chip area as designed). In one embodiment, the lateral spacing between the edge of the semiconductor substrate 9 and the annular peripheral trench 775 can be uniform, and may be in a range from 0.3 mm to 2 mm, although a lesser and greater lateral spacing can also be employed.

Figure 15C:
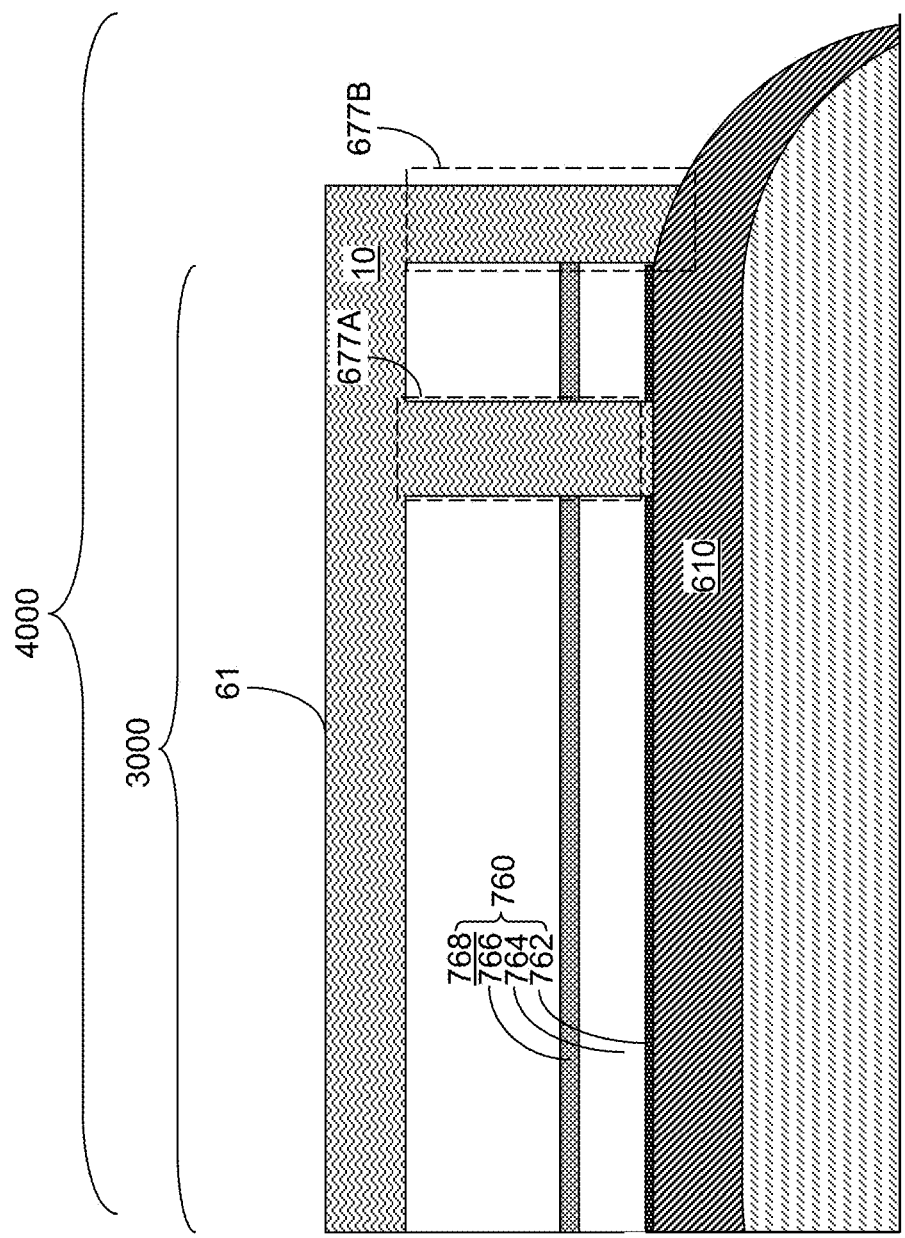
FIG. 15C is a vertical cross-sectional view of the first additional exemplary structure after formation of a doped semiconductor layer including downward-protruding portions that fill the annular peripheral trench according to an embodiment of the present disclosure.

Referring to FIG. 15C, a portion of the buried source line 61 (such as a doped semiconductor layer 10 or a combination of a metallic material layer 6 and a doped semiconductor layer 10) can be deposited. The buried source line 61 fills the annular peripheral trench 775 to form downward-protruding portions 677A that continuously extend within the annular peripheral trench 775 to form an annular ring structure, which can laterally enclose each chip region 2000 on the semiconductor substrate 9. In one embodiment, the buried source line 61 can be patterned such that the buried source line includes an additional downward-protruding portion 677B that continuously extends outside the annular peripheral trench on sidewalls of the at least one lower level dielectric layer 760 to provide another annular ring structure.

Figure 15D:
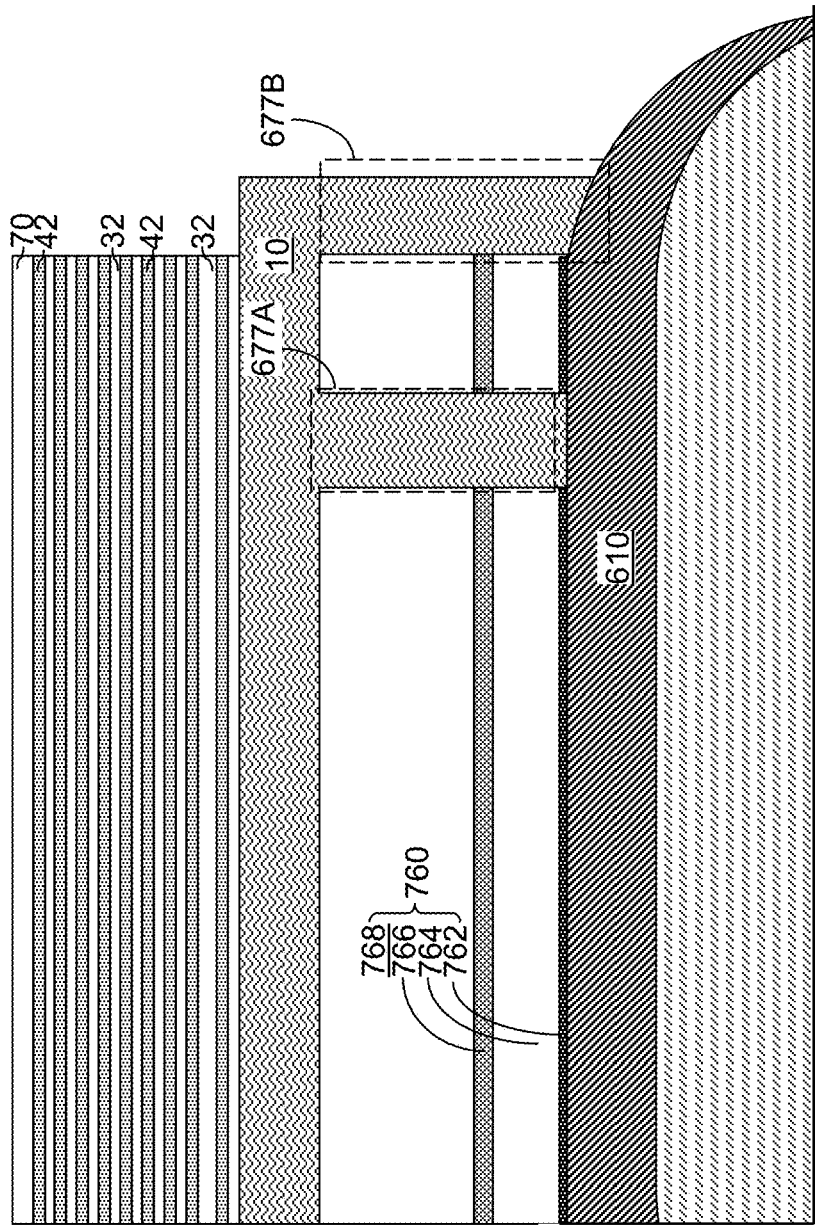
FIG. 15D is a vertical cross-sectional view of the first additional exemplary structure during an anisotropic etch process that forms memory openings and support openings according to an embodiment of the present disclosure.

Referring to FIG. 15D, the processing steps of FIGS. 4A-4C and 5A-5D can be performed to form an alternating stack (32, 42) and memory openings 49. The two annular ring structures formed by the downward-protruding portions 677A and 677B of the buried source line 61.

Figure 15E:
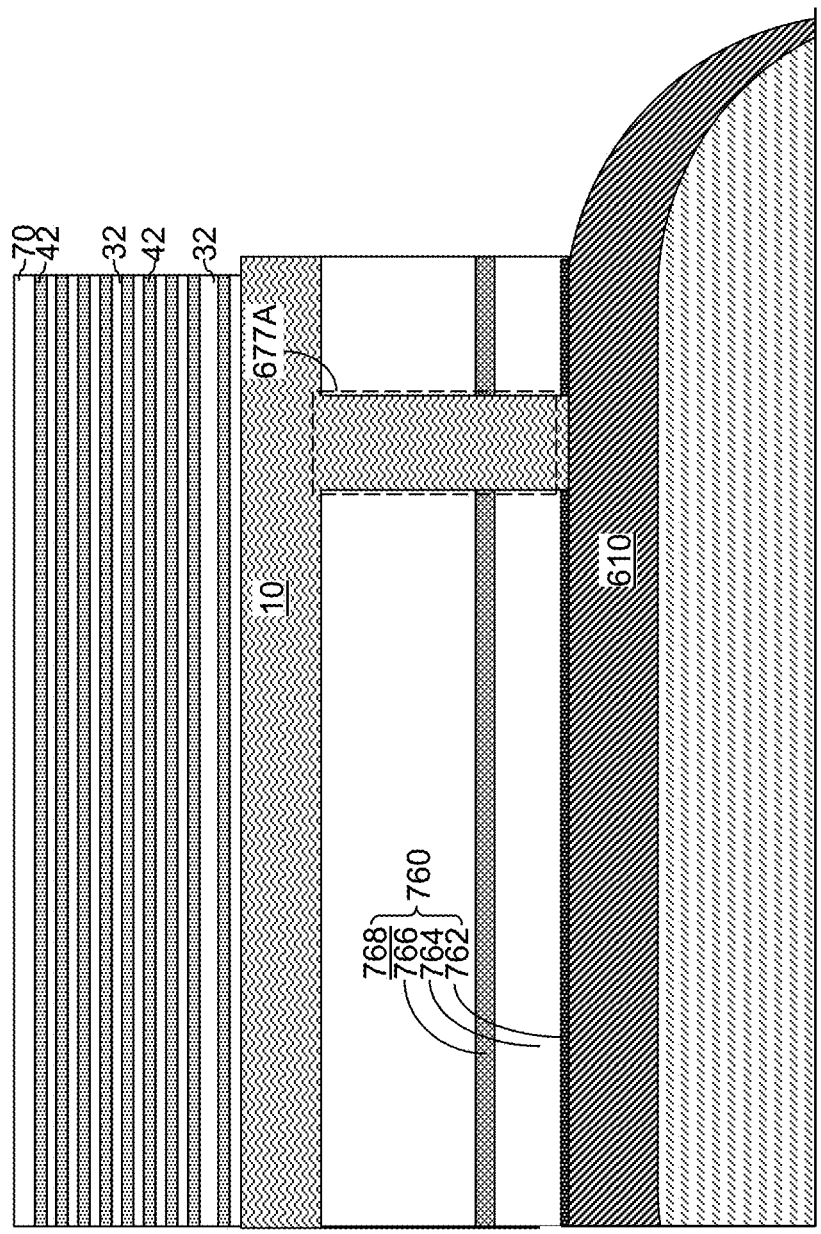
FIG. 15E is a vertical cross-sectional view of an alternative configuration for the first additional exemplary structure during an anisotropic etch process that forms memory openings and support openings according to an embodiment of the present disclosure.

Referring to FIG. 15E, an alternative configuration for the structure of FIG. 15D is illustrated, which can be derived from the structure of FIG. 15C by performing an additional bevel etch to remove the portions of the buried source line 61 located on the sidewalls of the at least one lower level dielectric layer 760. The bevel etch can be performed during patterning of the buried source line 61 to form a single downward-protruding portion 677A that forms a single ring around the bevel region 4000.

Alternatively or additionally, the downward-protruding portions 677 of the buried source line 61 can be formed inside, or outside, a sealing ring that defines each chip region 2000.

Figure 16A:
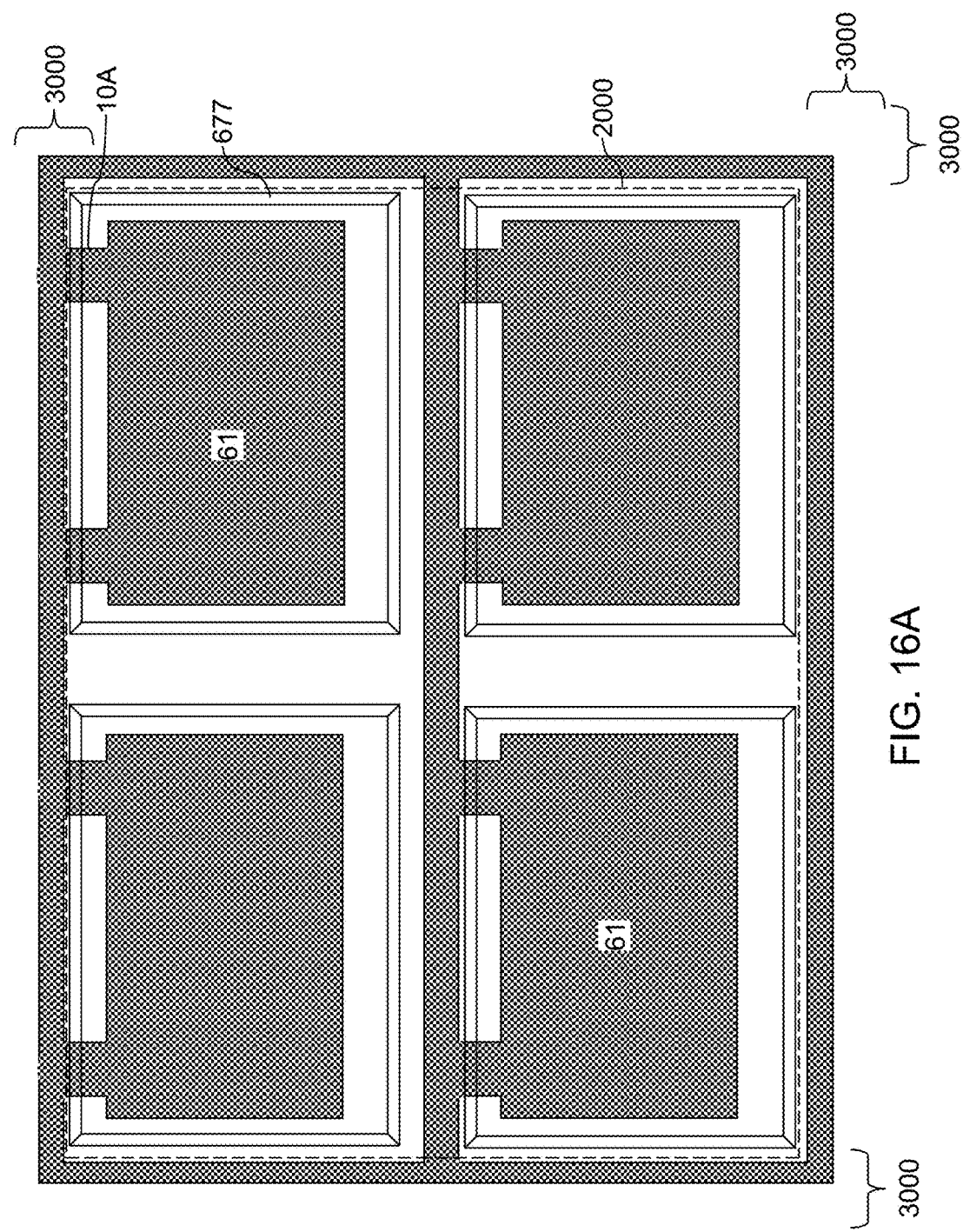
FIG. 16A is a top-down view of a second additional exemplary structure after formation of a conductive material layer that includes a rectangular ring structure according to an embodiment of the present disclosure.

Referring to FIG. 16A, a second additional exemplary structure is illustrated, in which illustrates a chip region 2000 and scribe regions 3000 that laterally surround the chip region 2000. A sealing ring can be located at the boundary between the chip region 2000 and the scribe regions 3000 (along the dotted line). The sealing ring can function as a diffusion barrier structure that protects the devices within the chip region from impurity diffusion and moisture ingress. The downward-protruding portions 677 of the buried source line 61 can be formed as rectangular ring structures that surrounds a respective device region within the chip region 2000, or the entirety of a respective chip region 2000. The downward-protruding portions 677 of the buried source line 61 form at least one rectangular ring structure inside each chip region 2000. The buried source line 61 may be patterned such that a strip shaped bridge portion 10A of the buried source line 61 overlies the downward-protruding portions 677.

Figure 16B:
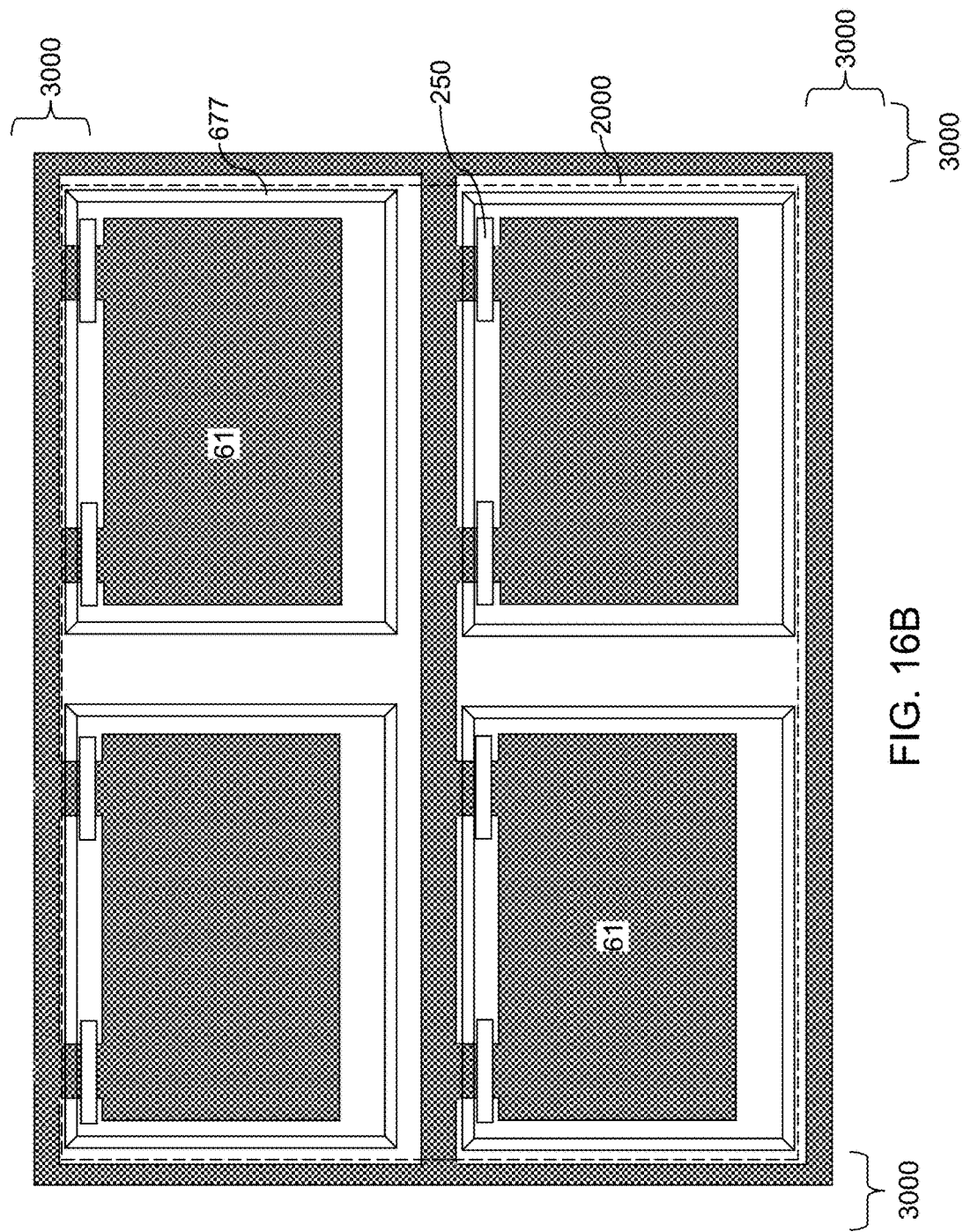
FIG. 16B is a top-down view of the second additional exemplary structure after formation of dielectric wall structures according to an embodiment of the present disclosure.

Referring to FIG. 16B, dielectric wall structures 250 can be formed as described above to disconnect the buried source lines 61 underlying the memory stack structures within the chip region 2000 from the downward-protruding portions 677 of the buried source line 61. The dielectric wall structures 250 may be located through the bridge structures 10A.

Figure 17A:
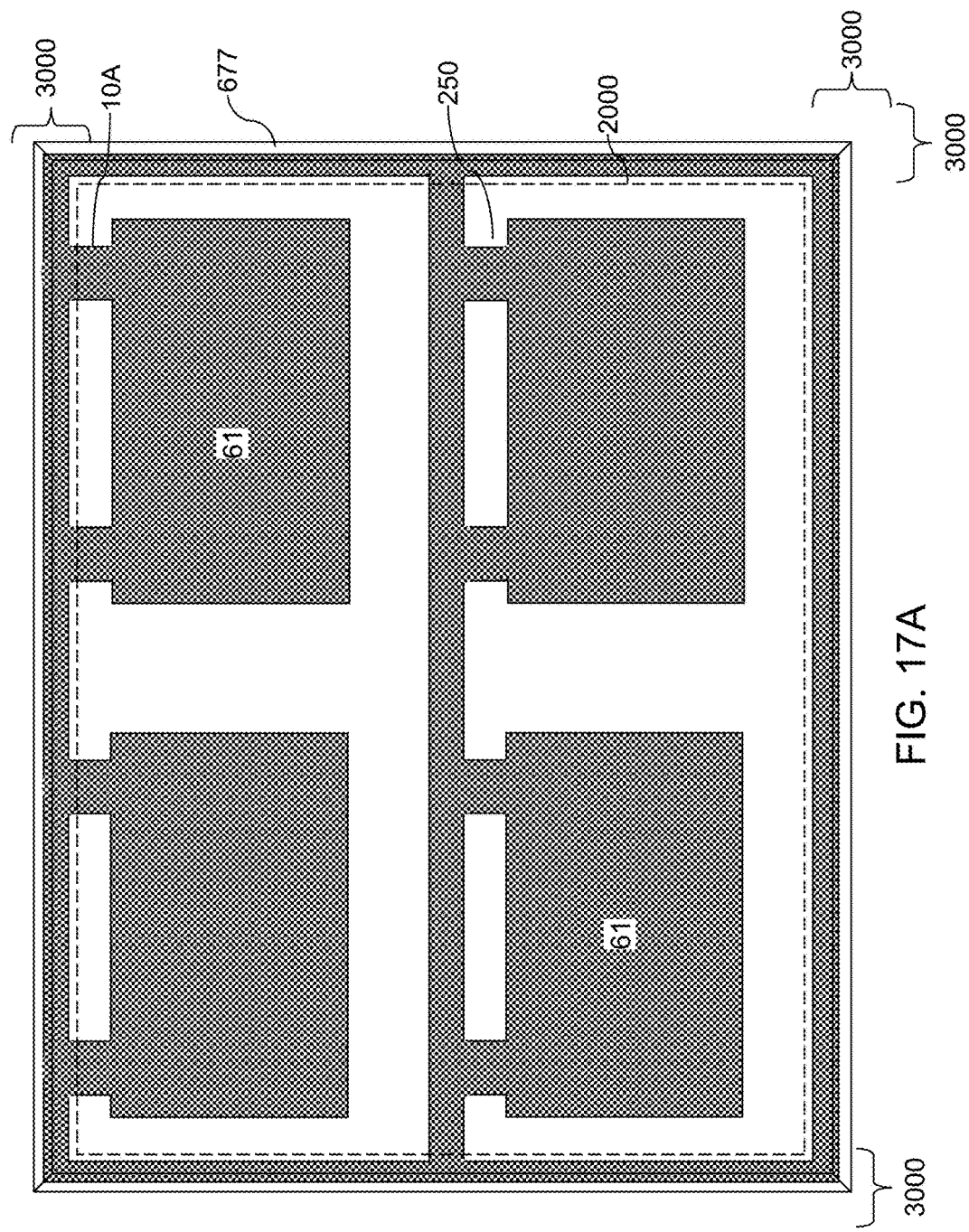
FIG. 17A is a top-down view of a third additional exemplary structure after formation of a conductive material layer that includes a rectangular ring structure according to an embodiment of the present disclosure.

Referring to FIG. 17A, a third additional exemplary structure is illustrated after formation of a buried source line 61. In this case, the downward-protruding portions 677 of the buried source line 61 can be formed outside a sealing ring that defines each chip region 2000. The downward-protruding portions 677 of the buried source line 61 form a rectangular ring structure that laterally surrounds one or more chip regions 2000.

Figure 17B:
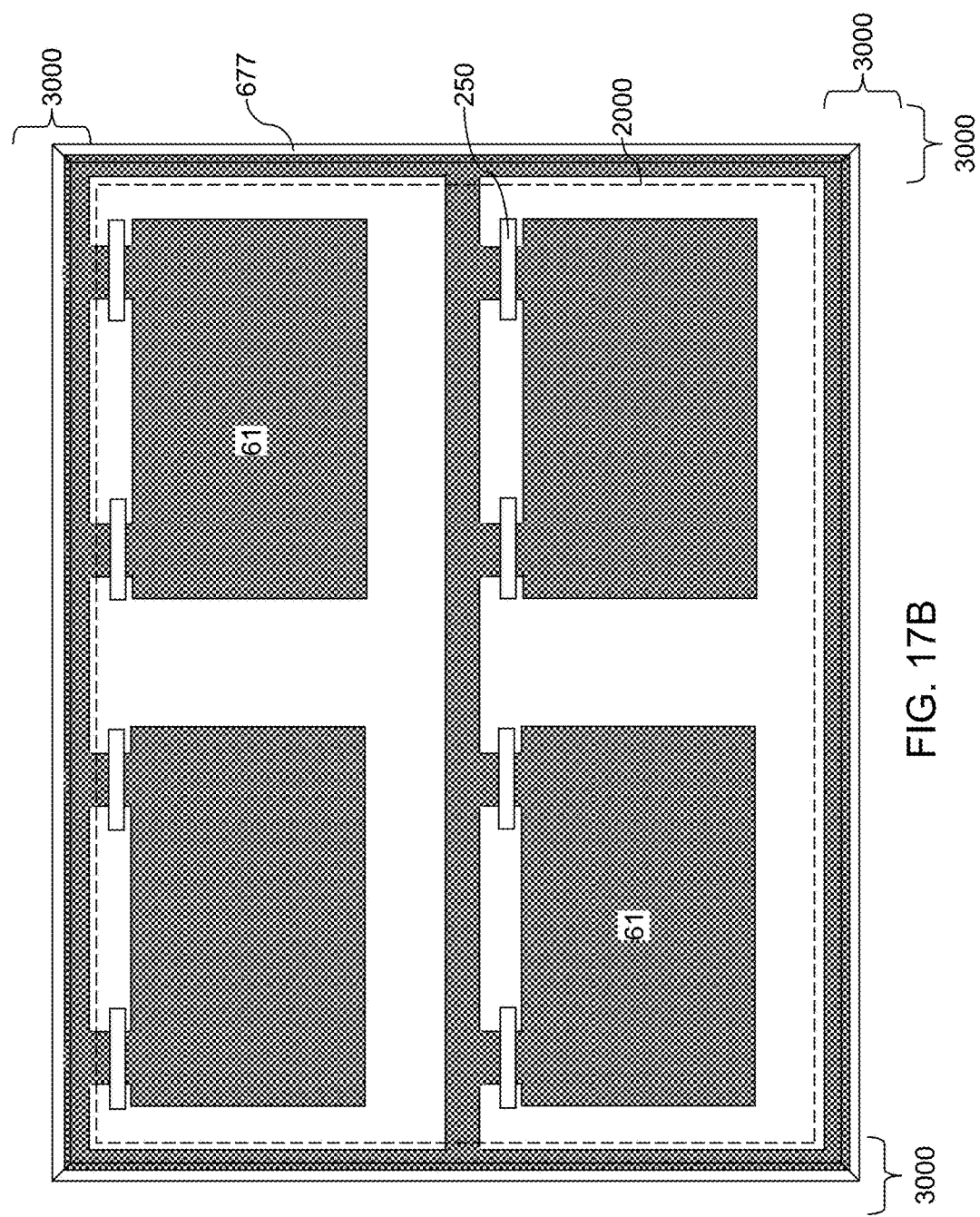
FIG. 17B is a top-down view of the third additional exemplary structure after formation of dielectric wall structures according to an embodiment of the present disclosure.

Referring to FIG. 17B, dielectric wall structures 250 can be formed as described above to disconnect the buried source line 61 underlying the memory stack structures within the chip region 2000 from the downward-protruding portions 677 of the buried source line 61.

Figure 18A:
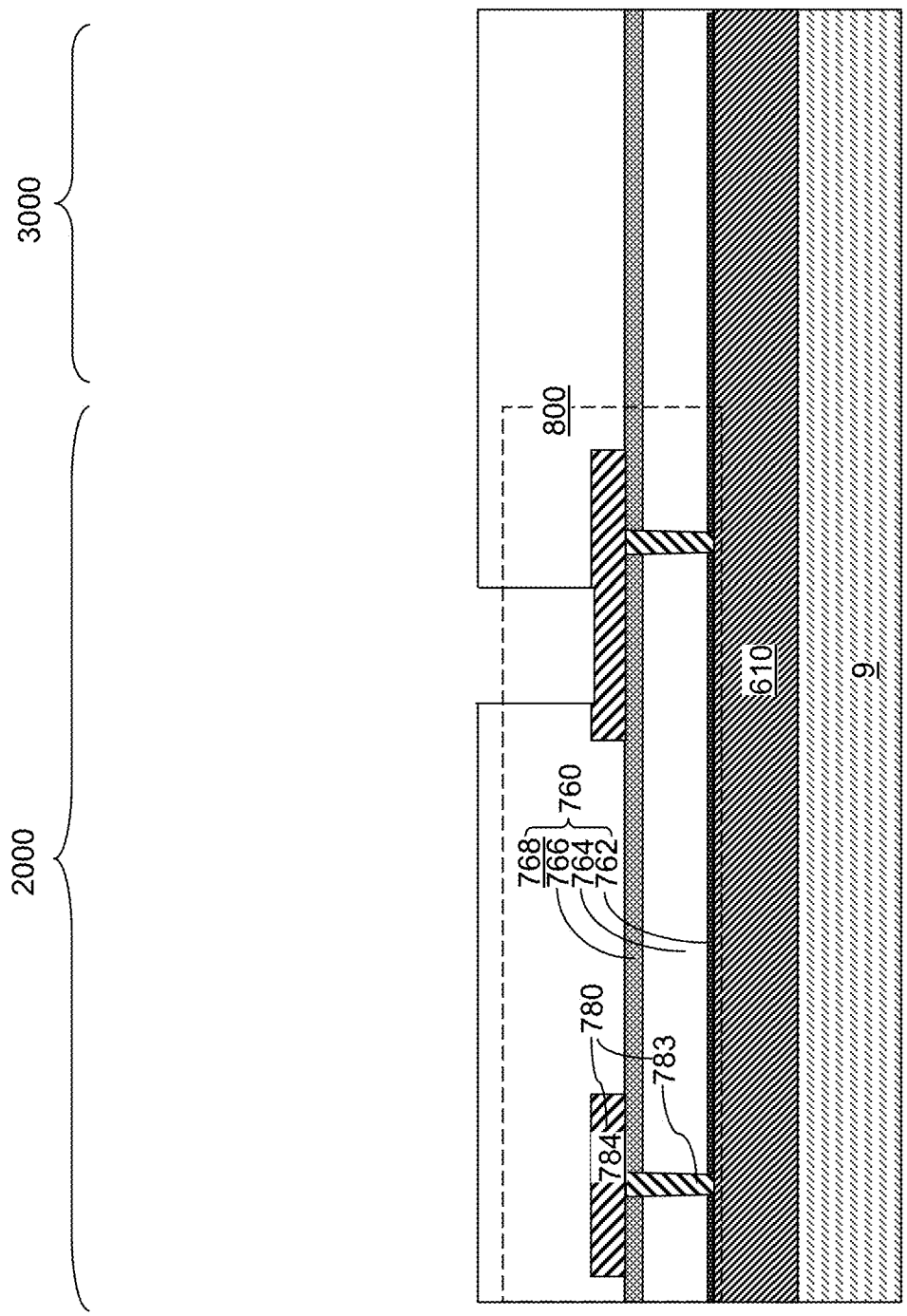
FIG. 18A is a vertical cross-sectional view of a fourth additional exemplary structure after formation of a via cavity around a periphery of a chip region according to an embodiment of the present disclosure.

Referring FIG. 18A, a fourth additional exemplary structure is illustrated, which may be employed in lieu of, or in addition to, any of the embodiments described above. A via cavity can be formed at, and/or around, a periphery of a chip region 2000 on a top surface of lower level metal lines 784 within the chip region 2000. In one embodiment, the via cavity can be laterally offset inward from an outer edge of the underlying lower level metal line 784.

Figure 18B:
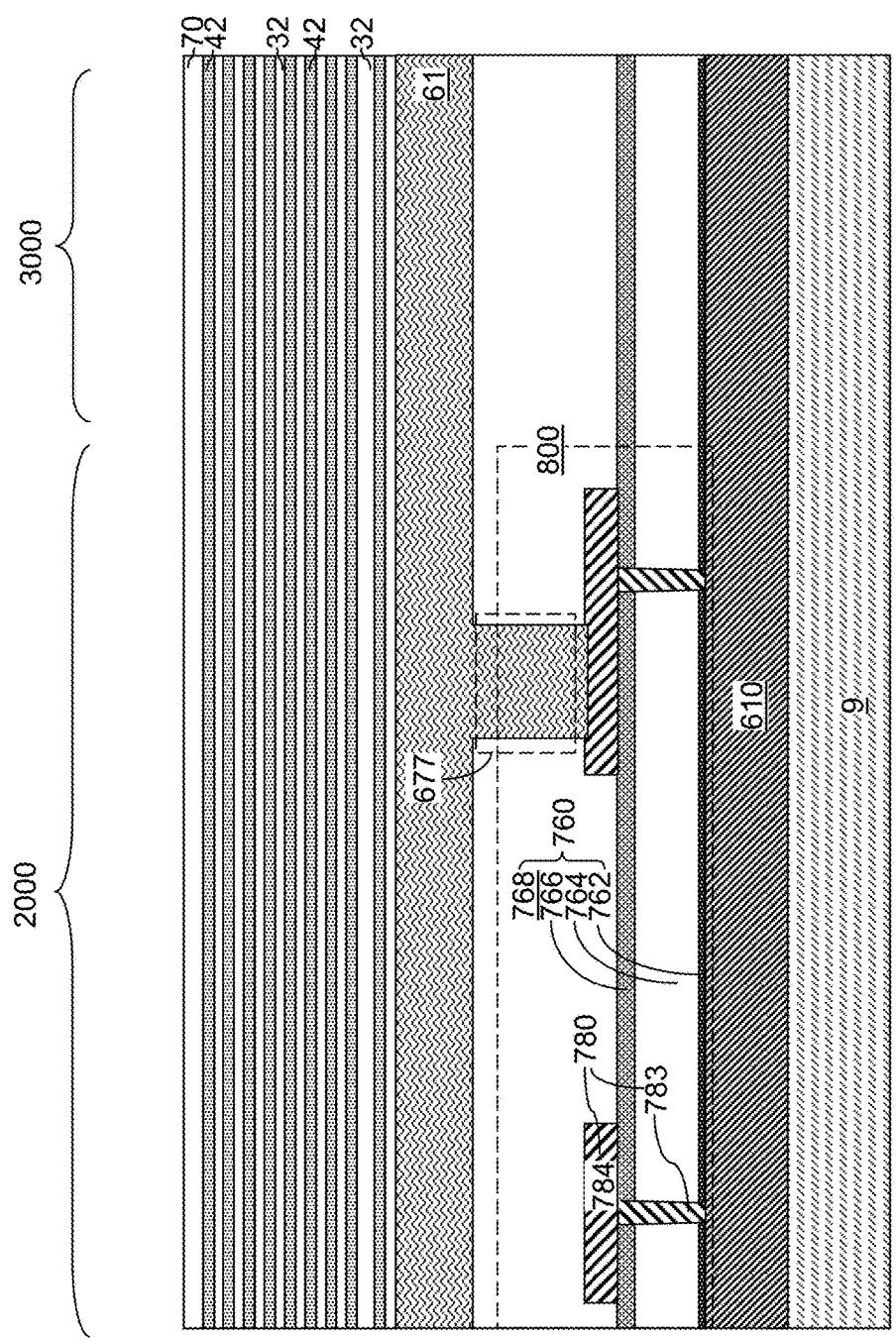
FIG. 18B is a vertical cross-sectional view of the fourth additional exemplary structure after formation of a conductive material layer that includes a rectangular ring structure according to an embodiment of the present disclosure.

Referring to FIG. 18B, the processing steps of FIGS. 3A-3F, 4A-4C, and 5A-5D can be performed to form a buried source line 61 including downward-protruding portions 677, an alternating stack (32, 42), and memory openings 49. The downward-protruding portions 677 function as electrically conductive paths for preventing arcing during the anisotropic etch that forms the memory openings. Thus, in this embodiment, the downward-protruding portions 677 are located in the chip region 2000 rather than in the scribe region 3000.

Figure 18C:
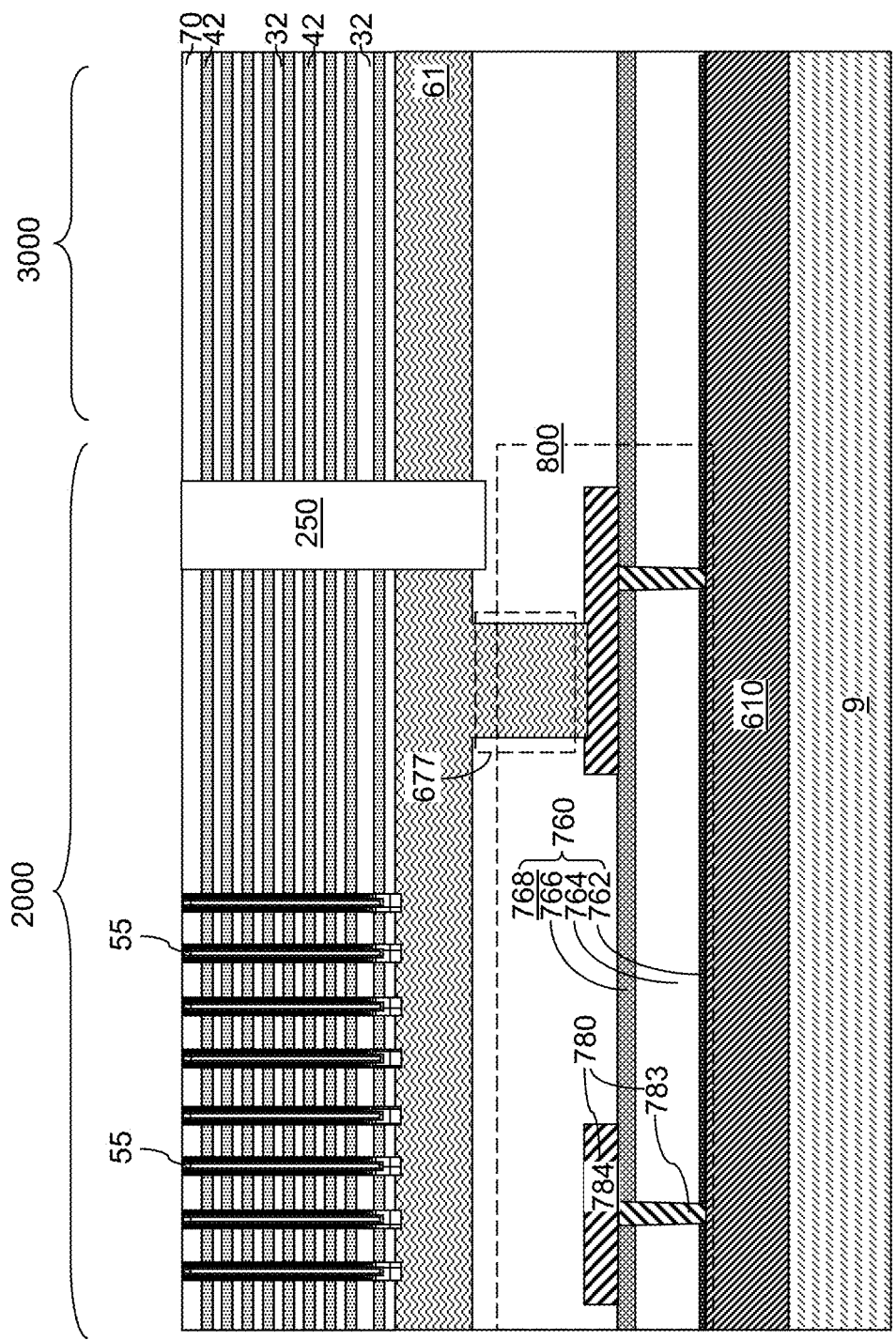
FIG. 18C is a vertical cross-sectional view of the fourth additional exemplary structure after formation of dielectric wall structures according to an embodiment of the present disclosure.

Referring to FIG. 18C, memory stack structures 55 are formed in memory openings as described above, and a dielectric wall structure 250 can be formed through the memory-level structure and through the buried source line 61. In one embodiment, the dielectric wall structure 250 can be formed around the entire periphery of the chip region 2000, thereby functioning as a diffusion barrier structure. In one embodiment, the downward-protruding portions 677 of the buried source line 61 can be located entirely within the area of the chip area 2000 and may be retained in the final memory device after the dicing operation.

Figure 19:
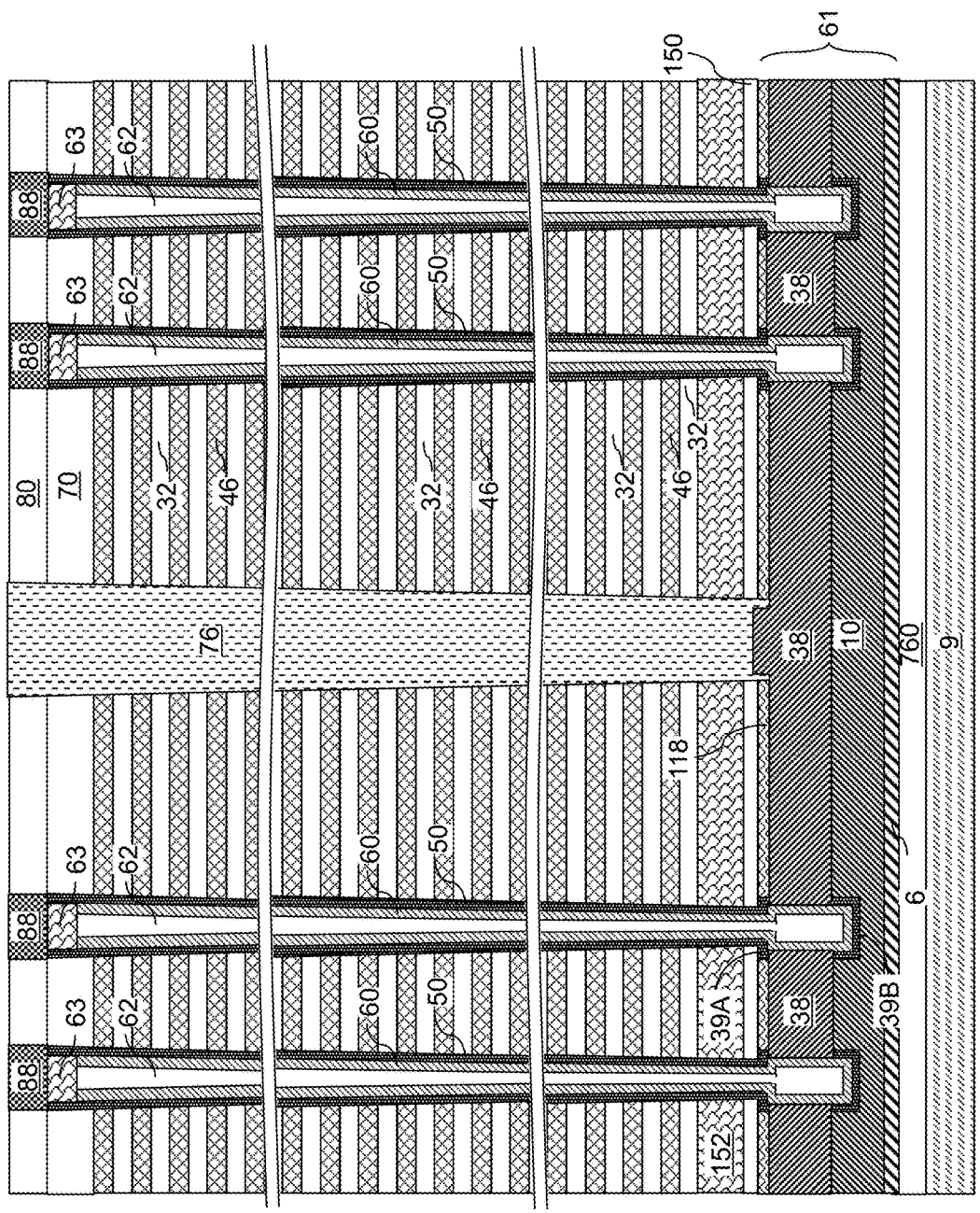
FIG. 19 is a vertical cross-sectional view of the fifth additional exemplary structure according to an embodiment of the present disclosure.

Referring FIG. 19, a fifth additional exemplary structure is illustrated. In the embodiment shown in FIG. 19, the buried source line 61 can include a direct source strap contact 38 which contacts a side (rather than the bottom) of the semiconductor channel 60. A method of forming the direct source strap contact 38 is described in U.S. patent application Ser. No. 15/458,272, filed on Mar. 14, 2017 and incorporated herein by reference in its entirety.

In summary, the method includes forming a sacrificial material layer located between two sacrificial insulating layers and an overlying second semiconductor material layer 118 over the doped semiconductor material layer 10. The second semiconductor material layer 118 may be an intrinsic or a doped semiconductor material layer. The sacrificial material layer is removed through the backside trench 79 to form a horizontal recess. The sidewall of the memory film 50 exposed in the horizontal recess is removed together with the two sacrificial insulating layers. This etching step divides a part of the memory film 50 located below the alternating stack (32, 46) into a top portion 39A having an annular top surface having an inner periphery that adjoins an outer periphery of the overlying portion of the respective memory stack structure (50, 60), and a bottom portion 39B contacting a horizontal surface of the doped semiconductor material layer 10. The direct source strap contact 38 is then formed through the backside trench 79 in the horizontal recess in contact with the exposed sidewall of the semiconductor channel 60 located between the top portion 39A and the bottom portion 39B of the memory film 50. The direct source strap contact 38 contacts the doped semiconductor layer 10 and may comprise a doped semiconductor material (e.g., doped polysilicon) or a metallic material. The insulating wall structure 76 is then formed in the backside trench 79. The device shown in FIG. 19 may also contain insulating layer 150 and a source select gate electrode 152 of a source select transistor of the vertical NAND string.

In the embodiments of the present disclosure, such as the first and fifth embodiment, for example, each buried source line pattern in a die connects to a scribe pattern and the scribe pattern is extended to the bevel region at the buried source line metal level. This structure provides a discharge path at the bevel region. After the buried source line formation, and etching of the memory openings and the slit trenches, the buried source line pattern is separated (e.g., cut) from the kerf pattern. The individual buried source line can be formed within one chip. If the method of the present embodiments is not used, then each buried source line pattern is connected to the silicon substrate in one die. In this case, a strong connection is needed between the buried source line and the silicon substrate, which requires a larger connection area. This leads to an area penalty and capacitance penalty.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming at least one lower level dielectric layer over a semiconductor substrate;
    forming an opening in the at least one lower level dielectric layer located in a scribe region to expose the semiconductor substrate;
    forming a buried source line over the least one lower level dielectric layer and over the at semiconductor substrate, such that the buried source line is electrically connected to the semiconductor substrate, wherein the buried source line is formed over the at least one lower level dielectric layer and in the opening, such that an electrically conductive connection is formed in the opening to electrically connect the buried source line to the semiconductor substrate in the scribe region;
    forming an alternating stack of insulating layers and sacrificial material layers over the buried source line, wherein the sacrificial material layers are subsequently replaced with electrically conductive layers;
    forming memory openings through the alternating stack by etching through the alternating stack after the buried source line is electrically connected to the semiconductor substrate; and
    forming memory stack structures in the memory openings, wherein each memory stack structure includes a vertical semiconductor channel electrically connected to the buried source line and a memory film laterally surrounding the vertical semiconductor channel.

2. The method of claim 1, further comprising dicing the semiconductor substrate into chips through the scribe region after the step of forming the memory stack structures, wherein the dicing cuts off the electrically conductive connection between the buried source line and the semiconductor substrate.

3. The method of claim 1, wherein:
    the buried source line comprises downward-protruding portions that are electrically shorted to an upper portion of the semiconductor substrate;

the memory openings are formed using an anisotropic etch process; and the downward-protruding portions conduct electrical charge between the buried source line and the semiconductor substrate during the anisotropic etch process.

4. The method of claim 1, further comprising at least one source strap structure contacting a respective subset of the semiconductor channels of the memory stack structures.

5. A method of forming a three-dimensional memory device, comprising:

forming field effect transistors on a semiconductor substrate;

forming at least one lower level dielectric layer and lower metal interconnect structures over the field effect transistors and over the semiconductor substrate;

forming a buried source line over the at least one lower level dielectric layer and over the semiconductor substrate, such that the buried source line is electrically connected to the semiconductor substrate, wherein the buried source line comprises downward-protruding portions that are electrically connected to an upper portion of the semiconductor substrate;

forming an alternating stack of insulating layers and sacrificial material layers over the buried source line, wherein the sacrificial material layers are subsequently replaced with electrically conductive layers;

forming memory openings through the alternating stack by etching through the alternating stack after the buried source line is electrically connected to the semiconductor substrate;

forming memory stack structures in the memory openings, wherein each memory stack structure includes a vertical semiconductor channel electrically connected to the buried source line and a memory film laterally surrounding the vertical semiconductor channel; and electrically isolating a portion of the buried source line that underlies the memory stack structures from the downward-protruding portions by laterally dividing the buried source line in a region between the memory stack structures and the downward-protruding portions, wherein:

the memory openings are formed using an anisotropic etch process; and the downward-protruding portions conduct electrical charge between the buried source line and the semiconductor substrate during the anisotropic etch process.

6. The method of claim 5, wherein:

the buried source line comprises a semiconductor material layer overlying a metallic layer;

the openings extend into an upper portion of the semiconductor material layer; and the memory film comprises from outside to inside a charge trapping layer comprising a material that traps electrical charge and a tunneling dielectric layer that contacts an outer sidewall of the vertical semiconductor channel.

7. The method of claim 6, wherein the downward-protruding portions comprise an annular ring structure that is located in proximity to a bevel region of the semiconductor substrate and laterally encloses each chip region on the substrate.

8. The method of claim 6, wherein the downward-protruding portions comprise a rectangular ring structure that is located in a scribe region that laterally surrounds a chip region.

9. The method of claim 6, further comprising forming via cavities into an uppermost layer of the at least one lower level dielectric layer only within a scribe region while not forming any via cavity within a chip region, wherein the downward-protruding portions are formed in the via cavities.

10. The method of claim 9, wherein:

the lower metal interconnect structures comprise scribe region metal interconnect structures that are electrically shorted to portions of the semiconductor substrate and are formed in the scribe region; and the downward-protruding portions of the buried source line are formed on the scribe region metal interconnect structures.

11. The method of claim 5, further comprising:

patterning the alternating stack to form stepped surfaces, wherein an overlying spacer material layer has a lesser lateral extent than an underlying spacer material layer within a region of the stepped surfaces;

forming a retro-stepped dielectric material portion on the stepped surfaces, wherein the retro-stepped dielectric material portion overlies the at least one lower level dielectric layer;

forming word line contact via structures on a top surface of a respective one of the electrically conductive layers within the region of the stepped surfaces; and forming through-memory-level contact via structures through the retro-stepped dielectric material portion and on a subset of the lower metal interconnect structures.

12. The method of claim 11, further comprising:

forming at least one upper level dielectric layer over the alternating stack; and forming upper level metal interconnect structures in the at least one upper level dielectric layer, wherein the through-memory-level contact via structures are electrically shorted to a respective one of the upper level metal interconnect structures and a respective one of the lower metal interconnect structures.

13. The method of claim 5, wherein the three-dimensional memory device includes an array of NAND strings that are located in a respective region of the alternating stack.

14. The method of claim 13, wherein:

the semiconductor substrate comprises a silicon substrate;

the field effect transistors comprise a driver circuit for the array of NAND strings; and the array of NAND strings comprises:

the vertical semiconductor channels, wherein at least one end portion of each of the vertical semiconductor channels extends substantially perpendicular to a top surface of the semiconductor substrate;

a plurality of charge storage elements, each charge storage element located adjacent to a respective one of the vertical semiconductor channels; and a plurality of control gate electrodes having a strip shape extending substantially parallel to the top surface of the semiconductor substrate and embodied as portions of the electrically conductive layers, the plurality of control gate electrodes comprise at least a first control gate electrode located in a first device level and a second control gate electrode located in a second device level.

15. A method of forming a three-dimensional memory device, comprising:

forming at least one lower level dielectric layer over a semiconductor substrate;

forming a buried source line over the at least one lower level dielectric layer and over the semiconductor substrate, such that the buried source line is electrically connected to the semiconductor substrate, wherein the buried source line comprises downward-protruding portions that are electrically connected to an upper portion of the semiconductor substrate;

forming an alternating stack of insulating layers and sacrificial material layers over the buried source line, wherein the sacrificial material layers are subsequently replaced with electrically conductive layers;

forming memory openings through the alternating stack by an anisotropic etch process through the alternating stack after the buried source line is electrically connected to the semiconductor substrate, wherein the downward-protruding portions conduct electrical charge between the buried source line and the semiconductor substrate during the anisotropic etch process;

forming memory stack structures in the memory openings, wherein each memory stack structure includes a vertical semiconductor channel electrically connected to the buried source line and a memory film laterally surrounding the vertical semiconductor channel; and removing portions of the at least one lower level dielectric layer and the alternating stack at a peripheral region of the semiconductor substrate, wherein a circumferential bevel region of the semiconductor substrate is physically exposed prior to the anisotropic etch process.

* * * * *